(12) United States Patent
Jung et al.

(10) Patent No.: US 10,297,451 B2
(45) Date of Patent: May 21, 2019

(54) MEMORY DEVICE

(71) Applicant: Samsung Electronics Co., Ltd., Suwon-si (KR)

(72) Inventors: Won Seok Jung, Anyang-si (KR); Joon Hee Lee, Seongnam-si (KR); Keon Soo Kim, Suwon-si (KR); Sun Yeong Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/644,931

(22) Filed: Jul. 10, 2017

(65) Prior Publication Data

US 2017/0309486 A1 Oct. 26, 2017

Related U.S. Application Data

(63) Continuation of application No. 14/642,668, filed on Mar. 9, 2015, now Pat. No. 9,735,014.

(30) Foreign Application Priority Data

May 26, 2014 (KR) .......................... 10-2014-0062887

(51) Int. Cl.
| | |
|---|---|
| *H01L 27/1157* | (2017.01) |
| *H01L 21/28* | (2006.01) |
| *H01L 27/11573* | (2017.01) |
| *H01L 27/11565* | (2017.01) |
| *H01L 27/11575* | (2017.01) |
| *H01L 27/11582* | (2017.01) |
| *H01L 29/66* | (2006.01) |
| *H01L 29/78* | (2006.01) |

(52) U.S. Cl.
CPC .... *H01L 21/28008* (2013.01); *H01L 27/1157* (2013.01); *H01L 27/11565* (2013.01); *H01L 27/11573* (2013.01); *H01L 27/11575* (2013.01); *H01L 27/11582* (2013.01); *H01L 29/66666* (2013.01); *H01L 29/7827* (2013.01)

(58) Field of Classification Search
CPC ..................... H01L 21/28008; H01L 27/11565
See application file for complete search history.

(56) References Cited

U.S. PATENT DOCUMENTS

| | | | |
|---|---|---|---|
| 8,048,798 B2 | 11/2011 | Kidoh et al. | |
| 8,188,530 B2 | 5/2012 | Tanaka et al. | |

(Continued)

*Primary Examiner* — Bradley K Smith
(74) *Attorney, Agent, or Firm* — Muir Patent Law, PLLC

(57) ABSTRACT

A method of manufacturing a memory device includes: providing a substrate; forming in a cell region a channel extending in a direction perpendicular to an upper surface of the substrate and a plurality of gate electrode layers and a plurality of insulating layers stacked alternatingly on the substrate to be adjacent to the channel; forming a plurality of circuit elements on the substrate at a peripheral circuit region disposed at a periphery of the cell region; and forming an interlayer insulating layer on the substrate in the cell region and the peripheral circuit region, the interlayer insulating layer including a first, bottom interlayer insulating layer covering the plurality of circuit elements and at least a portion of the plurality of gate electrode layers, and a second, top interlayer insulating layer disposed on the first interlayer insulating layer.

20 Claims, 53 Drawing Sheets

(56) References Cited

U.S. PATENT DOCUMENTS

| | | | |
|---|---|---|---|
| 8,247,860 B2 | 8/2012 | Iwase et al. | |
| 9,806,185 B2 * | 10/2017 | Lee | H01L 29/78 |
| 2009/0212350 A1 * | 8/2009 | Kidoh | H01L 27/0688 |
| | | | 257/324 |
| 2010/0109071 A1 * | 5/2010 | Tanaka | H01L 27/11578 |
| | | | 257/324 |
| 2011/0151667 A1 | 6/2011 | Hwang et al. | |
| 2012/0061744 A1 | 3/2012 | Hwang et al. | |
| 2012/0070944 A1 | 3/2012 | Kim et al. | |
| 2012/0149185 A1 | 6/2012 | Kim et al. | |
| 2012/0168858 A1 | 7/2012 | Hong | |
| 2012/0286345 A1 | 11/2012 | Seo et al. | |
| 2013/0017629 A1 | 1/2013 | Pyo et al. | |
| 2015/0287710 A1 | 10/2015 | Yun et al. | |

* cited by examiner

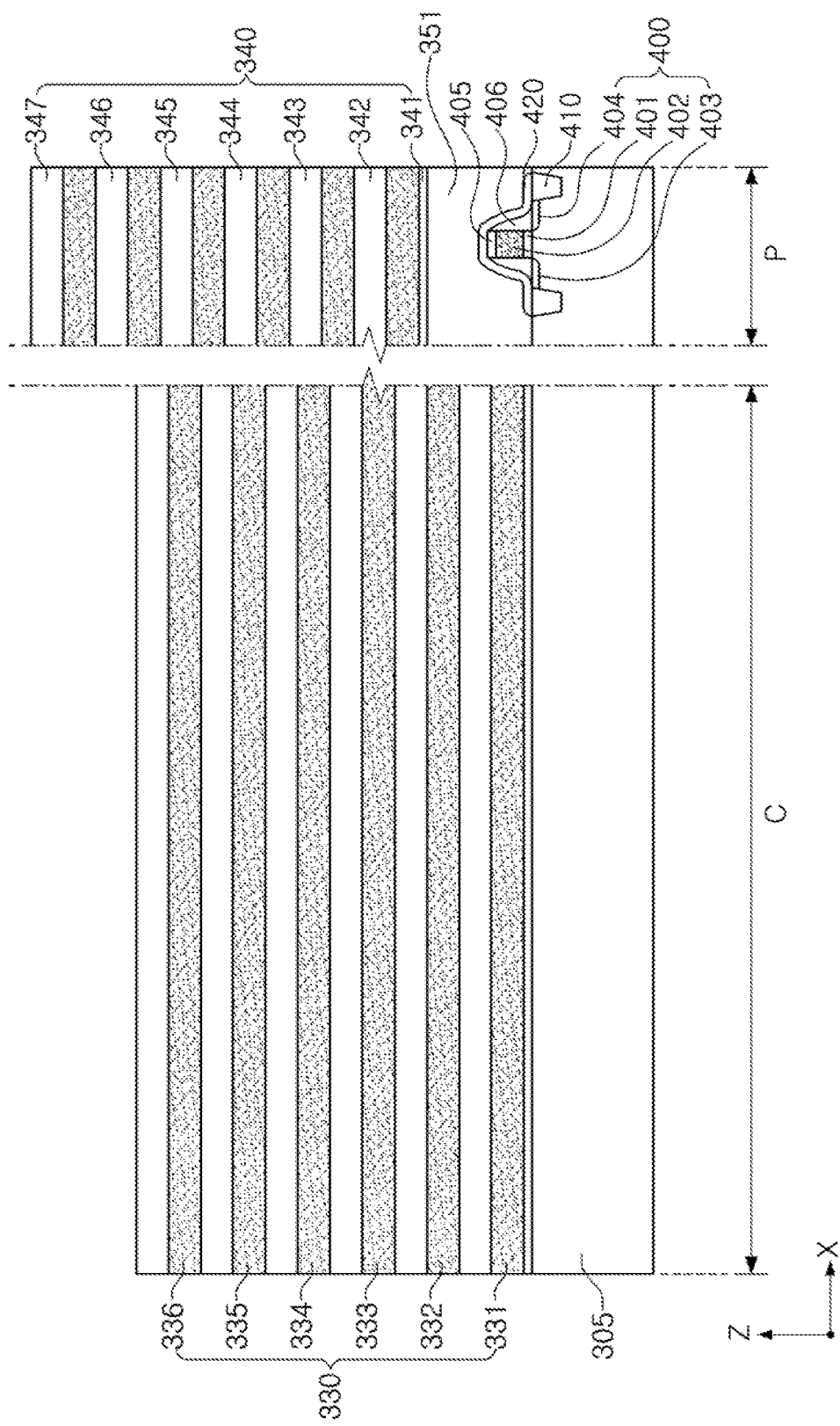

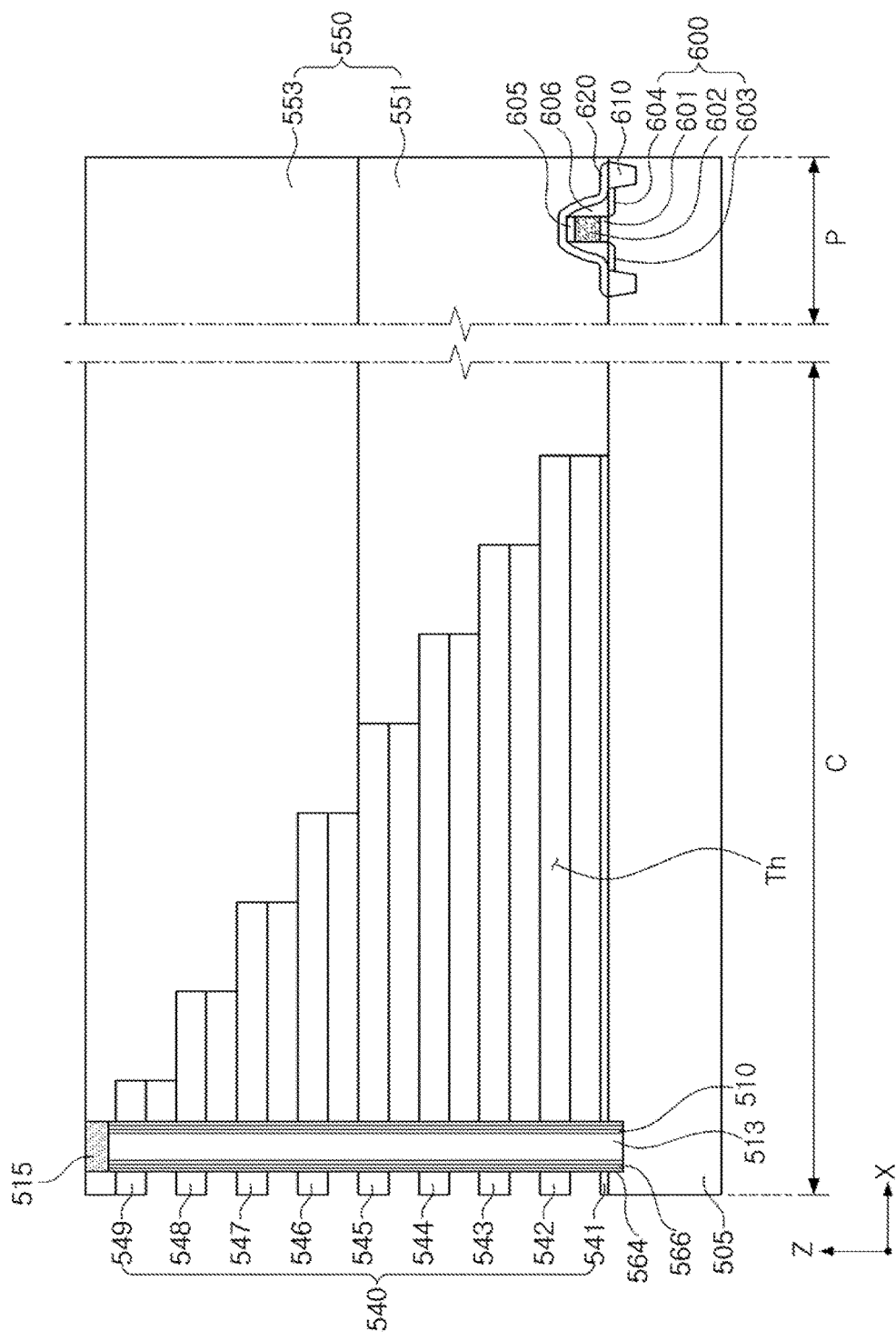

MEMORY DEVICE

CROSS-REFERENCE TO RELATED APPLICATION

This application is a continuation of U.S. patent application Ser. No. 14/642,668, filed Mar. 9, 2015, in the U.S. Patent and Trademark Office, which claims priority to Korean Patent Application No. 10-2014-0062887 filed on May 26, 2014, with the Korean Intellectual Property Office, the disclosures of both of which are incorporated herein by reference in their entireties.

BACKGROUND

The present disclosure relates to a memory device.

While electronic products are constantly becoming smaller, at the same time they tend to have ever higher degrees of capacity in order to process greater amounts of data. Accordingly, as one method for improving the integrity of semiconductor memory devices, memory devices having a vertical transistor structure, instead of an existing planar transistor structure, are being proposed.

SUMMARY

An aspect of the present disclosure may provide a memory device in which an interlayer insulating layer is able to be formed in a simple process and in which a high level of integration is able to be achieved.

The technical objectives of the inventive concept are not limited to the disclosure provided hereinafter; other objectives may become apparent to those of ordinary skill in the art based on the following descriptions.

According to certain embodiments, a method of manufacturing a memory device includes: providing a substrate; forming in a cell region a channel extending in a direction perpendicular to an upper surface of the substrate and a plurality of gate electrode layers and a plurality of insulating layers stacked alternatingly on the substrate to be adjacent to the channel; forming a plurality of circuit elements on the substrate at a peripheral circuit region disposed at a periphery of the cell region; and forming an interlayer insulating layer on the substrate in the cell region and the peripheral circuit region, the interlayer insulating layer including a first, bottom interlayer insulating layer covering the plurality of circuit elements and at least a portion of the plurality of gate electrode layers, and a second, top interlayer insulating layer disposed on the first interlayer insulating layer.

In one embodiment, the first interlayer insulating layer is disposed adjacent to the channel on an uppermost gate electrode layer among the plurality of gate electrode layers.

In one embodiment, the first interlayer insulating layer is formed to extend continuously from at least one of the plurality of circuit elements at the peripheral circuit region into the cell region to extend above a top surface of at least one of the gate electrode layers.

In one embodiment, the first interlayer insulating layer is formed to extend continuously from the channel on the uppermost gate electrode layer to at least one of the plurality of circuit elements at the peripheral circuit region.

In one embodiment, the first interlayer insulating layer includes a high density plasma (HDP) oxide layer, and the second interlayer insulating layer includes a tetra-ethyl-ortho-silicate (TEOS) oxide layer.

In one embodiment, the cell region includes pad areas provided by the plurality of gate electrode layers extended by different lengths in a single direction.

In one embodiment, a ratio of a thickness of the first interlayer insulating layer to a thickness of the second interlayer insulating layer at the peripheral region is between 1:10 to 1:20.

In one embodiment, forming the plurality of circuit elements includes forming a plurality of horizontal transistors, and the first interlayer insulating layer fills spaces between transistors of the plurality of horizontal transistors.

In one embodiment, the method further includes forming the first interlayer insulating layer after forming the plurality of gate electrode layers and insulating layers stacked on the substrate In one embodiment, the first interlayer insulating layer has better gap filling properties than the second interlayer insulating layer; and the second interlayer insulating layer has a higher deposition rate than the first interlayer insulating layer.

According to certain embodiments, a method of manufacturing a memory device includes: providing a substrate; forming, in a cell region, channels extending in a direction perpendicular to an upper surface of a substrate, and a plurality of gate electrode layers and insulating layers stacked alternatingly on the substrate to be adjacent to the channels, the channels including at least a first channel; forming a plurality of circuit elements disposed on the substrate at a peripheral circuit region, the plurality of circuit elements spaced apart from the gate electrode layers; forming a first interlayer insulating layer that extends continuously from at least a first circuit element of the plurality of circuit elements to the cell region to cover a top surface of at least a first gate electrode layer of the plurality of gate electrode layers; and forming a second interlayer insulating layer covering the plurality of gate electrode layers and the first interlayer insulating layer, such that the first interlayer insulating layer is between the substrate and the second interlayer insulating layer.

In one embodiment, the first interlayer insulating layer is disposed adjacent to the first channel on an uppermost gate electrode layer among the plurality of gate electrode layers.

In one embodiment, the method further includes forming the first interlayer insulating layer after forming the plurality of gate electrode layers and insulating layers stacked on the substrate.

In one embodiment, the method further includes forming the plurality of gate electrode layers in a stack at the cell region of the substrate, such that lower gate electrode layers in the stack extend further in a direction toward the peripheral region than higher gate electrode layers in the stack.

In one embodiment, the gate electrode layers and insulating layers are stacked in a step-wise manner, and further comprising forming the first interlayer insulating layer to cover a plurality of steps of the gate electrode layer-insulating layer stack.

In one embodiment, the first interlayer insulating layer includes a high density plasma (HDP) oxide layer, and the second interlayer insulating layer includes a tetra-ethyl-ortho-silicate (TEOS) oxide layer.

In one embodiment, forming the plurality of circuit elements includes forming a plurality of horizontal transistors, and the first interlayer insulating layer fills spaces between transistors of the plurality of horizontal transistors.

According to further embodiments, a method of manufacturing an electronic device includes providing a substrate; providing in a cell region a channel extending in a direction perpendicular to an upper surface of the substrate and a plurality of gate electrode layers and a plurality of insulating layers stacked alternatingly on the substrate to be adjacent to the channel; providing a plurality of circuit elements on the substrate at a peripheral circuit region disposed at a periphery of the cell region; and providing an interlayer insulating layer on the substrate in the cell region and the peripheral circuit region, the interlayer insulating layer including a first interlayer insulating layer covering the plurality of circuit elements, and a second interlayer insulating layer disposed on the first interlayer insulating layer, wherein the first interlayer insulating layer is disposed between the second interlayer insulating layer and the substrate. The first interlayer insulating layer has better gap filling properties than the second interlayer insulating layer, and the second interlayer insulating layer has a higher deposition rate than the first interlayer insulating layer.

In one embodiment the first interlayer insulating layer includes a high density plasma (HDP) oxide layer, and the second interlayer insulating layer includes a tetra-ethyl-ortho-silicate (TEOS) oxide layer.

In one embodiment, the first interlayer insulating layer extends continuously from at least a first circuit element of the plurality of circuit elements to at least a first portion of the plurality of gate electrode layers to cover at least the first circuit element and at least the first portion of the plurality of gate electrode layers.

BRIEF DESCRIPTION OF DRAWINGS

The above and other aspects, features and other advantages of the present disclosure will be more clearly understood from the following detailed description taken in conjunction with the accompanying drawings, in which:

FIGS. 9A to 9H are views illustrating an exemplary method of fabricating the memory device illustrated in FIG. 5;

FIGS. 10A to 10L are views illustrating an exemplary method of fabricating the memory device illustrated in FIG. 6;

DETAILED DESCRIPTION

Figure 1:
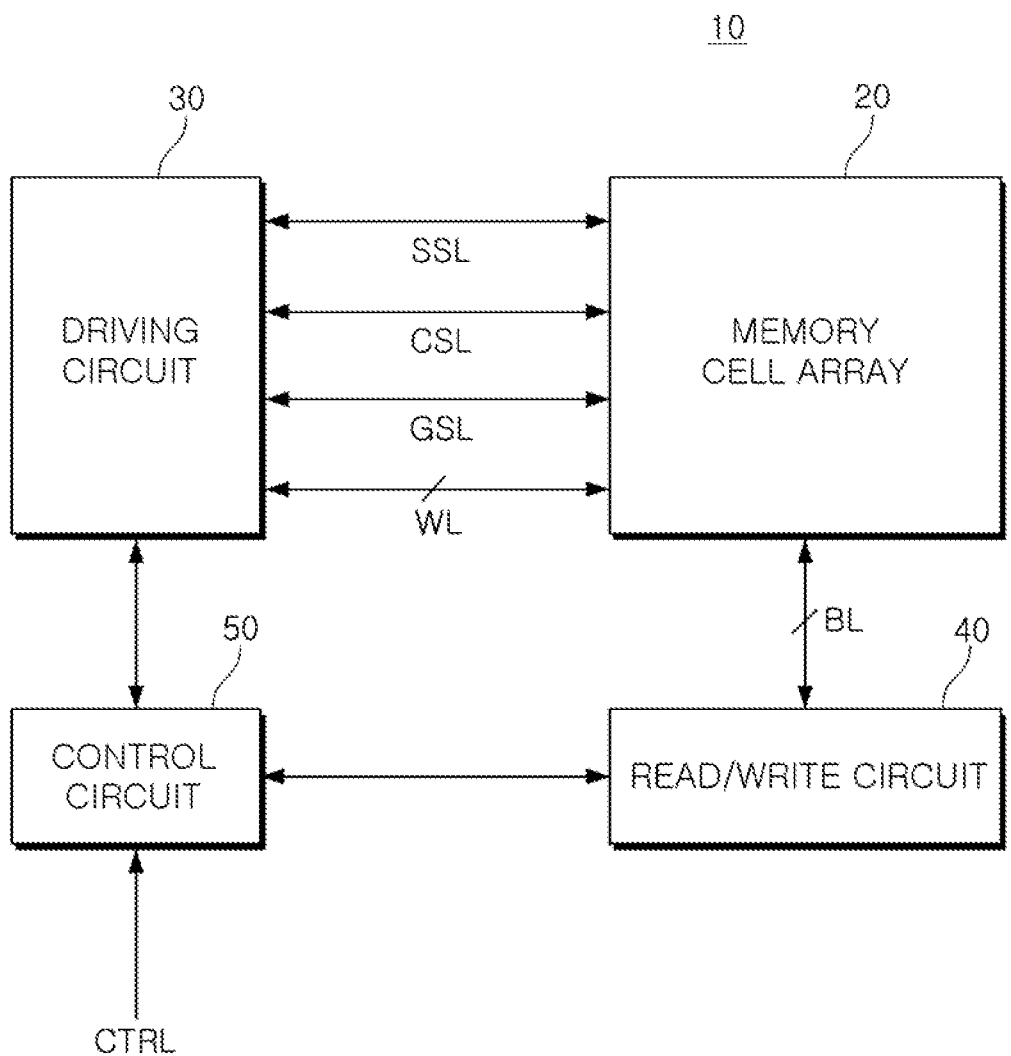
FIG. 1 is a block diagram schematically illustrating a memory device according to an exemplary embodiment in the present disclosure.

Hereinafter, embodiments in the present disclosure will be described in detail with reference to the accompanying drawings.

The disclosure may, however, be exemplified in many different forms and should not be construed as being limited to the specific embodiments set forth herein. In the drawings, the shapes and dimensions of elements may be exaggerated for clarity, and the same reference numerals will be used throughout to designate the same or like elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first layer could be termed a layer chip, and, similarly, a second layer could be termed a first layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a memory device according to an exemplary embodiment of the present disclosure.

Referring to FIG. 1, a memory device 10 according to an exemplary embodiment of the present disclosure may include a memory cell array 20, a driving circuit 30, a read/write circuit 40, and a control circuit 50. For example, a memory device 10 may comprise a semiconductor device such as a semiconductor chip formed from a wafer.

As used herein, a semiconductor device may refer to any of the various memory devices such as shown in FIGS. 1-12, and may also refer, for example, to an array of transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed, for example, using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

The memory cell array 20 may include a plurality of memory cells, and the plurality of memory cells may be arranged in a plurality of rows and columns. The plurality of memory cells included in the memory cell array 20 may be connected to the driving circuit 30 through a word line WL, a common source line CSL, a string select line SSL, a ground select line GSL, and the like, and to the read/write circuit 40 through a bit line BL. In some exemplary embodiments, the plurality of memory cells arranged in the same row may be connected to the same word line WL, and the plurality of memory cells arranged in the same column may be connected to the same bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In some exemplary embodiments, the driving circuit 30 may select at least a portion of the word lines WL, the common source lines CSL, the string select lines SSL, and the ground select lines GSL, connected to a memory cell array, by receiving address information from the outside and decoding the received address information. The driving circuit 30 may include a driving circuit for each of the word lines WL, the string select lines SSL, and the common source lines CSL.

The read/write circuit 40 may select at least a portion of the bit lines BL connected to the memory cell array 20 according to a command received from the control circuit 50. The read/write circuit 40 may read data stored in a memory cell connected to the selected portion of the bit lines BL, or write in the memory cell connected to the selected portion of the bit lines BL. The read/write circuit 40 may include a circuit, such as a page buffer, an input/output buffer, and a data latch, in order to perform the above-described operations.

The control circuit 50 may control operations of the driving circuit 30 and the read/write circuit 40 in response to a control signal transmitted from the outside. When data stored in the memory cell array 20 is read, the control circuit 50 may control an operation of the driving circuit 30 so as to supply a voltage for the read operation to a word line WL in which data to be read is stored. When the voltage for the read operation is supplied to a specific word line WL, the control circuit 50 may control the read/write circuit 40 to read data stored the memory cell connected to the word line WL to which the voltage for the read operation is supplied.

Meanwhile, when data is to be written in the memory cell array 20, the control circuit 50 may control an operation of the driving circuit 30 so as to supply a voltage for the write operation to a word line WL in which the data is to be written. When the voltage for the write operation is supplied to a specific word line WL, the control circuit 50 may control the read/write circuit 40 to write the data in a memory cell connected to the word line WL to which the voltage for the write operation is supplied.

Figure 2:
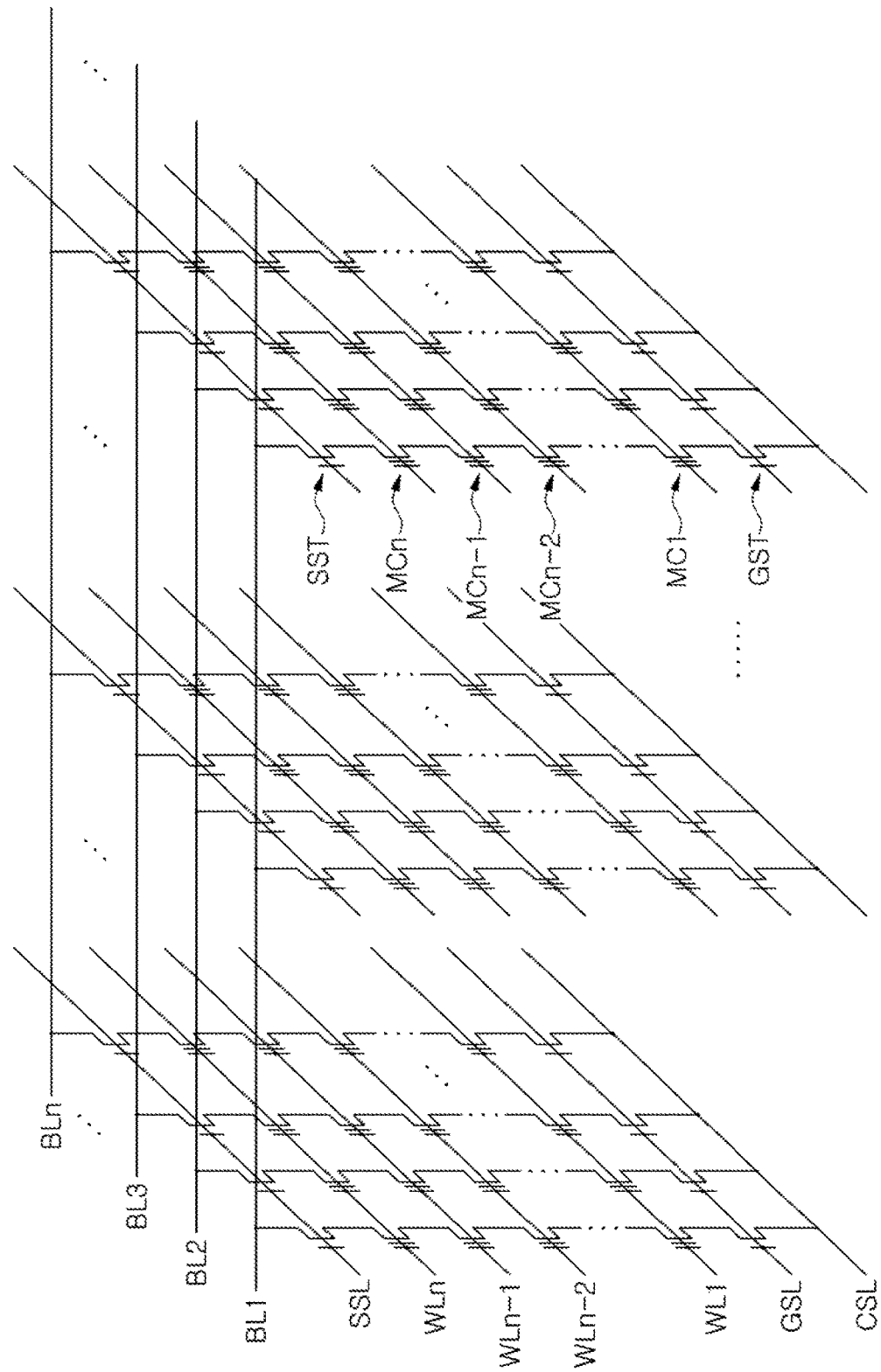
FIG. 2 is an equivalent circuit diagram of a memory cell array of a memory device according to an exemplary embodiment in the present disclosure.

FIG. 2 is an equivalent circuit diagram of a memory cell array included in a memory device according to an exemplary embodiment of the present disclosure.

Referring to FIG. 2, the memory cell array according to the exemplary embodiment of the present disclosure may include a plurality of memory cell strings. The plurality of memory cell strings include n-number of memory cell elements MC1 to MCn connected to each other in series, and a ground select transistor GST and a string select transistor SST respectively connected to both ends of the memory cell elements MC1 to MCn. Each memory cell element may also be referred to herein as a memory cell.

The n-number of memory cell elements MC1 to MCn connected to each other in series may be respectively connected to word lines WL1 to WLn for selecting at least a portion of memory cell elements MC1 to MCn.

A gate terminal of each ground select transistor GST may be connected to a ground select line GSL, and a source terminal of each ground select transistor GST may be connected to a common source line CSL. A gate terminal of each string select transistor SST may be connected to a string select line SSL, and a source terminal of each string select transistor SST may be connected to a drain terminal of a memory cell element MCn. In FIG. 2, one ground select transistor GST and one string select transistor SST are connected to the n-number of memory cell elements MC1 to MCn connected to each other in series. However, a plurality of ground select transistor GST or a plurality of string select transistor SST may be connected to the n-number of memory cell elements MC1 to MCn.

A drain terminal of each string select transistor SST may be connected to a respective bit line of bit lines BL1 to BLm. When a signal is applied to the gate terminal of a string select transistor SST through the string select line SSL, the signal applied through the respective bit line of bit lines BL1 to BLm is transmitted to the n-number of memory cell elements MC1 to MCn connected to each other in series, and a data read or data write operation may be performed. In addition, when the source terminal applies a signal to the gate terminal of a ground select transistor GST connected to the common source line CSL through the ground select line GSL, an erase operation by which charges stored in the n-number of memory cell elements MC1 to MCn are fully removed may be performed.

Figure 3:
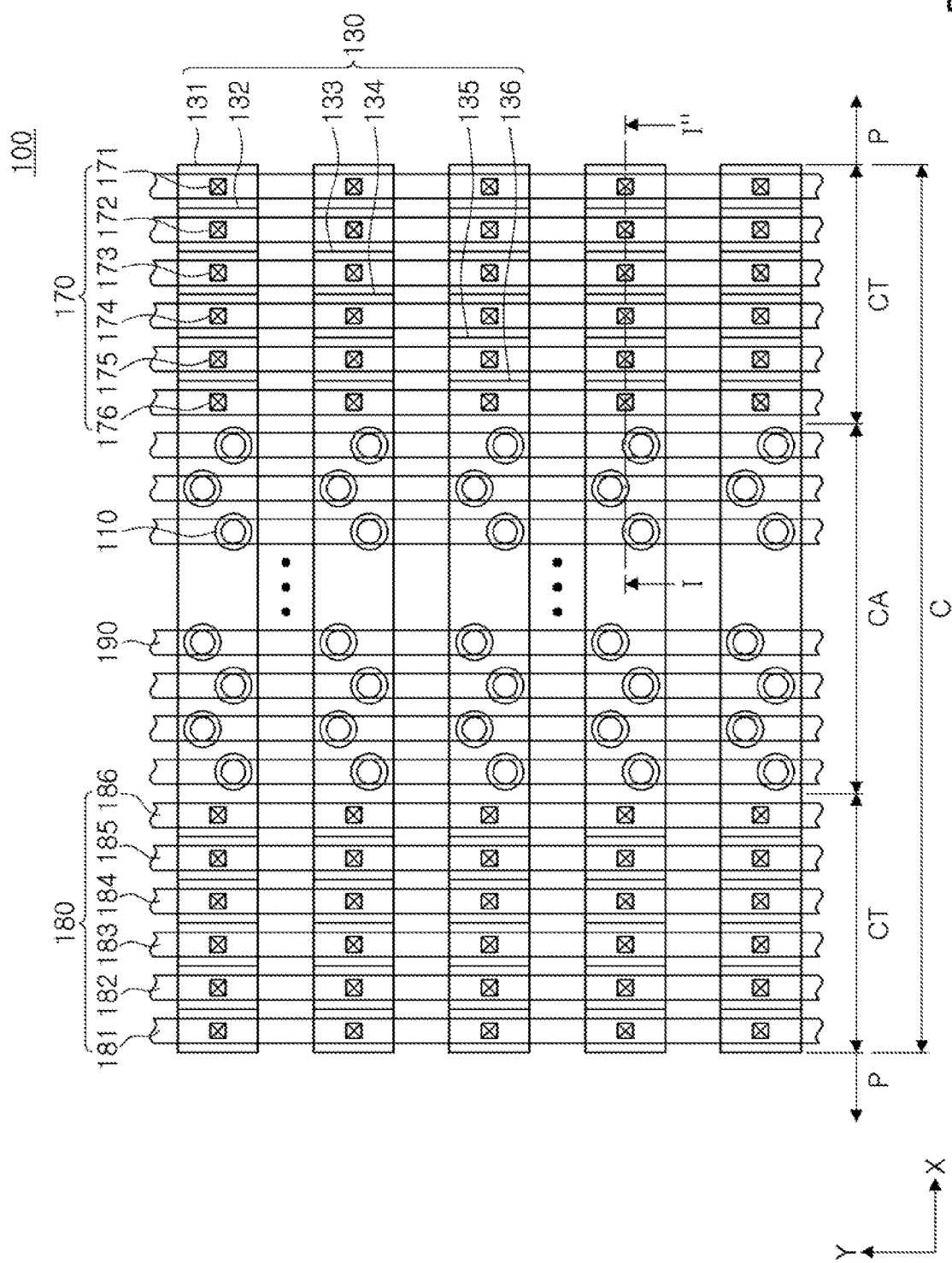
FIG. 3 is a plan view illustrating a structure of a memory device according to an exemplary embodiment of the present disclosure.

FIG. 3 is a plan view illustrating a structure of a memory device according to an exemplary embodiment of the present disclosure.

Referring to FIG. 3, a memory device 100 according to an exemplary embodiment of the present disclosure may include a cell region C and a peripheral circuit region P. In some exemplary embodiments, the cell region C may include a cell array region CA in which a plurality of channels 110 are formed, and a connection region CT in which a plurality of gate electrode layers 131 to 136: 130 are connected to a plurality of contact plugs 170 to 176: 170, also referred to herein as through electrodes. Meanwhile, the peripheral circuit region P may be formed at an outer region of the connection region CT of the cell region C (for example outside of the cell region C), and a plurality of circuit elements, for example, a plurality of horizontal transistors may be disposed in the peripheral circuit region P.

In the cell region C, a plurality of memory cells, and a plurality of bit lines 190 and a plurality of gate electrode layers 130, electrically connected to the memory cells, may be disposed. Since the plurality of gate electrode layers 130 include a conductive material, the plurality of gate electrode layers 130 may be referred to as a plurality of respective conductive lines in this disclosure. The plurality of gate electrode layers 130 may extend in a first direction. In FIG. 3, the plurality of gate electrode layers 130 are illustrated as extending in an x-axis direction. The plurality of bit lines 190 may extend in a second direction intersecting a direction in which the plurality of gate electrode layers 130 extend. In FIG. 3, the plurality of plurality of bit lines 190 are illustrated as extending in a y-axis direction intersecting the x-axis direction.

The plurality of gate electrode layers 130 may be stacked in a third direction (e.g., a z-axis direction perpendicular to an x-y plane) and may form word lines. Some gate electrode layers 130 disposed at the same height in the z-axis direction may be electrically connected to each other by a plurality of interconnection lines 181 to 186: 180. In order to connect the gate electrode layers 130 disposed at the same height in the z-axis direction to each other through the interconnection lines 180, a plurality of contact plugs 170 extending in the z-axis direction may be formed.

The plurality of channels 110 may be disposed in the plurality of gate electrode layers 130, for example, in the form of a zigzag, or alternating pattern, and each channel 110 may be electrically connected to a bit line 190. Since the plurality of channels 110 are disposed in the gate electrode layers 130 in the form of a zigzag, the number of channels 110 disposed in the gate electrode layers 130 may increase.

The connection region CT may be disposed between the cell array region CA and the peripheral circuit region P. In the connection region CT, the plurality of gate electrode layers 130 extending from the cell array region CA in a single direction (the x-axis direction) and the plurality of contact plugs 170 connected to the plurality of gate electrode layers 130 may be disposed. Each length of the plurality of gate electrode layers extending in the direction may become gradually shortened by a predetermined length from a gate electrode layer 131 disposed at the lowest level toward a gate electrode layer 136 disposed at the highest level in the z-axis direction perpendicular to the x-y plane. Therefore, the lengths of the gate electrode layers at a first, lower layer gradually become shorter for second, and further higher-level gate electrode layers. When the length of extending in the direction becomes gradually shortened from the gate electrode layer 131 disposed at the lowest level toward the gate electrode layer 136 disposed at the highest level, a step may be formed between each of the gate electrode layers 130 and an adjacent gate electrode layer 130 in a direction in which the gate electrode layers 130 are stacked. Thus, the gate electrode layers 130 may be stacked in a step-wise manner.

A peripheral circuit region P may be disposed outside of the connection region CT. In the peripheral circuit region P, circuits for operating the memory cells, and circuits for reading information stored in the memory cells, may be disposed. In some exemplary embodiments, the peripheral circuit region P may include a plurality of circuit elements (e.g., first, second, third, etc., circuit elements), and the plurality of circuit elements included in the peripheral circuit region P may include one or more horizontal transistors.

FIGS. 4 to 7 are perspective views illustrating structures of memory devices according to exemplary embodiments in the present disclosure.

Figure 4:
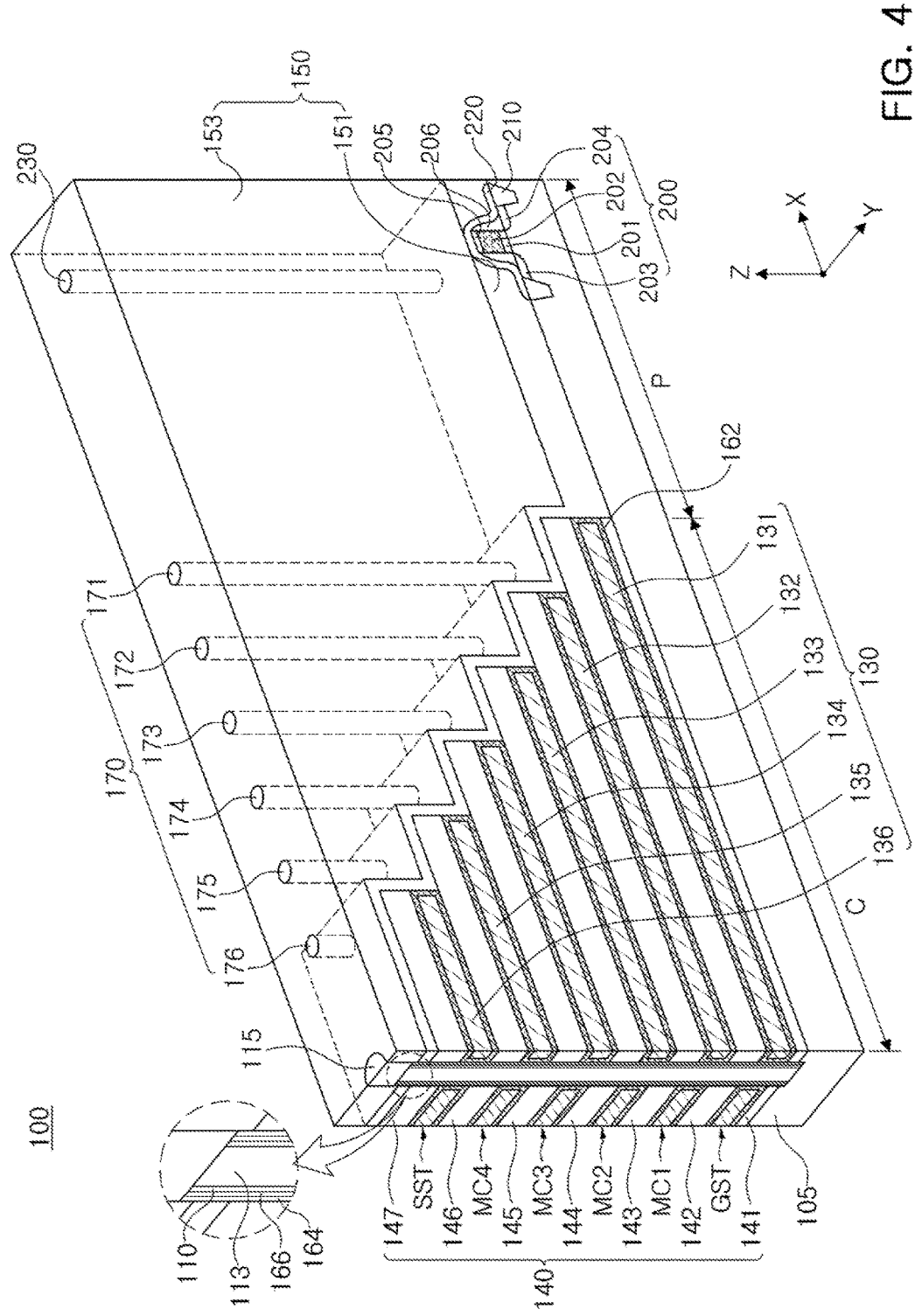
FIGS. 4 to 7 are perspective views illustrating structures of memory devices according to exemplary embodiments in the present disclosure.

FIG. 4 is a perspective view illustrating a structure of a memory device 100 according to an exemplary embodiment of the present disclosure. In some exemplary embodiments, the memory device 100 illustrated in FIG. 4 may illustrate a part taken along line I-I' of the memory device 100 illustrated in FIG. 3. In FIG. 4, some elements included in the memory cell illustrated in FIGS. 2 and 3 may be omitted. For example, the bit lines 190 and the interconnection lines 180 illustrated in FIG. 3 are omitted in FIG. 4.

Referring to FIG. 4, the memory device 100 may include a plurality of gate electrode layers 131 to 136: 130 stacked on an upper surface of a substrate 105 in the z-axis direction, and a plurality of insulating layers 141 to 147: 140 disposed between the plurality of gate electrode layers 130. In this manner, the plurality of gate electrode layers 130 may be alternatingly stacked with the plurality of insulating layers 140. The plurality of gate electrode layers 130 and the plurality of insulating layers 140 may extend in a first, single direction (the x-axis direction in FIG. 4). The cell region C may further include a channel 110 extending in a second direction (e.g., the z-axis direction) in addition to the plurality of gate electrode layers 130 and the plurality of insulating layers 140. The channel 110 may be formed in a cavity, or hole, having a circular cross-section, and an embedded insulating layer 113 may be formed in the channel 110. A conductive layer 115 may be formed on the channel 110, and the bit lines 190 (illustrated in FIG. 3) may be connected to the channel 110 through the conductive layer 115.

A gate insulating layer including a blocking layer 162, a charge storage layer 164, and a tunneling layer 166 may be disposed between the channel 110 and the gate electrode layers 130. According to the structure of the memory device 100, all of the blocking layer 162, the charge storage layer 164, and the tunneling layer 166 may be disposed to surround the gate electrode layers 130. Otherwise, a portion of the gate insulating layer may be disposed to extend in a direction parallel to the channel area 110 in the z-axis direction outside of the channel 110, and the other portion of the gate insulating layer may be disposed to surround the gate electrode layers 130. In FIG. 4, the charge storage layer 164 and the tunneling layer 166 are illustrated as being disposed on the outside of the channel area 110 to extend in a direction parallel to the channel 110 in the z-axis direction, and the blocking layer 162 is illustrated as surrounding the gate electrode layers 130.

The blocking layer 162 may include, for example, silicon oxide ($SiO_2$), silicon nitride ($Si_3N_4$), silicon oxynitride (SiON), or a high dielectric material. The high dielectric material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). A dielectric constant of a material included in the blocking layer 162 may be higher than that in the tunneling layer 166. The blocking layer 162 may selectively include a plurality of layers having different dielectric constants from each other. By disposing a layer having a relatively low dielectric constant to be closer to the channel 110 than a layer having a relatively high dielectric constant, an energy band such as a height of a barrier may be controlled to improve characteristics, for example, erase characteristics, of the memory device 100.

The charge storage layer 164 may be a charge trapping layer or a floating gate conductive layer. In one embodiment, when the charge storage layer 164 is the floating gate, it may be formed by depositing polysilicon using, for example, a low pressure chemical vapor deposition (LPCVD) method. In one embodiment, when the charge storage layer 164 is the charge trapping layer, it may include at least one of $SiO_2$, $Si_3N_4$, SiON, $HfO_2$, $ZrO_2$, $Ta_2O_3$, $TiO_2$, $HfAl_xO_y$, $HfTa_xO_y$, $HfSi_xO_y$, $Al_xN_y$, and $AlGa_xN_y$.

In one embodiment, the tunneling layer 166 may include at least one of $SiO_2$, $Si_3N_4$, SiON, $HfO_2$, $HfSi_xO_y$, $Al_xN_y$, $AlGa_xN_y$, $Al_2O_3$, and $ZrO_2$.

Each of the gate electrode layers 130 and insulating layers 140 may extend by different lengths from other gate electrode layers 130 and insulating layers 140 stacked at different positions in the z-axis direction to form a plurality of stair-like steps. The steps formed by the plurality of gate electrode layers 130 and insulating layers 140 extended by different lengths in the x-axis direction may provide a plurality of pad areas. For example, each pad area may include a pad, formed for example from the gate electrode layer 130 that forms each step. In FIG. 4, in each pad area, the insulating layers 140 are illustrated as being disposed to be higher than the gate electrode layers 130 in the z-axis direction. However, the gate electrode layers 130 may be disposed to be higher than the insulating layers 140.

The peripheral circuit region P may be a region defined as a peripheral region for the cell region C (e.g., disposed outside the cell region), and one or more circuit elements may be disposed in the peripheral circuit region P. The one or more circuit elements disposed in the peripheral circuit region P may configure the driving circuit 30, the read/write circuit 40, and the control circuit 50 illustrated in FIG. 1, and in one embodiment include one or more horizontal transistors 200. Although only one horizontal transistor 200 is illustrated in FIG. 4, the peripheral circuit region P may include two or more horizontal transistors 200. In certain embodiments, the peripheral circuit region P includes a plurality of horizontal transistors 200 and/or other circuit elements.

Referring to FIG. 4, the horizontal transistor 200 included in the peripheral circuit region P may include a horizontal gate insulating layer 201, a horizontal gate electrode 202, a horizontal source region 203, and a horizontal drain region 204. The positions of the horizontal source region 203 and the horizontal drain region 204 may be exchanged in contrast to that illustrated in FIG. 4, and thus each region may also be referred to as a source/drain region. The horizontal gate electrode 202 may include at least one of polysilicon, a metal (e.g. tungsten or molybdenum), and a metal silicide. In other exemplary embodiments, the horizontal gate electrode 202 may have a structure in which a polysilicon layer and a metal silicide layer are stacked.

A capping layer 205 and a gate spacer 206 are respectively disposed on an upper surface and side surfaces of the horizontal gate electrode 202. The capping layer 205 disposed on the upper surface of the horizontal gate electrode 202 may include silicon nitride, and the gate spacer 206 disposed on the side surfaces of the horizontal gate electrode 202 may include at least one of silicon nitride and silicon oxide.

In some exemplary embodiments, the capping layer 205 and the gate spacer 206 may be formed at the same time in a single process. For example, in one embodiment, after the horizontal gate electrode 202 is formed, a silicon oxide layer may be deposited to have a thickness of 500 to 600 Å on the horizontal gate electrode 202 using a middle temperature deposition of oxide (MTO) process. Next, the silicon oxide layer deposited on the horizontal gate electrode 202 is etched using an etchback process to form the capping layer 205 and the gate spacer 206.

An etch stop layer 220 including silicon nitride, for example, may be disposed on the capping layer 205 and the gate spacer 206, and a device isolation layer 210 may be disposed outwardly of the horizontal source region 203 and the horizontal drain region 204. Similar to the gate electrode layers 130 connected to the contact plugs 170 in the cell region C (e.g., in the contact region CT of the cell region C), the horizontal gate electrode 202 may be connected to a peripheral contact plug 230, also referred to herein as a through electrode. However, the arrangement of the horizontal gate electrode 202, the device isolation layer 210, and the peripheral contact plug 230 are not limited to that illustrated in FIG. 4 and, in some exemplary embodiments, an active region of the substrate 105 with no device isolation layer 210 and the horizontal gate electrode 202 may be disposed to intersect each other. In this case, the peripheral contact plug 230 may be connected to the horizontal gate electrode 202 disposed on the device isolation layer 210.

A memory device 100 according to exemplary embodiments of the present disclosure may include interlayer insulating layers 150 disposed on the substrate 105 in the cell region C and the peripheral circuit region P. The interlayer insulating layers 150 may include a first interlayer insulating layer 151 and a second interlayer insulating layer 153. The first interlayer insulating layer 151 may cover at least a portion of the plurality of gate electrode layers 130 disposed in the cell region C, and at least a first circuit element such as a horizontal transistor 200 disposed in the peripheral circuit region P. The first interlayer insulating layer 151 may fill a space formed between the horizontal gate electrode 202 and the upper surface of the substrate 105 in the peripheral circuit region P, and where multiple horizontal gate electrodes 202 or other circuit elements are used, may fill in the spaces between these electrodes and/or other circuit elements. In the exemplary embodiment illustrated in FIG. 4, the first interlayer insulating layer 151 covers the uppermost gate electrode layer 136. Further, in this example, the first interlayer insulating layer 151 is formed in a continuous manner to extend between the horizontal transistor 200 and a first channel 115. In one embodiment, the first interlayer insulating layer 151 may cover both side surfaces and top surfaces of the steps that form the stack of gate electrode layers 130 and insulating layers 140. The first interlayer insulating layer 151 in FIG. 4 is shown as covering all of the steps. However, the first interlayer insulating layer 151 may cover only a portion of the plurality of gate electrode layers 130 that form the steps.

The second interlayer insulating layer 153 may be disposed on the first interlayer insulating layer 151 throughout the cell region C and the peripheral circuit region P. For example, the second interlayer insulating layer 153 may be described as a top or upper insulating layer and the first interlayer insulating layer 151 may be described as a bottom or lower insulating layer, such that the first interlayer insulating layer 151 is between the substrate 105 and the second interlayer insulating layer 153. When the first interlayer insulating layer 151 is formed to cover only the part of the plurality of gate electrode layers 130, the second interlayer insulating layer 153 may be disposed on a portion of the plurality of insulating layers 140 in the cell region C.

The second interlayer insulating layer 153 may be formed, for example, by a physical vapor deposition (PVD) process, a chemical vapor deposition (CVD) process, a sub-atmospheric chemical vapor deposition (SACVD) process, a low pressure chemical vapor deposition (LPCVD) process, a plasma enhanced chemical vapor deposition (PECVD) process, and the like. In some exemplary embodiments, the second interlayer insulating layer 153 may include a tetra-ethyl-ortho-silicate (TEOS) oxide layer having a relatively high deposition rate. In addition, the first interlayer insulating layer 151 may include a high density plasma (HDP) oxide layer having excellent gap filling properties, in order to fill a space formed between the horizontal gate electrode 202 and the upper surface of the substrate 105. As such, in one embodiment, the first interlayer insulating layer 151 has better gap filling properties than the second interlayer insulating layer 153, and the second interlayer insulating layer 153 has a higher deposition rate than the first interlayer insulating layer 151.

At certain regions, the first interlayer insulating layer 151 may have a relatively smaller thickness than the second interlayer insulating layer 153 (e.g., in a z-axis direction). For example, in certain embodiments, the thickness of the first interlayer insulating layer 151 may be equal to $\frac{1}{20}$ to $\frac{1}{10}$ (e.g., 5% to 10%) of the thickness of the second interlayer insulating layer 153 (e.g., in the peripheral region). A desired thickness may be derived from the purpose of filling spaces between gate electrodes of the plurality of horizontal gate electrodes 202 using the HDP oxide layer having excellent gap filling properties. In some exemplary embodiments, when the interlayer insulating layers 150 include the first interlayer insulating layer 151 having an HDP oxide layer and the second interlayer insulating layer 153 having a TEOS oxide layer, the HDP oxide layer may have a thickness of about 300 nm, and the TEOS oxide layer may have a thickness of about 3 µm (e.g., in the peripheral region). The thicknesses of the HDP oxide layer and the TEOS oxide layer included in the interlayer insulating layers 150 may change depending on each thickness of the plurality of gate electrode layers 130 and insulating layers 140 included in the memory device 100 and the number of stacks of the gate electrode layers 130 and the insulating layers 140. For example, at a location at the stack of 6 gate electrode layers 130 and 6 insulating layers 140 of FIG. 4, the ratio between the thickness of the first interlayer insulating layer 151 to the thickness of the second interlayer insulating layer 153 in the z-axis direction may be between about 1:2 and about 1:4, whereas at a location in the peripheral region P, such a ratio may be between about 1:10 and about 1:20. Also, as shown in FIG. 4, the thickness in the z-axis direction of the first interlayer insulating layer 151 may be greater in the peripheral region P than in the cell region C.

In one embodiment, the second interlayer insulating layer 153 may be formed by a single process performed after forming pad areas by etching the gate electrode layers 130 and the insulating layers 140, and forming the first interlayer insulating layer 151. Accordingly, the second interlayer insulating layer 153 may have the same quality throughout the cell region C and the peripheral circuit region P. For example, it may be formed to have a substantially gap-less interface with the first interlayer insulating layer 151. Further, it may be formed of a homogenous material. In addition, in one embodiment, since the first interlayer insulating layer 151 and the second interlayer insulating layer 153 are respectively formed in different processes, a boundary between the first interlayer insulating layer 151 and the second interlayer insulating layer 153 may be seen structurally.

In one embodiment, the thickness of the second interlayer insulating layer 153 in at least a portion of the peripheral circuit region P may be greater than a distance between the uppermost gate electrode layer 136 among the plurality of gate electrode layers 130 and the upper surface of the substrate 105. Accordingly, a polishing process (e.g. a CMP process) among the processes of forming the interlayer insulating layers 150 may be omitted, and the plurality of gate electrode layers 130 and insulating layers 140 may be stacked at the same time. Therefore, the manufacturing process can be simplified, and manufacturing time and costs therefore can be saved. The manufacturing processes according to the structure of the interlayer insulating layers 150 of the memory device 100 illustrated in FIG. 4 will be described later with reference to FIGS. 8A to 8J.

Since the first interlayer insulating layer 151 is disposed in a space between the circuit elements disposed in the peripheral circuit region P and has a relatively smaller thickness than the second interlayer insulating layer 153, the thickness of the second interlayer insulating layer 153 may be greater than the distance between the uppermost gate electrode layer 136 in at least a portion of the peripheral circuit region P and the cell region C and the upper layer of the substrate 105.

In the exemplary embodiment of FIG. 4, the thickness of the first interlayer insulating layer 151 is illustrated as being substantially the same as a height of the horizontal gate electrode 202 at certain locations, but is not limited thereto. For example, the thickness of the first interlayer insulating layer 151 may be less or more than the height of the horizontal gate electrode 202. For example, the thickness of the first interlayer insulating layer 151 may be different (e.g., greater) in the peripheral region than in the cell region. Surfaces of the first interlayer insulating layer 151 may contact surfaces of the second interlayer insulating layer 153, as shown in FIG. 4.

In addition, four memory cells MC1 to MC4, one string select transistor SST, and one ground select transistor GST are illustrated in FIG. 4, but the present embodiment is not limited thereto, and the number of memory cells and the numbers of the string select transistor SST and the ground select transistor GST may be more or less. Further, the memory cells MC1 to MC4, the string select transistor SST, and the ground select transistor GST are illustrated as having the same structure, but the string select transistor SST and the ground select transistor GST may have a different structure from the memory cells MC1 to MC4. For example, the insulating layers 140 disposed between the gate electrode layers 130 and the gate electrode layers 130 included in each of the string select transistor SST, the ground select transistor GST, and the memory cells MC1 to MC4 may have a different structure from each other.

Figure 5:
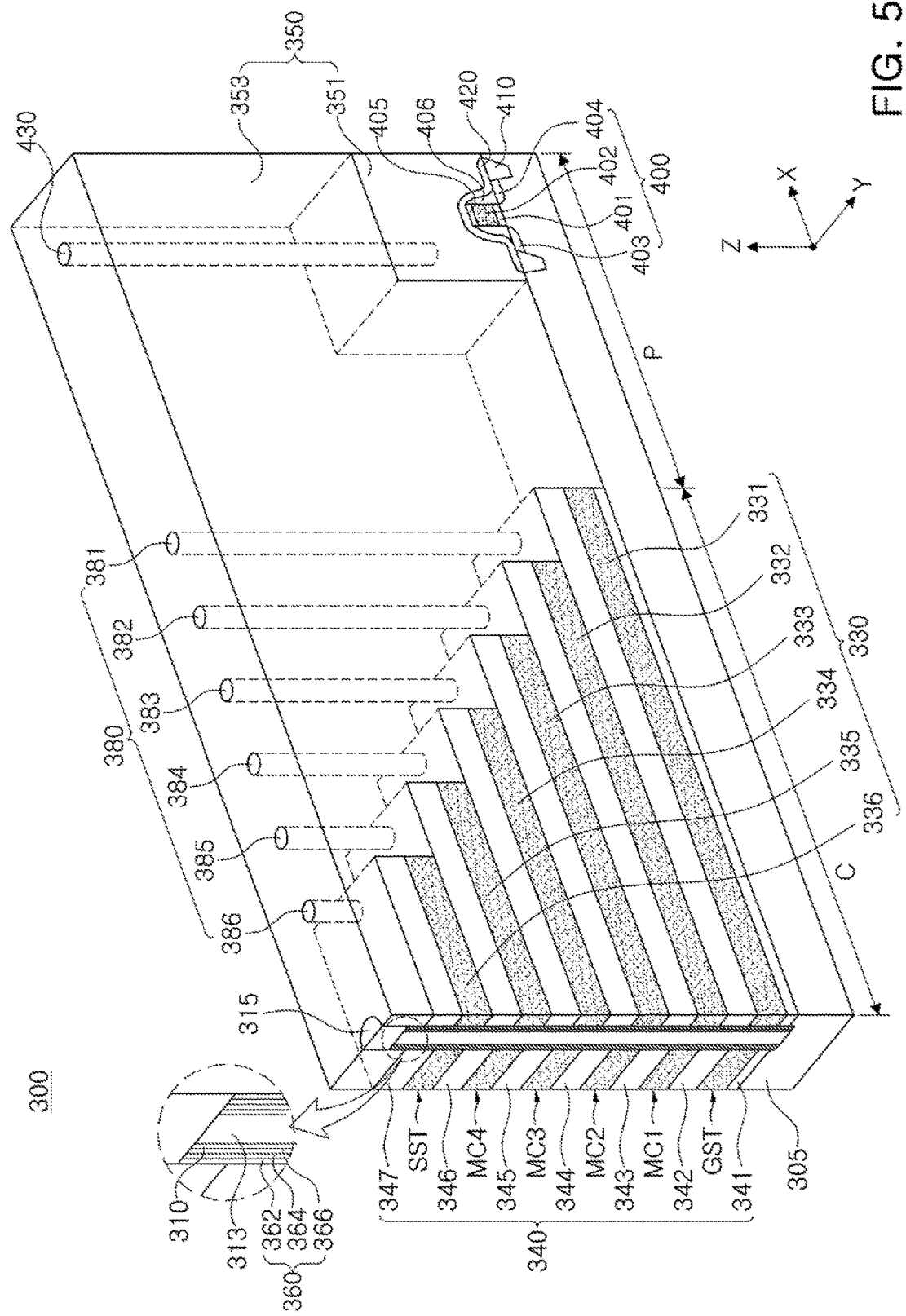

FIG. 5 is a perspective view illustrating a memory device 300 according to a different exemplary embodiment of the present disclosure from that illustrated in FIG. 4.

Referring to FIG. 5, a plurality of contact plugs 381 to 386: 380, connected to each of a plurality of gate electrode layers 330 in pad areas in which a channel 310, memory cells MC1 to MC4, a string select transistor SST, a ground select transistor GST, and a plurality of gate electrode layers 331 to 336: 330 are formed to extend in the x-axis direction by different lengths may be similar to the memory device 100 of FIG. 4. However, in the exemplary embodiment illustrated in FIG. 5, all of a blocking layer 362, a charge storage layer 364, and a tunneling layer 366, included in a gate insulating layer, may extend in a direction parallel to the channel 310 in the z-axis direction. In addition, since the plurality of gate electrode layers 330 are provided by being stacked with a plurality of insulating layers 341 to 347: 340, a process of removing a sacrificial layer and filling a space in which the sacrificial layer is removed with a conductive material such as tungsten may be omitted in the manufacturing process. Differences in the manufacturing process described above will be described later with reference to FIGS. 9A to 9H.

Referring to FIG. 5, similarly to the exemplary embodiment described with reference to FIG. 4, in a cell region C, the plurality of gate electrode layers 330 and the plurality of insulating layers 340, stacked in the z-axis direction, may extend in a single direction (the x-axis direction) to provide pad areas. The uppermost gate electrode layer 346 and insulating layer 347 in the z-axis direction extend to have the shortest length in the direction (the x-axis direction), and the lowermost gate electrode layer 331 and insulating layers 341 and 342 in the z-axis direction, disposed closest to an upper surface of the substrate 305, may extend to have the longest length in the direction (the x-axis direction). The insulating layer 341 having a relatively smaller thickness than the other insulating layers 342 to 347 may be additionally formed between the lowermost gate electrode layer 331 in the stacking direction and the substrate 305.

In a peripheral circuit region P, one or more circuit elements may be disposed. In some exemplary embodiments, one or more horizontal transistors 400 may be disposed in the peripheral circuit region P. The horizontal transistor 400 may include a horizontal gate insulating layer 401, a horizontal gate electrode 402, a horizontal source region 403, and a horizontal drain region 404. Locations of the horizontal source electrode 403 and the horizontal drain electrode 404 may opposite to those in FIG. 5, and therefore each region may be referred to as a horizontal source/drain region. A device isolation layer 410 may be disposed outside of the horizontal source region 403 and the horizontal drain region 404. The horizontal transistor 400 disposed in the peripheral circuit region P may be connected to a peripheral contact plug 430, also referred to as a through electrode. The peripheral contact plug 430 may pass through first and second interlayer insulating layers 351 and 353 to be connected to the horizontal gate electrode 402 of the horizontal transistor 400.

The memory device 300 according to the exemplary embodiment illustrated in FIG. 5 may include interlayer insulating layers 350 having a first interlayer insulating layer 351 and a second interlayer insulating layer 353 and disposed on the substrate 305 in the cell region C and the peripheral circuit region P. In the peripheral circuit region P, an etch stop layer 420 may be disposed on a capping layer 405 and a gate spacer 406 respectively covering an upper surface and side surfaces of the horizontal gate electrode 402. The first interlayer insulating layer 351 may be disposed on the etch stop layer 420 in the peripheral circuit region P, and the second interlayer insulating layer 353 may be disposed on the substrate 305 in the cell region C and the peripheral circuit region P. The first interlayer insulating layer 351 may include a first surface disposed above the horizontal transistor 400 and substantially parallel to the upper surface of the substrate 305, and a second surface connecting the first surface to the upper surface of the substrate 305. The second interlayer insulating layer 353 may be formed to fully cover the first surface and the second surface of the first interlayer insulating layer 351, and may also cover a top surface of the substrate 305 between the first interlayer insulating layer 351 and the stack of gate electrode layers 330 and insulating layers 340, and top and side surfaces of the step structure formed by the stack of gate electrode layers 330 and insulating layers 340.

In some exemplary embodiments, the first interlayer insulating layer 351 may include an HDP oxide layer, and the second interlayer insulating layer 353 may include a TEOS oxide layer. The first interlayer insulating layer 351 disposed on a curved surface formed due to the horizontal transistor 400 may include the HDP oxide layer having excellent gap filling properties, and the second interlayer insulating layer 353 having a relatively larger volume than the first interlayer insulating layer 351 may include the TEOS oxide layer having a high deposition rate so as to reduce a processing time. When a plurality of horizontal transistors 400 are disposed in the peripheral circuit region P, the first interlayer insulating layer 351 may include an HDP oxide layer having excellent gap filling properties, helping to more fully fill spaces formed between the plurality of horizontal gate electrodes 402. Further, in other exemplary embodiments, the second interlayer insulating layer 353 may further include an HDP oxide layer formed to have a smaller thickness than the TEOS oxide layer, before the TEOS oxide layer is deposited. The first and second surfaces of the first interlayer insulating layer 351 may contact surfaces of the second interlayer insulating layer 353, as shown in FIG. 5.

In the memory device 300 according to the exemplary embodiment illustrated in FIG. 5, a thickness of the second interlayer insulating layer 353, for example in a z-axis direction at a particular portion of the second interlayer insulating layer 353 may be greater than a distance from the upper surface of the substrate 305 to the uppermost gate electrode layer 336. In particular, the thickness of the second interlayer insulating layer 353 in a z-axis direction may be greater than the distance from the upper surface of the substrate 305 to the uppermost gate electrode layer 336 in at least a portion of the peripheral circuit region P.

The second interlayer insulating layer 353 may be in contact with the upper surface of the substrate 305 in at least a portion of the peripheral circuit region P, in particular, in at least a portion adjacent to the cell region C among the peripheral circuit region P. In particular, since the first interlayer insulating layer 351 covering the horizontal transistor 400 is disposed in the peripheral circuit region P, the second interlayer insulating layer 353 may be in contact with the upper surface of the substrate 305 between the second surface of the first interlayer insulating layer 351 and the gate electrode layers 330 disposed in the cell region C.

In the peripheral circuit region P, in one embodiment, the first interlayer insulating layer 351 covering the horizontal transistor 400 is formed, and then the second interlayer insulating layer 353 may be formed in a single process. Thus, as shown in FIG. 5, the memory device 300 having the interlayer insulating layers 350 may be formed. Accordingly, when the memory device 300 illustrated in FIG. 5 is fabricated, manufacturing time and costs therefor can be saved by simplifying the process of forming the interlayer insulating layer 350. The process of fabricating the memory device 300 illustrated in FIG. 5 will be described later with reference to FIGS. 9A to 9H.

Figure 6:
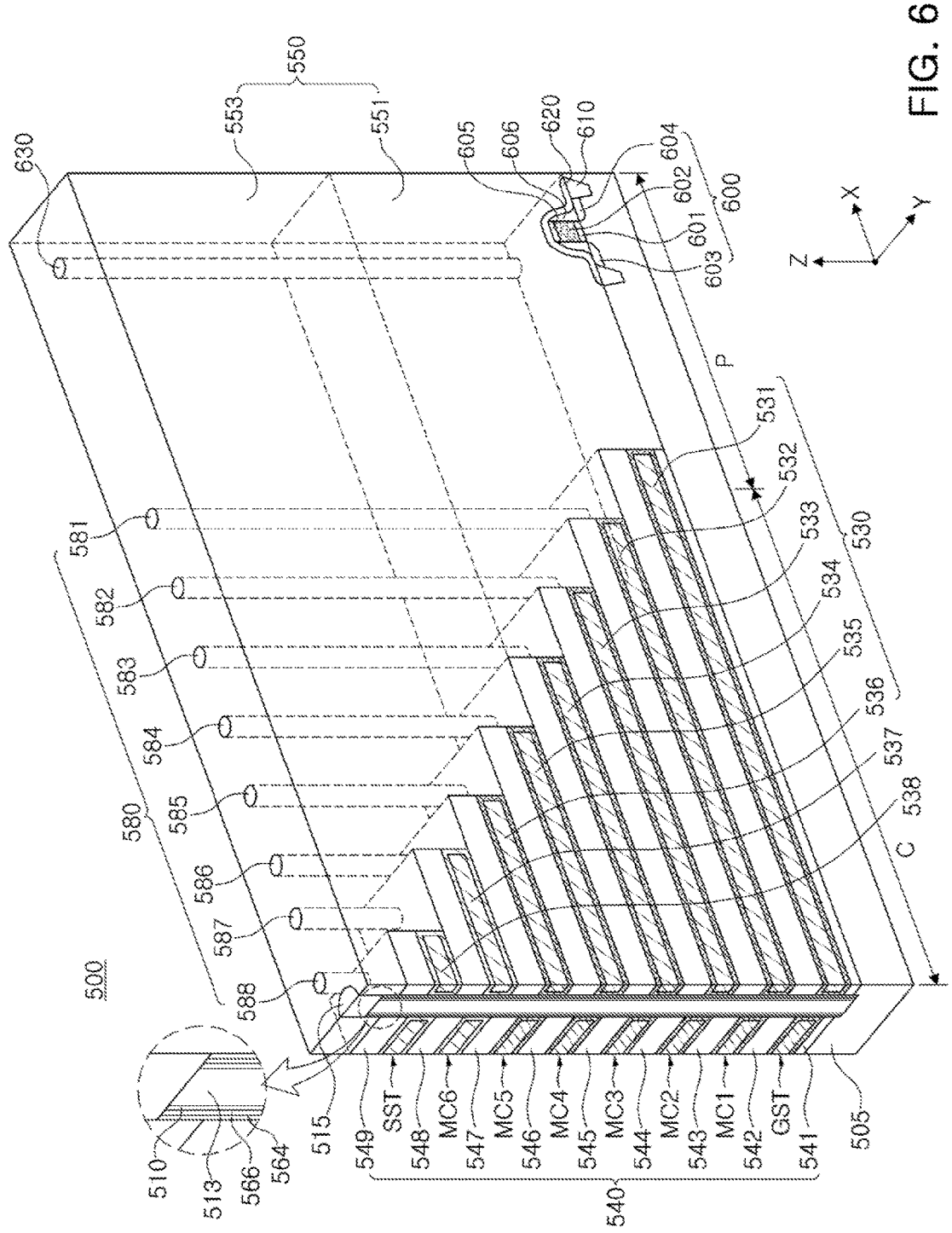

FIG. 6 is a perspective view illustrating a memory device 500 according to an exemplary embodiment different from those illustrated in FIGS. 4 and 5. Referring to FIG. 6, the memory device 500 according to this exemplary embodiment of the present disclosure may include a plurality of gate electrode layers 531 to 538: 530 and a plurality of insulating layers 541 to 549: 540, alternately stacked on a substrate 505 in the z-axis direction. In a cell region C, a cavity passing through the plurality of gate electrode layers 530 and the insulating layers 540 to the substrate 505 in the z-axis direction may be formed, and a channel 510 may be formed in the cavity. In a peripheral circuit region P of the memory device 500, at least one circuit element including a horizontal transistor 600 may be disposed, and a horizontal gate electrode 602 of the horizontal transistor 600 may be electrically connected to a peripheral contact plug 630 passing through first and second interlayer insulating layers 551 and 553.

The plurality of gate electrode layers 530 and the plurality of insulating layers 540 may extend in the x-axis direction by different lengths to form steps, and pad areas may be formed by the gate electrode layers 530 and the insulating layers 540 extended by different lengths. In each pad area, each of the gate electrode layers 530 may be connected to each of a plurality of contact plugs 580. In FIG. 6, although the insulating layers 540 are illustrated as being located higher than the gate electrode layers 530 in the pad area, the gate electrode layers 530 may be located higher than the insulating layers 540 in the pad area.

Meanwhile, the memory device 500 illustrated in FIG. 6 may include a relatively greater number of gate electrode layers 530 and insulating layers 540 than the memory devices 300 and 400 illustrated in FIGS. 4 and 5. Accordingly, because of a stacking height of the gate electrode layers 530 and the insulating layers 540, voids may be generated in a space between the horizontal transistors 600 when interlayer insulating layers 550 are formed in the same structure as illustrated in FIGS. 4 and 5.

The memory device 500 illustrated in FIG. 6 may include a first interlayer insulating layer 551 disposed on the pad areas formed by parts of gate electrode layers 531 to 534, on an upper surface of the substrate 505, and on the horizontal transistor 600. Thus, unlike the exemplary embodiment illustrated in FIG. 5, the first interlayer insulating layer 551 may be disposed throughout part of the cell region C and the peripheral circuit region P in the memory device 500 of FIG. 6, and on the parts of gate electrode layers 531 to 534 in the cell region C. For example, it may extend from a circuit element in the peripheral region P into the cell region C to cover at least part of the step-wise structure in the cell region C.

The first interlayer insulating layer 551 and the second interlayer insulating layer 553 may have a different thickness from each other in the peripheral circuit region P. Since the first interlayer insulating layer 551 and the second interlayer insulating layer 553 are disposed on at least a portion of the gate electrode layers 530 in the pad areas, the thickness may not be uniform in the cell region C in the z-axis direction. However, the first interlayer insulating layer 551 and the second interlayer insulating layer 553 may have a substantially uniform thickness in at least a portion of the peripheral circuit region P. In certain embodiments, the first interlayer insulating layer 551 and the second interlayer insulating layer 553 may have different thicknesses from each other.

Meanwhile, the thickness of the first interlayer insulating layer 551 and the thickness of the second interlayer insulating layer 553 may be changed depending on the number and thicknesses of the gate electrode layers 530 and the insulating layers 540 stacked on the substrate 505 before the first interlayer insulating layer 551 is formed, and the entire number of the gate electrode layers 530 and the insulating layers 540. As shown in FIG. 6, the first interlayer insulating layer 551 may be formed to be in contact with pad areas formed by four gate electrode layers 531 to 534, and the second interlayer insulating layer 553 may be formed to be in contact with the pad areas formed by four gate electrode layers 535 and 538, but are not limited thereto. Here, the second interlayer insulating layer 553 may be disposed on the uppermost gate electrode layer 538 and surround the channel 510 and the conductive layer 515. Also, the thickness of the second interlayer insulating layer 553 may be greater than the thickness of the first interlayer insulating layer 551 in at least a portion of the peripheral circuit region P.

Meanwhile, due to the structural difference as described above, the memory device 500 illustrated in FIG. 6 may be fabricated in a different process from the memory devices 100 and 300 illustrated in FIGS. 4 and 5, which will be described later with reference to FIGS. 10A to 10L.

In the memory devices 100, 300, and 500, the blocking layers 162 and 562 are disposed outwardly of the gate electrode layers 130 and 530 in the memory devices 100 and 500 illustrated in FIGS. 4 and 6, and the blocking layer 362 extends in the z-axis direction parallel to the channel area 310 to be disposed outside of the charge storage layer 364 in the memory device 300 illustrated in FIG. 5. However, the invention is not limited to these forms. For example, in the memory devices 100 and 500 illustrated in FIGS. 4 and 6, the blocking layers 162 and 562 may extend in the z-axis direction parallel to the channels 110 and 510 to be disposed outside of the charge storage layers 164 and 564. Otherwise, in the memory device 300 illustrated in FIG. 5, the blocking layer 362 may be disposed to surround the gate electrode layers 330.

Figure 7:
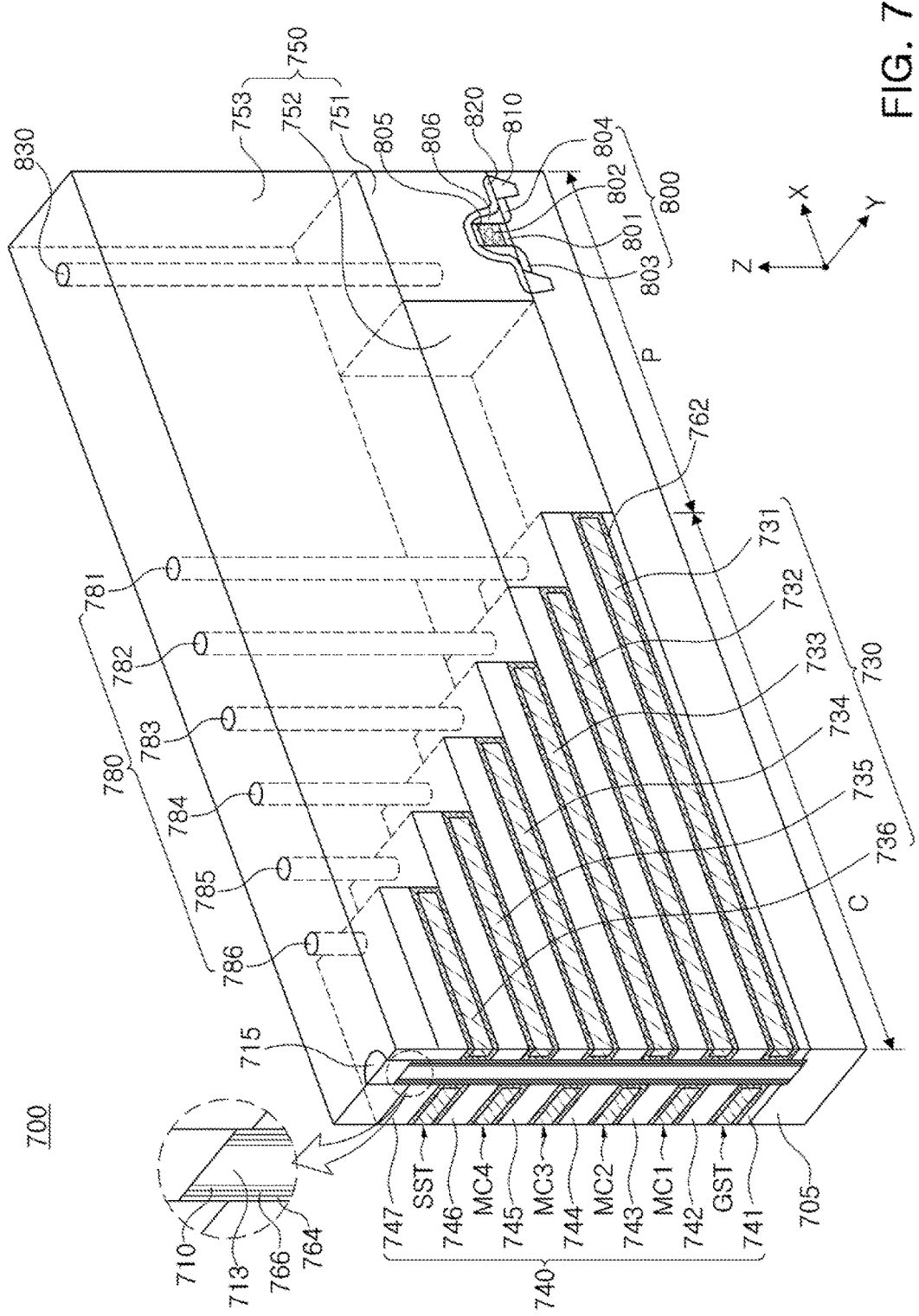

FIG. 7 is a perspective view illustrating a memory device 700 according to a different exemplary embodiment from the FIGS. 4 to 6. Referring to FIG. 7, the memory device 700 according to this exemplary embodiment may include plurality of gate electrode layers 731 to 736: 730 and a plurality of insulating layers 741 to 747: 740 alternately stacked on an upper surface of a substrate 705 in the z-axis direction. The memory device 700 may include a cell region C and a peripheral circuit region P. In the cell region C, a cavity passing through the plurality of gate electrode layers 730 and the insulating layers 740 to the substrate 705 may be formed, and a channel 710 may be formed in the cavity. In the peripheral circuit region P of the memory device 700, one or more circuit elements including a horizontal transistor 800 may be disposed, and a horizontal gate electrode 802 of the horizontal transistor 800 may be electrically connected to a peripheral contact plug 830 passing through interlayer insulating layers 751 and 753.

The plurality of gate electrode layers 730 and the plurality of insulating layers 740 may extend by different lengths in the x-axis direction to form steps, and pad areas may be formed by the gate electrode layers 730 and the insulating layers 740 extended by different lengths. In each pad area, each of the gate electrode layers 730 may be connected to each of a plurality of contact plugs 780. In FIG. 7, although the insulating layers 740 are illustrated as being located higher than adjacent gate electrode layers 730 in a stacking direction, the gate electrode layers 730 may be located higher than the insulating layers 740 in the pad area.

Meanwhile, the memory device 700 illustrated in FIG. 7 may include a channel 710 passing through the plurality of gate electrode layers 730 and the plurality of insulating layers 740 to extend in a direction perpendicular to an upper surface of the substrate 705. The channel 710 may be formed, for example, in a cylindrical shape having a hollow center portion, and the hollow center portion may be filled with an embedded insulating layer 713. Selectively, a hydrogen annealing process in which the structure including the channel 710 formed thereon is heat-treated in a hydrogen- or deuterium-containing gas atmosphere, may be additionally performed before the embedded insulating layer 713 is formed. Through the hydrogen annealing process, many of crystal defects existing in the channel 710 may be cured.

A charge storage layer 764 and a tunneling layer 766 may be formed outwardly of the channel 710. The charge storage layer 764 and the tunneling layer 766 may extend in the direction perpendicular to the upper surface of the substrate 705 like the channel 710. A blocking layer 762 may be disposed outwardly of the gate electrode layers 730. Accordingly, the blocking layer 762, the charge storage layer 764, and the tunneling layer 766 may be sequentially disposed between the gate electrode layers 730 and the channel 710.

Meanwhile, the memory device 700 illustrated in FIG. 7 may include the interlayer insulating layers 750 disposed on the substrate 705 in the cell region C and the peripheral circuit region P. The interlayer insulating layers 750 may include first, second, and third interlayer insulating layers 751, 752, and 753. The first interlayer insulating layer 751 may cover the horizontal transistor 800 in the peripheral circuit region P. In one embodiment, the first interlayer insulating layer 751 covers all circuit elements in the peripheral circuit region P. The second interlayer insulating layer 752 may be disposed throughout part of the cell region C and the peripheral circuit region P, and cover a portion of the plurality of gate electrode layers 730 in the cell region C. For example, in one embodiment, the second interlayer insulating layer 752 covers a portion of the peripheral circuit region P that does not include circuit elements. In one embodiment, the second interlayer insulating layer 752 may have substantially the same thickness in the z-axis direction as the first interlayer insulating layer 751 in the peripheral circuit region P. Accordingly, upper surfaces of the first and second interlayer insulating layers 751 and 752 may be coplanar in the peripheral circuit region P. The two interlayer insulating layers 751 and 752 may together form a lower interlayer insulating layer. The second interlayer insulating layer 752 may be disposed between the plurality of gate electrode layers 730 and the first interlayer insulating layer 751 as illustrated in FIG. 7.

The third interlayer insulating layer 753 may be disposed on the first and second interlayer insulating layers 751 and 752. The third interlayer insulating layer 753 may thus form an upper interlayer insulating layer. The third interlayer insulating layer 753 may have a relatively greater volume and thickness than the first and second interlayer insulating layers 751 and 752. In one embodiment, third interlayer insulating layer 753 may include a TEOS oxide layer having a high deposition rate than the first and second interlayer insulating layers 751 and 752. Meanwhile, the first and second interlayer insulating layers 751 and 752 may include an HDP oxide layer having an excellent gap filling property.

Hereinafter, methods of fabricating the memory devices illustrated in FIGS. 4 to 7 will be described with reference to FIGS. 8 to 11.

FIGS. 8A to 8J are views illustrating a method of fabricating the memory device 100 illustrated in FIG. 4. FIGS. 8A to 8J are cross-sectional views taken in the y-axis direction of the perspective view of FIG. 4 according to a process sequence.

Figure 8A:
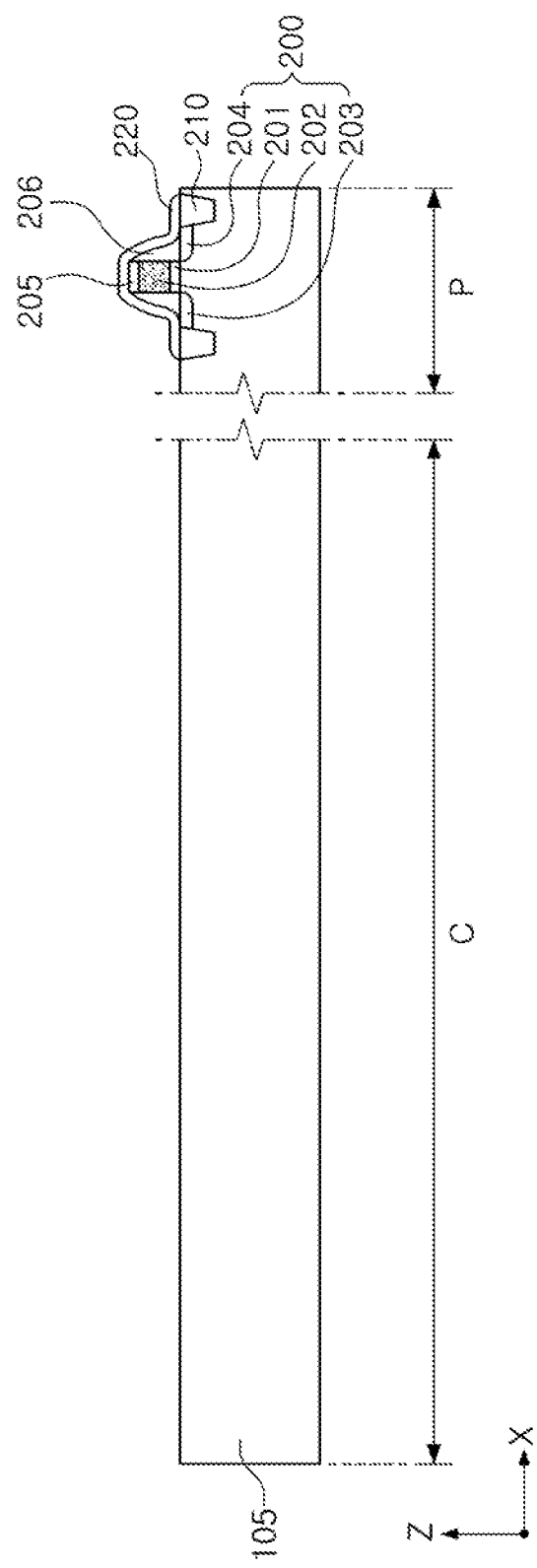
FIGS. 8A to 8J are views illustrating an exemplary method of fabricating the memory device illustrated in FIG. 4.

Referring to FIG. 8A, a memory device 100 according to an exemplary embodiment of the present disclosure may include a cell region C and a peripheral circuit region P. The peripheral circuit region P may include one or more circuit elements, and the one or more circuit elements may include a horizontal transistor 200 formed on a substrate 105 as illustrated in FIG. 8A.

The horizontal transistor 200 may include a horizontal source region 203 and a horizontal drain region 204, formed in an ion-implantation process, and a horizontal gate electrode 202 on the substrate 105. The horizontal gate electrode 202 may be formed of polysilicon, a metal, or a stacked structure of polysilicon and a metal silicide, and a horizontal gate insulating layer 201 may be formed between the horizontal gate electrode 202 and the substrate 105. A capping layer 205 may be formed on an upper surface of the horizontal gate electrode 202, and a gate spacer 206 may be formed on a side surface of the horizontal gate electrode 202. The capping layer 205 and the gate spacer 206 may be formed by depositing a silicon oxide layer, on the horizontal gate electrode using a medium temperature oxide (MTO) process and then performing an etchback process.

A device isolation layer 210 may be disposed outwardly of the horizontal source region 203 and the horizontal drain region 204. The device isolation layer 210 may define an active region of the substrate 105 in which a channel of the horizontal transistor 200 is formed. When the peripheral circuit region P includes a plurality of horizontal transistors 200, a device isolation layer 210 may be formed between a horizontal source region 203 of a horizontal transistor 200 and a horizontal drain region 204 of another horizontal transistor 200 adjacent to the horizontal transistor 200. In addition, an etch stop layer 220 including silicon nitride, for example, may be formed on the horizontal transistor 200 and the device isolation layer 210. In one embodiment, the etch stop layer 220 may have a thickness of 200 to 300 Å on the capping layer 205 disposed on the horizontal gate electrode 202.

Figure 8B:
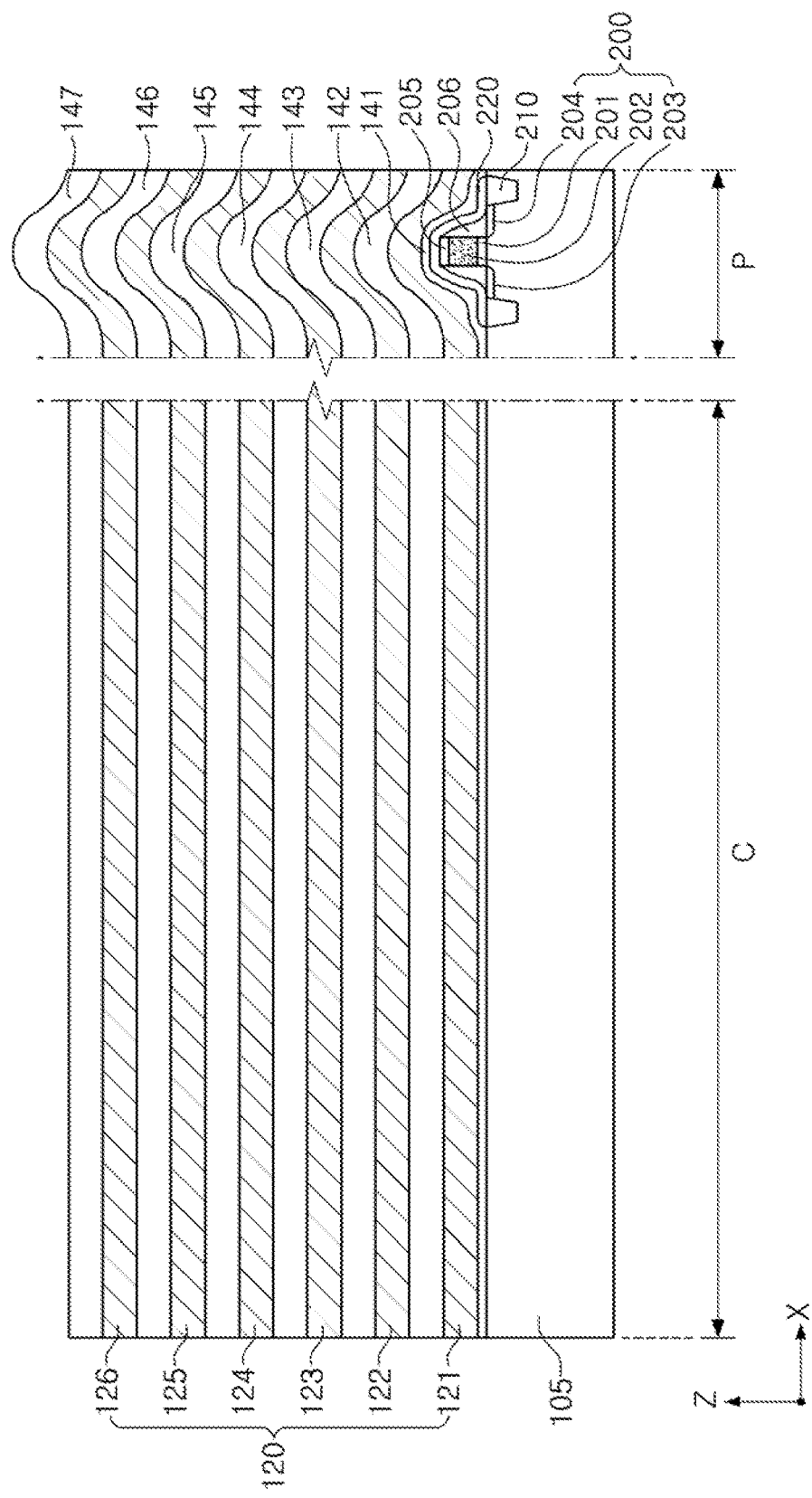

Next, referring to FIG. 8B, a plurality of insulating layers 141-147: 140 and a plurality of sacrificial layers 121 to 126: 120 may be alternately stacked on the substrate 105. The sacrificial layers 120 may be formed of a material having etch selectivity with respect to the insulating layers 140. That is, the sacrificial layers 120 may include a material capable of minimizing the insulating layers 140 being etched during a process of etching the sacrificial layers 120. Such etch selectivity may be quantitatively represented by a ratio of an etching rate of the sacrificial layers 120 to an etching rate of the insulating layers 140. For example, the insulating layers 140 may be at least one of a silicon oxide layer or a silicon nitride layer, and the sacrificial layers 120 may be a material selected from a silicon layer, a silicon oxide layer, a silicon carbide layer, and a silicon nitride layer, however, different from the insulating layers 140. For example, when the insulating layers 140 is a silicon oxide layer, the sacrificial layers 120 may be a silicon nitride layer.

Though FIG. 8B depicts thicknesses of different insulating layers 140 in the z-axis direction being the same, according to various exemplary embodiments in the present disclosure, each thickness of the plurality of insulating layers 140 may be different from each other. For example, the lowermost insulating layer 141 among the plurality of insulating layers 140 in the z-axis direction may have a relatively smaller thickness than other insulating layers 142 to 147, and the uppermost insulating layer 147 may have a relatively greater thickness than other insulating layers 141 to 146. Thus, thicknesses of the insulating layers 140 and the sacrificial layers 120 are not limited to those described in FIG. 8B and may be variously modified. Further, the number of layers configuring the insulating layers 140 and the sacrificial layers 120 may be variously modified.

Figure 8C:
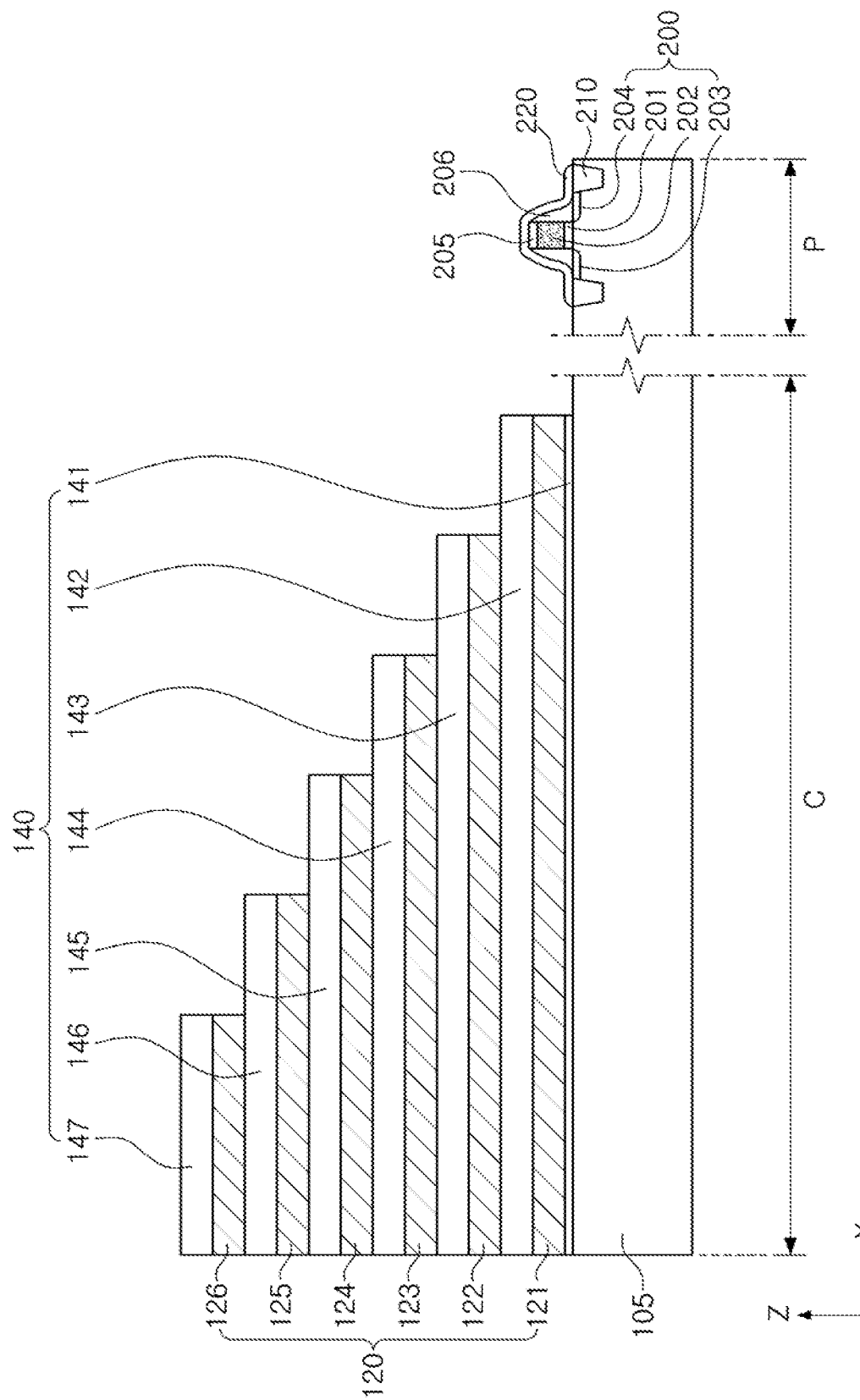

Next, referring to FIG. 8C, the plurality of sacrificial layers 120 and insulating layers 140 alternately stacked on the substrate 105 may be etched to form pad areas having a step structure. In order to form step structure, as illustrated in FIG. 8C, between the sacrificial layers 120 and the insulating layers 140, adjacent to each other in the z-axis direction, a predetermined mask layer may be formed on the plurality of sacrificial layers 120 and insulating layers 140 alternately stacked on the substrate 105, and the sacrificial layers 120 and the insulating layers 140 exposed by the mask layer may be etched. The sacrificial layers 120 and the insulating layers 140 may be sequentially etched by etching the sacrificial layers 120 and the insulating layers 140 exposed by the mask layer while trimming the mask layer, several times. Thus, the plurality of steps as illustrated in FIG. 8C may be formed.

In some exemplary embodiments, each of the insulating layers 140 and each of the sacrificial layers 120 may form a pair, and the pair of insulating layer 140 and sacrificial layer 120 included in a plurality of pairs of insulating layers 140 and sacrificial layers 120 may extend in a single direction (the x-axis direction) at the same length. As one exception, an insulating layer 141 extending at the same length may be further disposed under the lowermost sacrificial layer 121 in the z-axis direction.

Figure 8D:
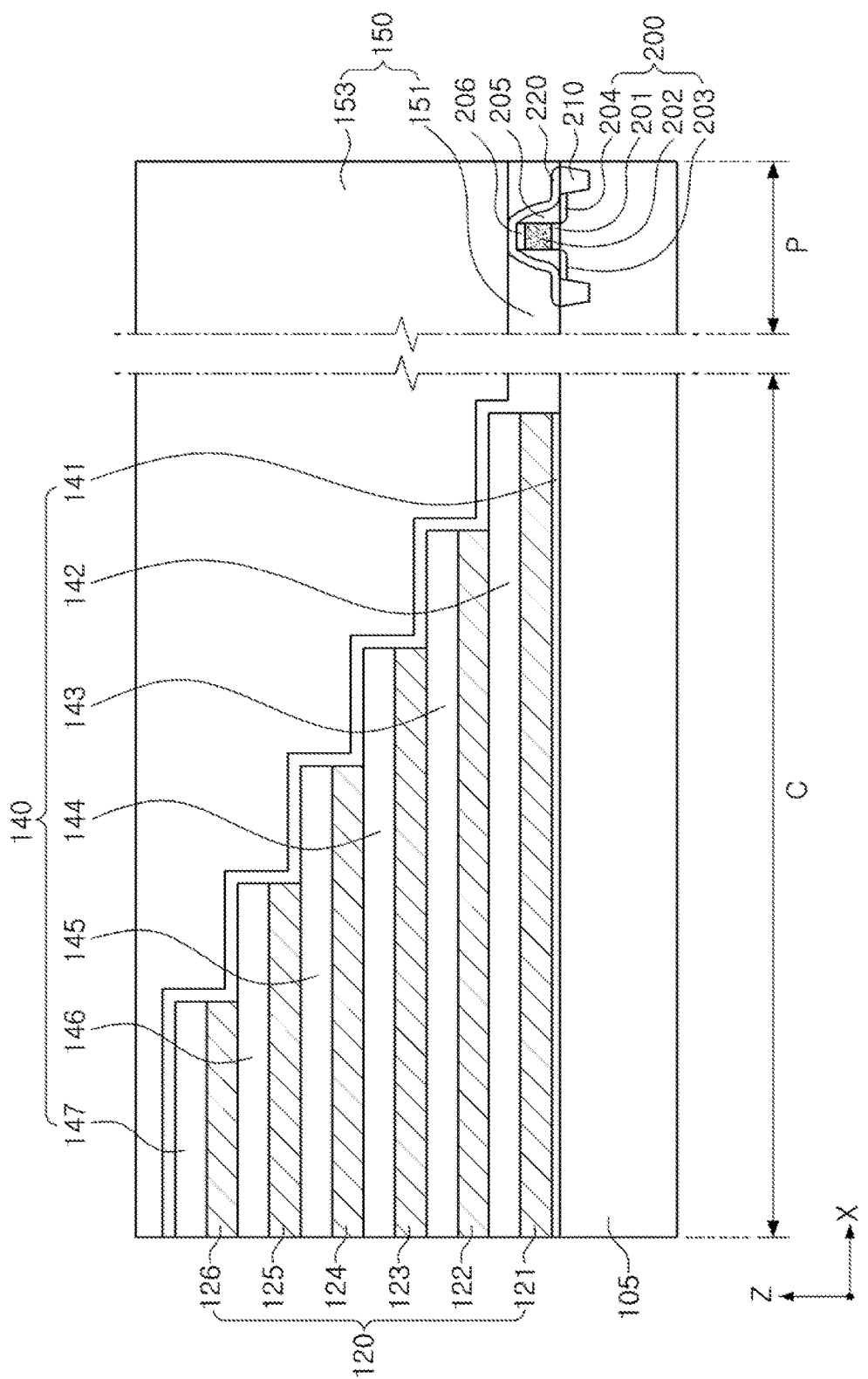

When the step structure is formed, an interlayer insulating layer 150 having a first interlayer insulating layer 151 and a second interlayer insulating layer 153 may be formed as illustrated in FIG. 8D. In one embodiment, a thickness of the first interlayer insulating layer 151 in the z-axis direction may be substantially the same as a height of the horizontal gate electrode 202 of the horizontal transistor 200 in the peripheral circuit region P. A curved surface generated by horizontal gate electrode 202 in the peripheral circuit region P may be eliminated by the first interlayer insulating layer 151. For example, the first interlayer insulating layer 151 may fill a space between the horizontal gate electrode 202 and an upper surface of the substrate 105. For this, the first interlayer insulating layer 151 may include an HDP oxide layer having excellent gap filling properties.

The first interlayer insulating layer 151 may have the thickness substantially the same as the height of the horizontal gate electrode 202 so as to fill the space between the horizontal gate electrode 202 and the upper surface of the substrate 105. On the other hand, the first interlayer insulating layer 151 may have a thickness greater or smaller than the height of the horizontal gate electrode 202. Though a height smaller than a height of the horizontal gate electrode 202 may not eliminate the entire curved surface generated by the horizontal gate electrode 202, it can be made high enough to at least cover the bottom curved portions formed at sides of the etch stop layer 220, to reduce the amount of curved surface exposed.

In addition, the first interlayer insulating layer 151 may cover the horizontal transistor 200 disposed in the peripheral circuit region P, and at least a portion of the plurality of sacrificial layers 120 disposed in the cell region C. In FIG. 8D, the first interlayer insulating layer 151 is illustrated as being disposed up to and on the uppermost insulating layer 147, but is not limited thereto. When the first interlayer insulating layer 151 is disposed on the uppermost insulating layer 147, the first interlayer insulating layer 151 may be disposed adjacently to a channel to be formed later. As shown, in the embodiment of FIG. 8D, the first interlayer insulating layer 151 may be formed as a single, continuous layer, conformally formed on the stair-step portions of the cell region C and extending continuously from the circuit elements on the peripheral region P through part or all of the connection region CT of the cell region C.

The second interlayer insulating layer 153 may be formed on the substrate 105 throughout the cell region C and the peripheral circuit region P. For example, the second interlayer insulating layer 153 may be disposed on the substrate 105 or the plurality of insulating layers 140 and sacrificial layers 120 having steps in the cell region C, and may be disposed on the substrate 105 or the etch stop layer 220 covering the horizontal transistor 200 in the peripheral circuit region P.

Meanwhile, a thickness of the second interlayer insulating layer 153 may be greater than a distance between the uppermost sacrificial layer 126 and the upper surface of the substrate 105 in at least a portion of the cell region C and the peripheral circuit region P. The first interlayer insulating layer 151 may have a thickness capable of filling a space between the horizontal gate electrode 202 and the upper surface of the substrate 105. Accordingly, the first interlayer insulating layer 151 may have a relatively smaller thickness than the second interlayer insulating layer 153. Accordingly, the thickness of the second interlayer insulating layer 153 shown as the distance from the upper surface of the first interlayer insulating layer 151 to the upper surface of the second interlayer insulating layer 153, may be greater than the distance between the uppermost sacrificial layer 126 and the upper surface of the substrate 105 in at least a portion of the cell region C and the peripheral circuit region P.

Due to characteristics of the second interlayer insulating layer 153 having a relatively larger volume than the first interlayer insulating layer 151, a TEOS oxide layer may be used to efficiently form the second interlayer insulating layer 153. By forming the second interlayer insulating layer 153 with the TEOS oxide layer having a high deposition rate, the process time may be shortened and the overall process efficiency may be improved in the process of forming the second interlayer insulating layer 153. In order to form the second interlayer insulating layer 153 with the TEOS oxide layer having a high deposition rate but poor gap-filling properties, the first interlayer insulating layer 151 including the HDP oxide layer may be formed before the second interlayer insulating layer 153 is formed.

Figure 8E:
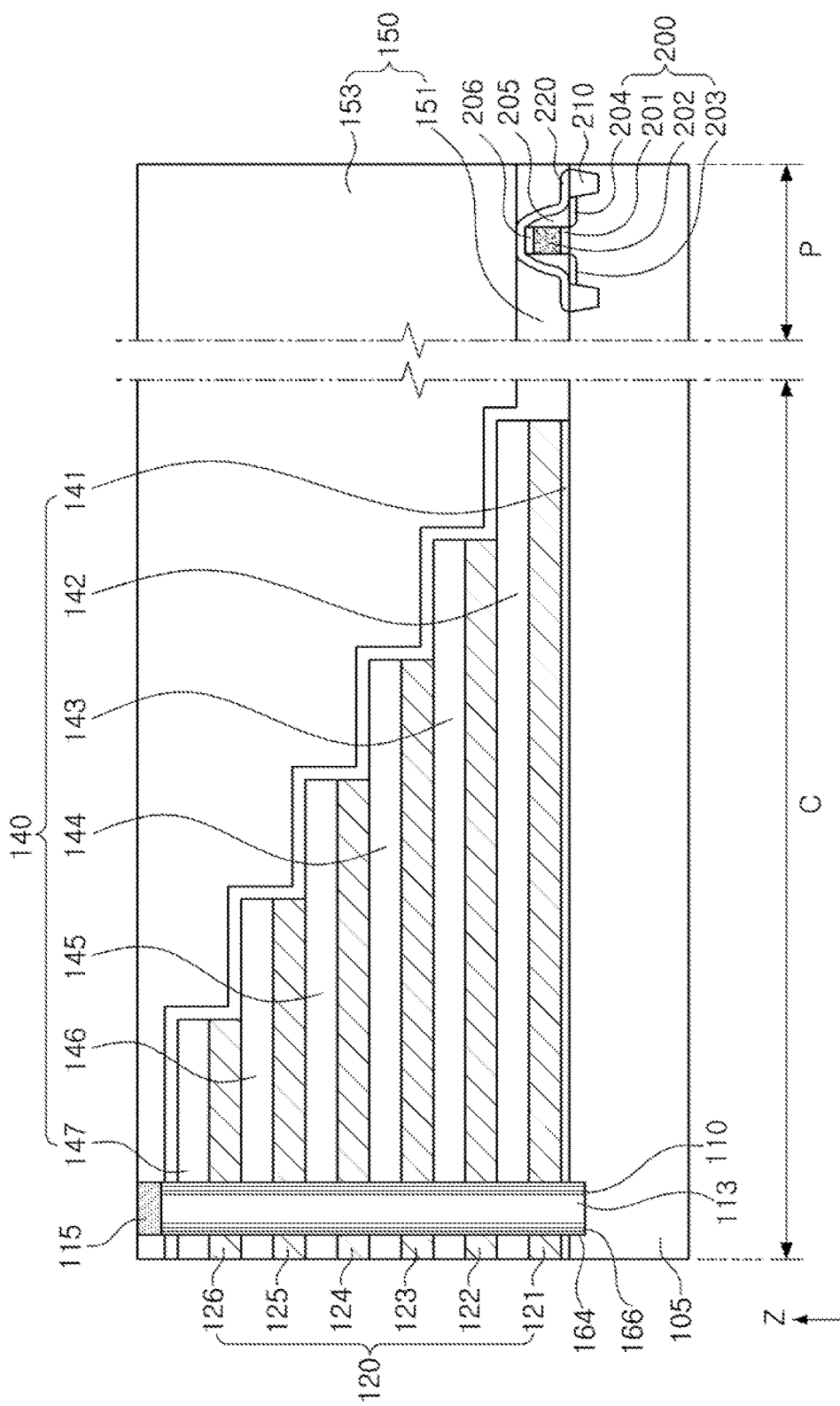

When the interlayer insulating layers 150 is formed, a channel 110 may be formed as illustrated in FIG. 8E. In order to form the channel 110, an opening passing through the plurality of insulating layers 140 and sacrificial layers 120 in the z-axis direction. A plurality of openings may be formed depending on the number of the channel 110, and the plurality of openings may be disposed in a zigzag form on an x-y plane perpendicular to the z-axis to be spaced apart from each other. The plurality of openings may be formed by exposing an area on which the plurality of openings are formed by a mask layer and anisotropically etching the exposed area, similar to a method of forming the step structure described with reference to FIG. 8C. Each of the plurality of openings may expose the upper surface of the substrate 105 or recess the substrate 105 at a predetermined depth.

A charge storage layer 164 and a tunneling layer 166 may be formed on an inner wall and a bottom surface of the plurality of openings by an atomic layer deposition (ALD) or chemical vapor deposition (CVD) method. The charge storage layer 164 and the tunneling layer 166 may be sequentially stacked from an area adjacent to the plurality of sacrificial layers 120 and insulating layers 140, and the channel 110 may be formed an inner surface of the tunneling layer 166. The channel 110 may have a predetermined thickness, for example, ⅟₅₀ to ⅕ of each of the plurality of openings. The channel 110 may be formed by an ALD or CVD method, similar to the charge storage layer 164 and the tunneling layer 166. Meanwhile, the channel 110 may be in contact with the substrate 105 and electrically connected to the substrate 105 on the bottom surface of each opening.

The inside of the channel 110 may be filled with an embedded insulating layer 113. Selectively, before the embedded insulating layer 113 is formed, a hydrogen annealing process in which the structure including the channel 110 formed thereon is heat-treated in a hydrogen- or deuterium-containing gas atmosphere, may be additionally performed. Through the hydrogen annealing process, many of crystal defects existing in the channel 110 may be cured.

The above-described structure is according to the exemplary embodiment illustrated in FIG. 4, but the channel 110 can be formed in different structures. For example, just after the plurality of openings for forming channel 110 is formed, the channel 110 may be formed without forming the charge storage layer 164 and the tunneling layer 166, and then the embedded insulating layer 113 may be formed on an inner surface of the channel 110. Here, the tunneling layer 166 and the charge storage layer 164, like the blocking layer 162, may be formed before the gate electrode layers 130 are formed, and disposed on an outer surface of the blocking layer 162 to surround the gate electrode layers 130.

Next, a planarization process may be performed to remove unnecessary semiconductor materials and insulating materials covering the uppermost interlayer insulating layer 150. Next, an upper portion of the embedded insulating layer 113 may be partially removed using an etching process, and then a material for forming a conductive layer 115 may be deposited on the removed portion. Next, a planarization process may be further performed to form the conductive layer 115. As described above, since the first interlayer insulating layer 151 is disposed even on the insulating layer 147 in this exemplary embodiment, the first interlayer insulating layer 151 may be contiguous from the peripheral region P to the channel 110.

Figure 8F:
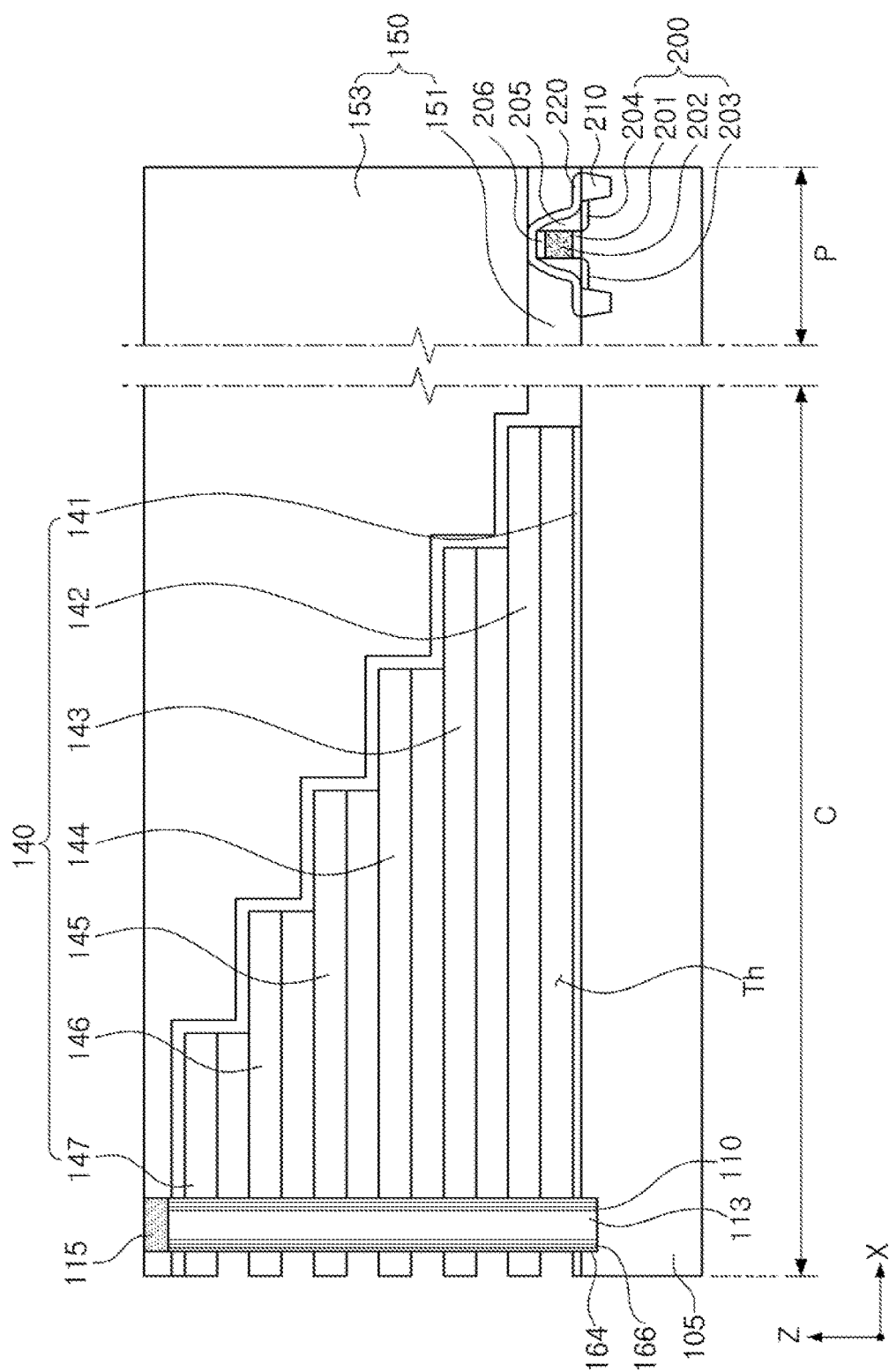

When the channel 110 is formed, a horizontal opening Th may be formed as illustrated in FIG. 8F by removing the plurality of sacrificial layers 120. According as the plurality of sacrificial layers 120 are removed, a plurality of horizontal openings Th may be formed between the plurality of insulating layers 140. A plurality of gate electrode layers 130 may be formed by depositing a conductive material in the plurality of horizontal openings Th.

Figure 8G:
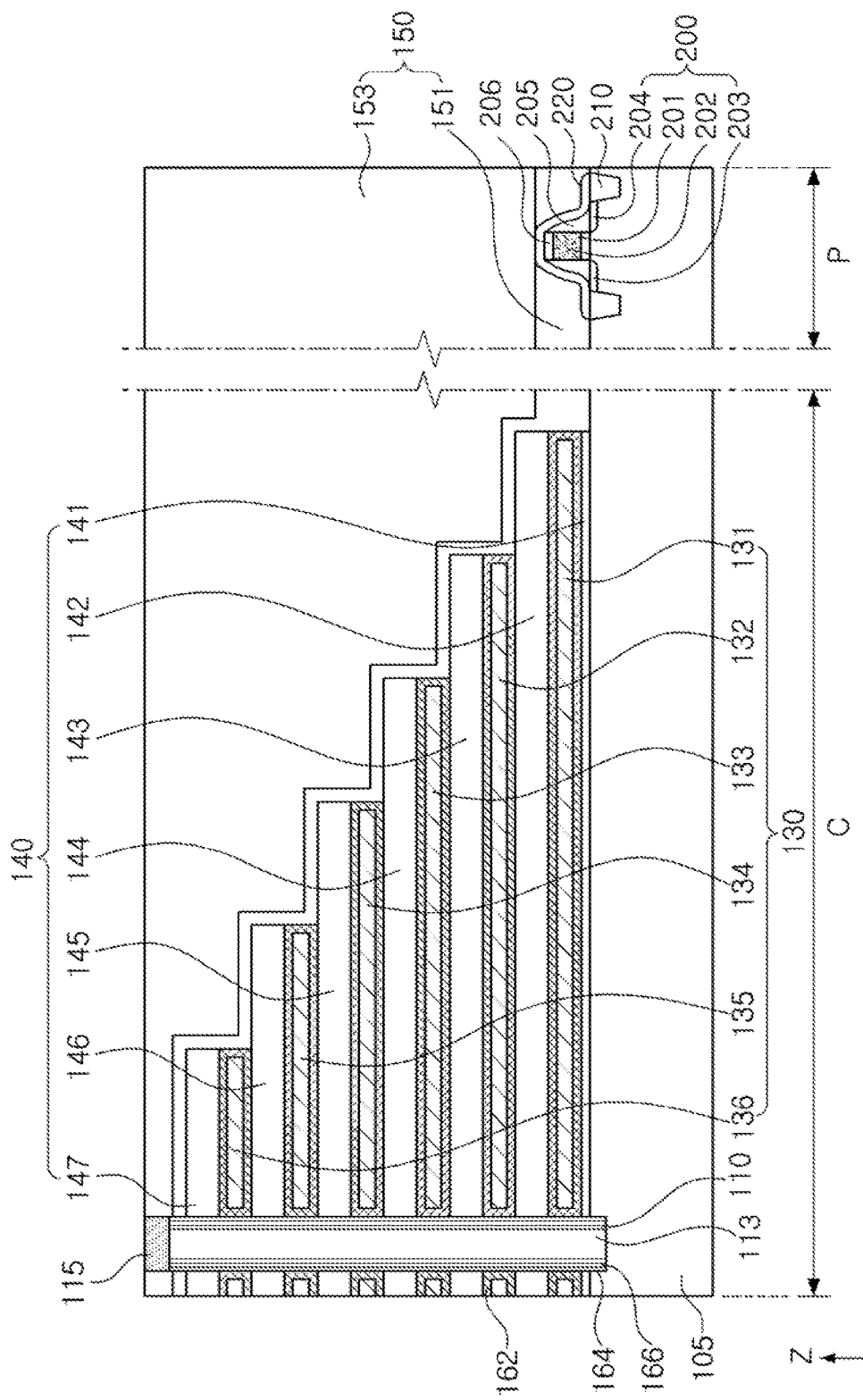

Referring to FIG. 8G, the blocking layer 162 and the gate electrode layers 131 to 136: 130 may be formed in the horizontal openings Th. When the blocking layer 162 and the gate electrode layers 130 are sequentially formed in the horizontal openings Th, the blocking layer 162, like the charge storage layer 164 and the tunneling layer 166, may be formed by an ALD, CVD, or physical vapor deposition (PVD) process. Since the blocking layer 162 is formed before the gate electrode layers 130 is formed, the blocking layer 162 may have the form of surrounding the gate electrode layers 130, as illustrated in FIG. 8I. The gate electrode layers 130 may be formed of a conductive material such as tungsten (W).

Since the first interlayer insulating layer 151 is disposed to cover the uppermost sacrificial layer 126 as illustrated in FIG. 8D, the first interlayer insulating layer 151 may cover the uppermost gate electrode layer 136 as illustrated in FIG. 8G. However, the structure of the first interlayer insulating layer 151 is not limited thereto, and the first interlayer insulating layer 151 may be formed to cover a portion of the plurality of gate electrode layers 130.

Figure 8H:
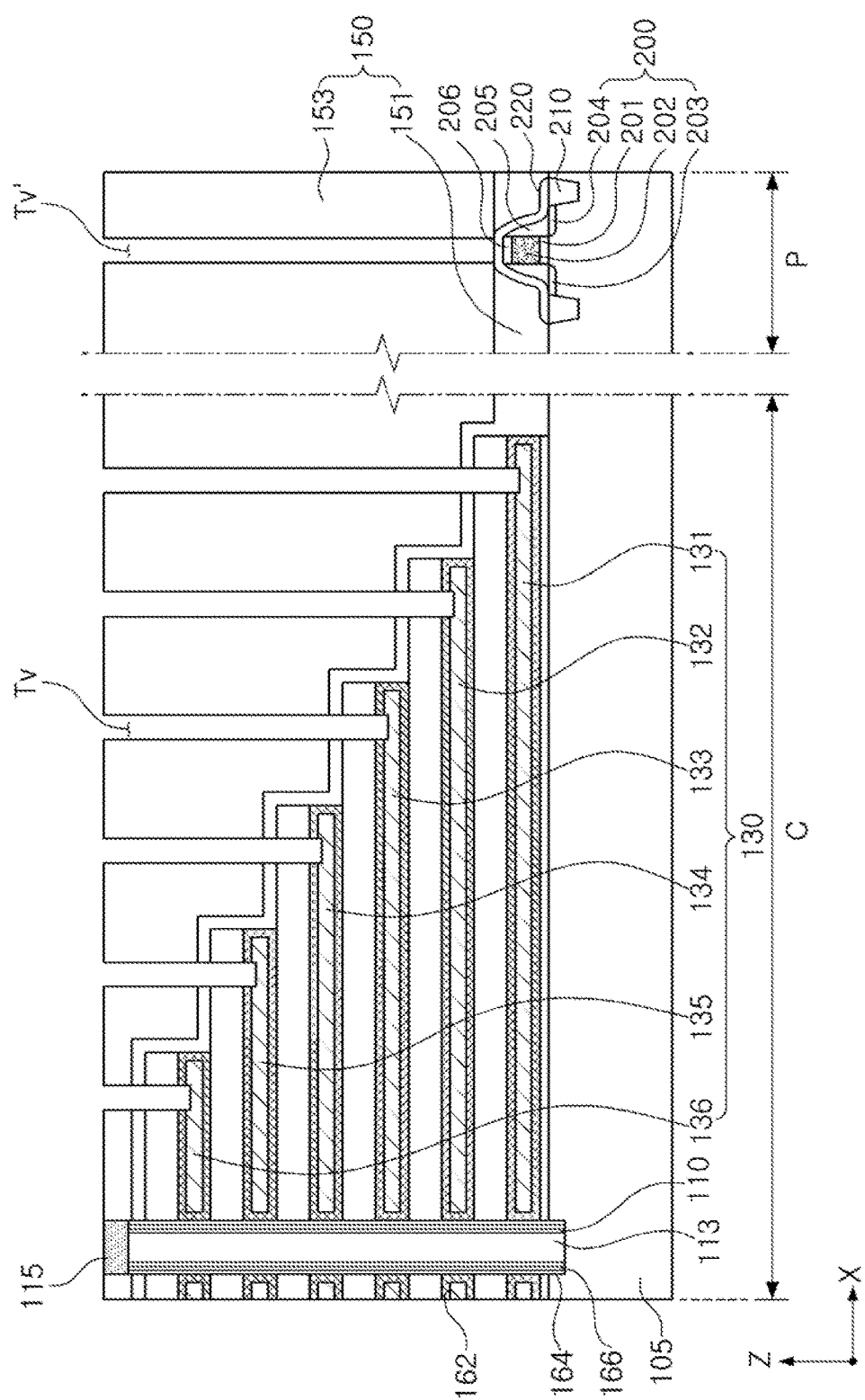
Figure 8I:
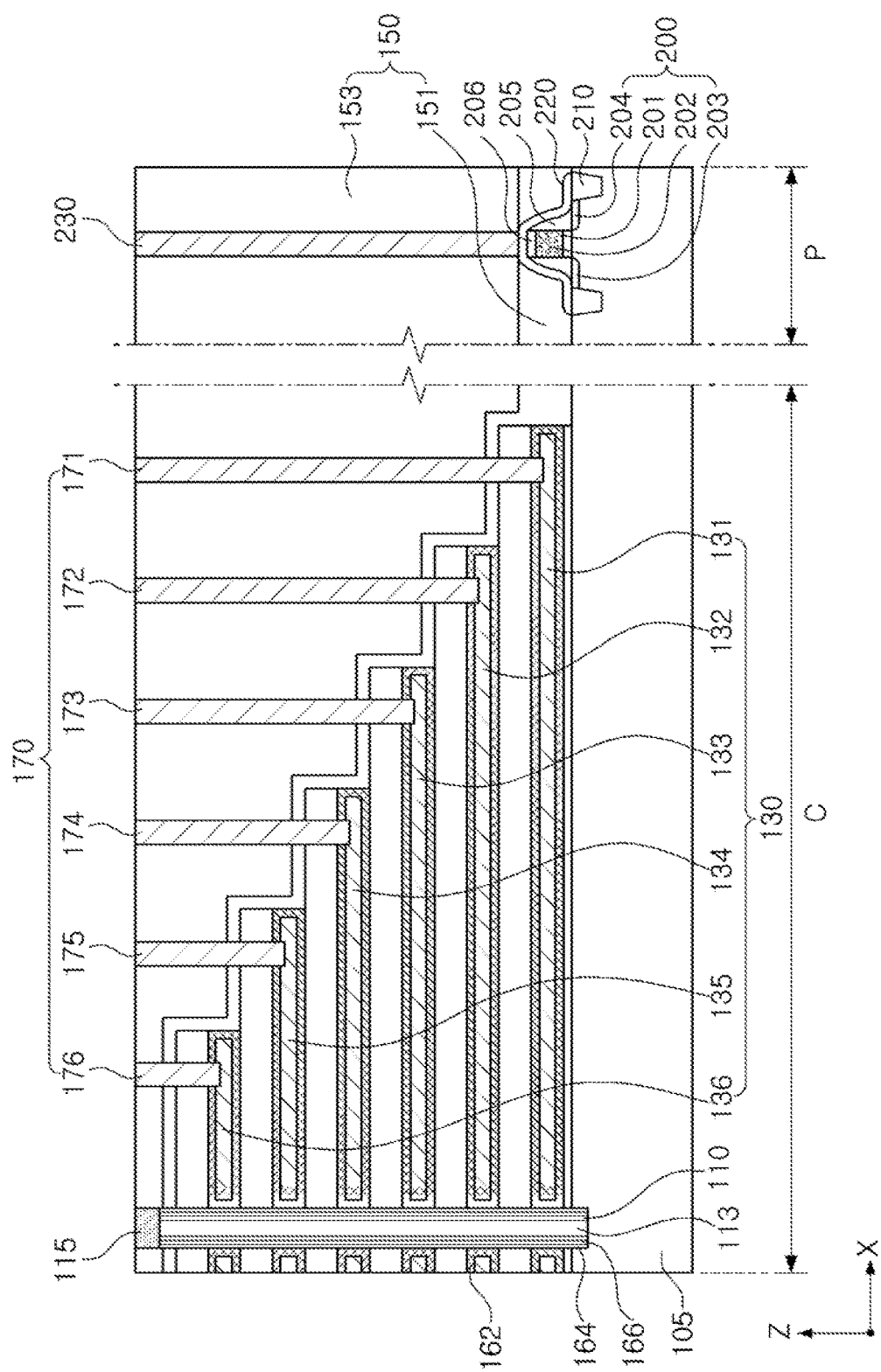
Figure 8J:
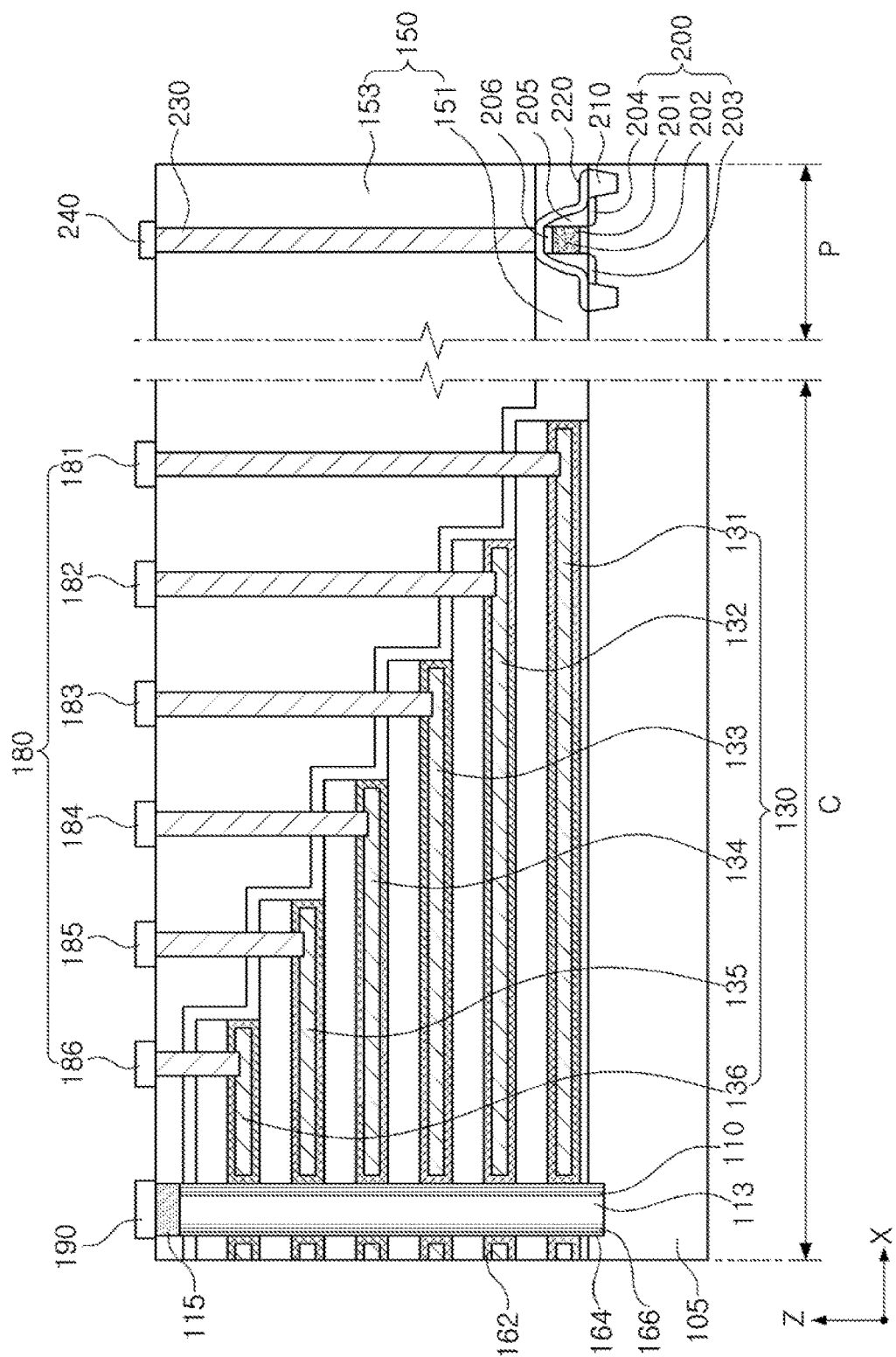

When the blocking layer 162 and the gate electrode layers 130 is formed, a plurality of vertical openings Tv and Tv' for forming contact plugs 170 may be formed by performing an etching process in the z-axis direction parallel to the channel 110 as illustrated in FIG. 8H. The etching process of forming the plurality of vertical openings Tv and Tv' may include forming a mask layer in which areas corresponding to the vertical openings Tv and Tv' are open, and selectively etching the second interlayer insulating layer 153 and the plurality of insulating layers 140 with respect to the plurality of gate electrode layers 130. By selectively etching a material included in the second interlayer insulating layer 153 and the plurality of insulating layers 140 with respect to a material included in the plurality of gate electrode layers 130, the vertical openings Tv and Tv' respectively extending to the gate electrode layers 130 and the horizontal gate electrode 202 may be formed. In some exemplary embodiments, due to a high aspect ratio, the vertical openings Tv and Tv' may have a tapered structure (an inclined side) such that widths thereof decrease toward the substrate 105.

After the mask layer for forming the plurality of vertical openings Tv and Tv' is removed, contact plugs 171 to 176: 170 and 230 may be formed by filling the plurality of vertical openings Tv and Tv' with a conductive material, as illustrated in FIG. 8I. The contact plugs 170 and 230 may include the conductive material, for example, W, like the gate electrode layers 130, and thus may be referred to as conductive vias. Each of the contact plugs 170 disposed in the cell region C may pass through the insulating layers 140 located on an upper part in the step structure to be electrically connected to the gate electrode layers 130. The vertical opening Tv for forming each contact plugs 170 so as to be electrically connected to the gate electrode layers 130, may extend to have a depth capable of passing through the blocking layer 162 surrounding the gate electrode layers 130. Meanwhile, a peripheral contact plug 230 connected to the horizontal gate electrode 202 in the peripheral circuit region P, may be formed to be directly connected to the horizontal gate electrode 202 or to be staggered with respect to the horizontal gate electrode 202 in the y-axis direction. Next, referring to FIG. 8J, a plurality of interconnection lines 181 to 186: 180 may be formed on the plurality of contact plugs 170 disposed in the cell region C. A bit line 190 may be formed on the conductive layer 115 formed on the channel 110. The plurality of interconnection lines 180 may be formed in a direction parallel to the bit line 190 or in a direction intersecting a direction in which the plurality of gate electrode layers 130 extend. The plurality of interconnection lines 180 may electrically connect at least some of the gate electrode layers 130 formed at the same height in the z-axis direction to each other. Meanwhile, a conductive pad 240 may be formed on the peripheral contact plug 230.

FIGS. 9A to 9K show a method of fabricating the memory device 300 illustrated in FIG. 5. FIGS. 9A to 9K are cross-sectional views taken from the y-axis direction of the perspective view of FIG. 5 according to a process sequence.

Figure 9A:
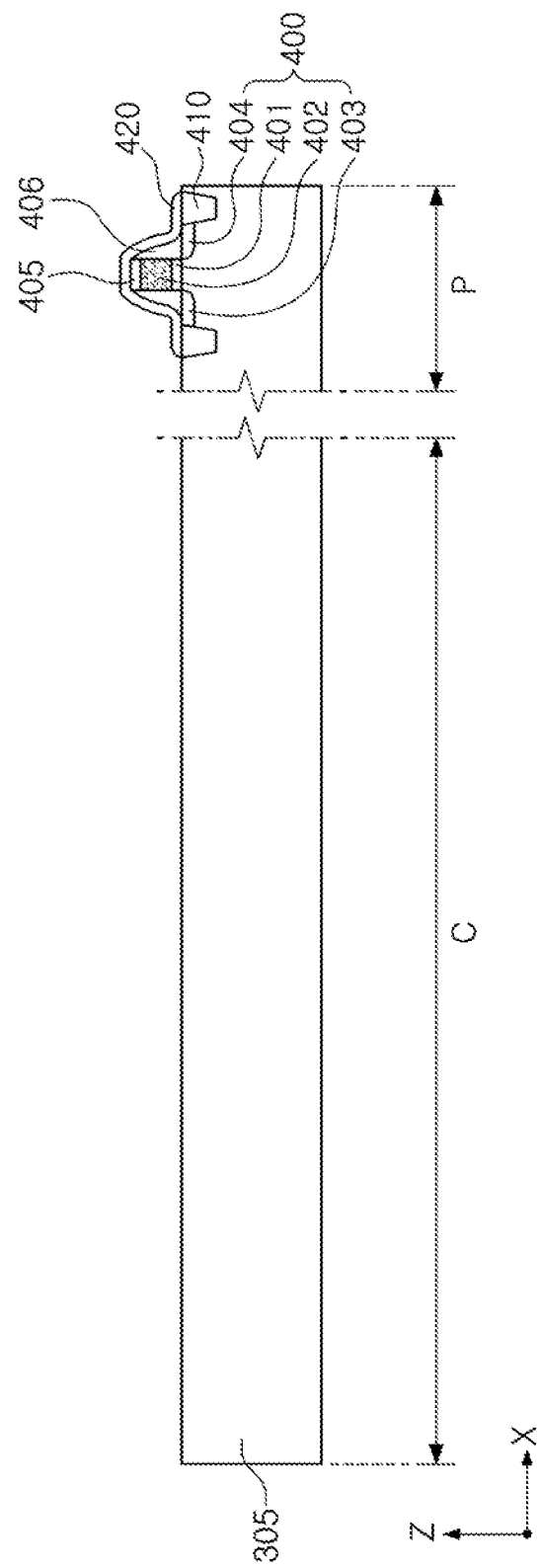

Referring to FIG. 9A, similar to FIG. 8A, a horizontal transistor 400 may be formed on a substrate 305. The horizontal transistor 400 may be formed in a peripheral circuit region P. The horizontal transistor 400 may include a horizontal source region 403, a horizontal drain region 404, and a horizontal gate electrode 402, and a gate oxide layer 401 may be formed between the horizontal gate electrode 402 and the substrate 305. Device isolation layers 410 may be formed at the outside of the horizontal source region 403 and the horizontal drain region 404, and an etch stop layer 420 may be formed on the device isolation layer 410 and the horizontal transistor 400.

In FIG. 9A, a capping layer 405 and a gate spacer 406 may be disposed respectively on an upper surface and a side surface of the horizontal gate electrode 402. The capping layer 405 and the gate spacer 406 may be formed, similar the exemplary embodiment of FIG. 8A, by depositing a silicon oxide layer using an MTO method and etching it in an etchback process. Here, in the memory device 300 described with reference to FIGS. 9A to 9K, the capping layer 405 and the gate spacer 406 may be selectively omitted.

Figure 9B:
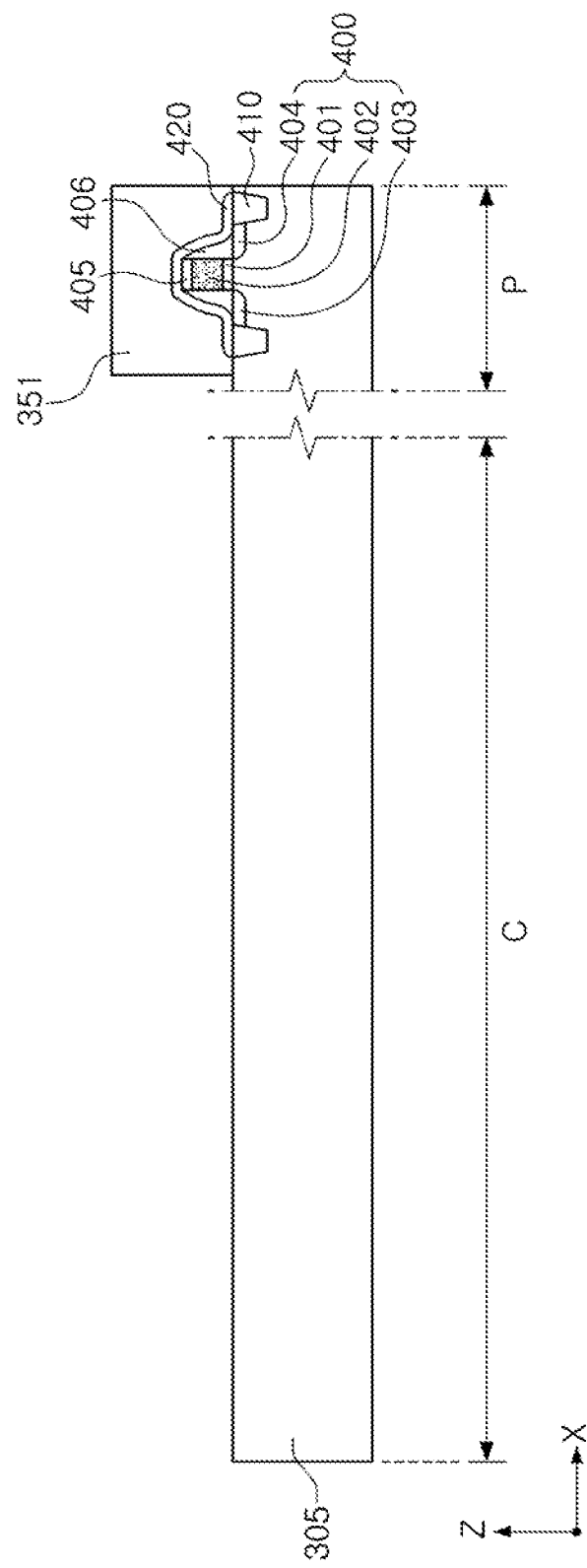

Next, referring to FIG. 9B, a first interlayer insulating layer 351 may be formed on the horizontal transistor 400. Different from the memory device 100 illustrated in FIG. 4, the first interlayer insulating layer 351 of the memory device 300 illustrated in FIG. 5 may include the insulating layer formed on the horizontal transistor 400 in the peripheral circuit region P. The first interlayer insulating layer 351 may only be formed in the peripheral circuit region P, as illustrated in FIG. 9B. Thus, in a subsequent process in which the gate electrode layers 330 and the insulating layers 340 are etched, the horizontal transistor 400 may be protected by the first interlayer insulating layer 351.

The first interlayer insulating layer 351 may be formed on the horizontal transistor 400 to remove steps generated between upper surfaces of the horizontal transistor 400 and the substrate 305. In particular, when a plurality of horizontal transistors 400 are disposed in the peripheral circuit region P, the first interlayer insulating layer 351 may fill spaces between the plurality of horizontal gate electrodes 402. The first interlayer insulating layer 351 may have a first surface substantially parallel to the upper surface of the substrate 305, and a second surface connecting the first surface to the upper surface of the substrate 305. In order to form the first surface substantially parallel to the upper surface of the substrate 305, the first interlayer insulating layer 351 may include an HDP oxide layer having excellent gap filling properties.

After the first interlayer insulating layer 351 is formed, as shown in FIG. 9C, a plurality of gate electrode layers 331 to 336: 330 and a plurality of insulating layers 341 to 347: 340 may be formed on the upper surface of the substrate 305 and the first surface of the first interlayer insulating layer 351. The plurality of gate electrode layers 330 and insulating layers 340 may fully cover the first surface and the second surface of the first interlayer insulating layer 351, and have a step structure between the cell region C and the peripheral circuit region P.

Different form the method of fabricating the memory device 100 described with reference to FIGS. 8A to 8J, the plurality of gate electrode layers 330 according to the exemplary embodiment of the present disclosure may be directly stacked between the plurality of insulating layers 340. The plurality of gate electrode layers 330 may include a material having superior electric conductivity, such as polysilicon.

Figure 9D:
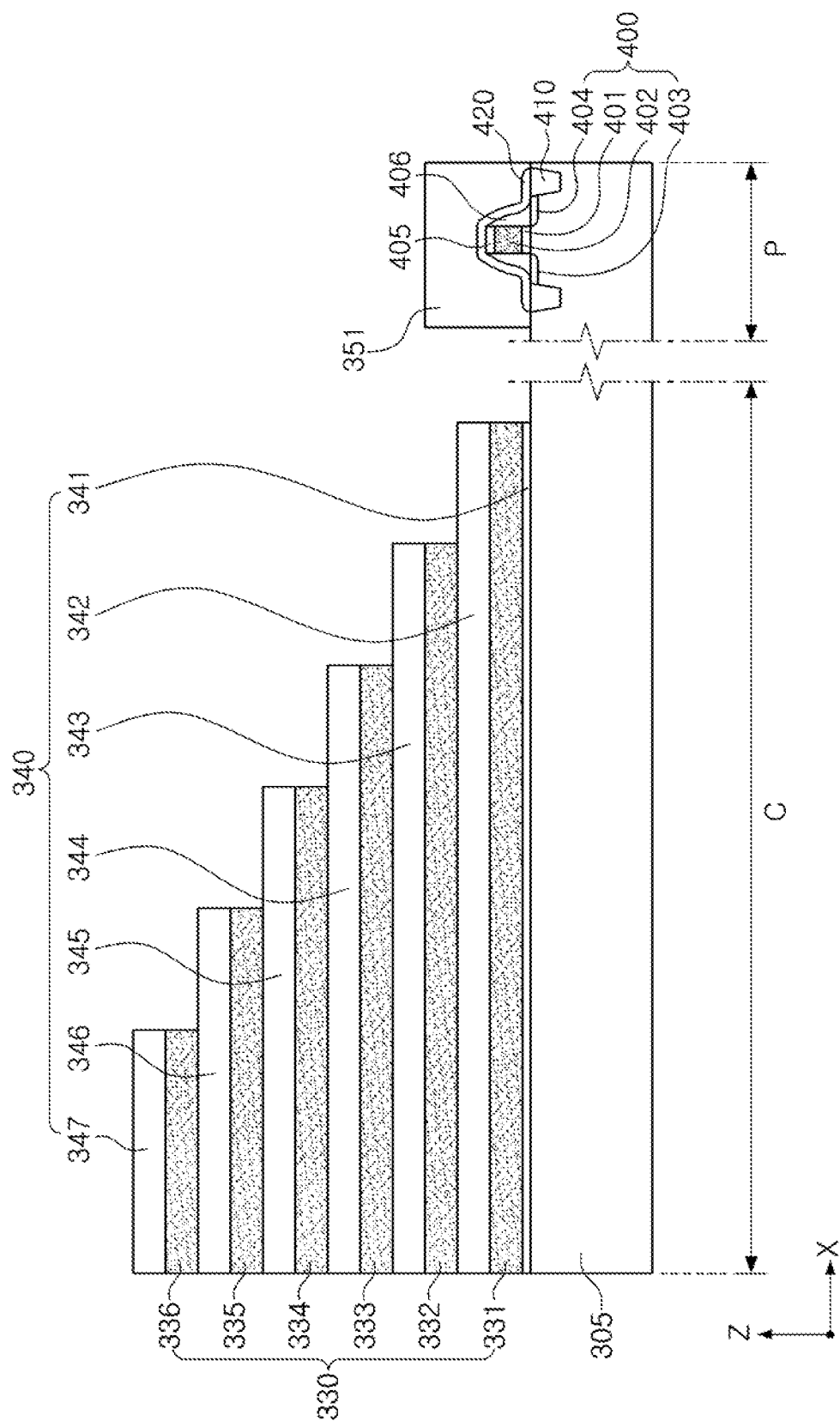

Next, referring to FIG. 9D, a mask layer may be formed on the plurality of gate electrode layers 330 and insulating layers 340, and pad areas having a step structure may be formed by etching exposed areas by the mask layer. In one embodiment, in order to form steps between the gate electrode layers 330 and the insulating layers 340 adjacent to each other in the z-axis direction, a predetermined mask layer is formed on the plurality of gate electrode layers 330 and insulating layers 340, alternately stacked on the substrate 305, and the gate electrode layers 330 and insulating layers 340 exposed by the mask layer may be etched. In order to form the plurality of step structures illustrated in FIG. 9D, the gate electrode layers 330 and the insulating layers 340 may be sequentially etched by etching the gate electrode layers 330 and the insulating layers 340 exposed by the mask layer while trimming the mask layer, several times.

In some exemplary embodiments, each insulating layer 340 and each gate electrode layer 330 may form a pair, and the insulating layers 340 and the gate electrode layers 330 included in the plurality of pairs may extend at the same length in a single direction (the x-axis direction). As one exception, an insulating layer 341 extending at substantially the same length may be further disposed under the lowermost gate electrode layer 331 in the z-axis direction.

Figure 9E:
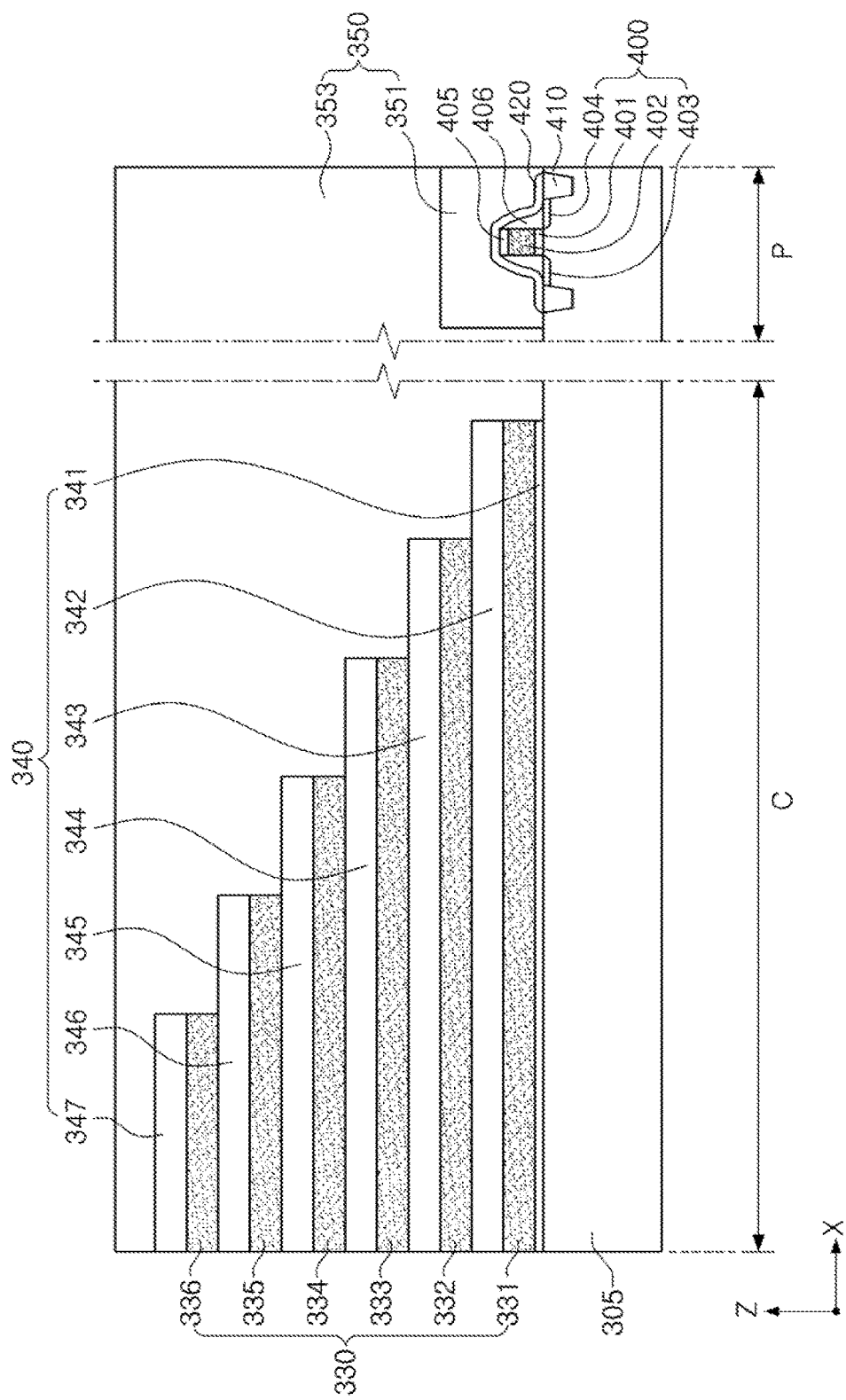

When the step structure is formed, a second interlayer insulating layer 353 may be formed as illustrated in FIG. 9E. Different from the first interlayer insulating layer 351 formed on the horizontal transistor 400 in the peripheral circuit region P, the second interlayer insulating layer 353 may be formed on the substrate 105 throughout the cell region C and the peripheral circuit region P. For example, the second interlayer insulating layer 353 may be disposed on the substrate 305 or the plurality of gate electrode layers 330 and insulating layers 340 having the step structure in the cell region C, and may cover the upper surface of the substrate 305 and the first interlayer insulating layer 351.

The second interlayer insulating layer 353 may be disposed throughout the cell region C and the peripheral circuit region P, and a thickness of the second interlayer insulating layer 353 may be greater than a distance between the upper surface of the substrate 305 and the uppermost gate electrode layer 336 in at least a portion of the cell region C and the peripheral circuit region P. In particular, the thickness of the second interlayer insulating layer 353 may be greater than the distance between the upper surface of the substrate 305 and the uppermost gate electrode layer 336 in a portion disposed between the second surface of the first interlayer insulating layer 351 and the plurality of gate electrode layers 330.

Due to structural characteristics of the second interlayer insulating layer 353 having a relatively larger volume than the first interlayer insulating layer 351, a TEOS oxide layer may be used to efficiently form the second interlayer insulating layer 353. By forming the second interlayer insulating layer 353 with the TEOS oxide layer having a high deposition rate, the process time may be shortened and the overall process efficiency may be improved in the process of forming the second interlayer insulating layer 353. In other exemplary embodiments, the second interlayer insulating layer 353 may include an HDP oxide layer and a TEOS oxide layer. The HDP oxide layer may occupy the second interlayer insulating layer with a smaller volume than the TEOS oxide layer.

Figure 9F:
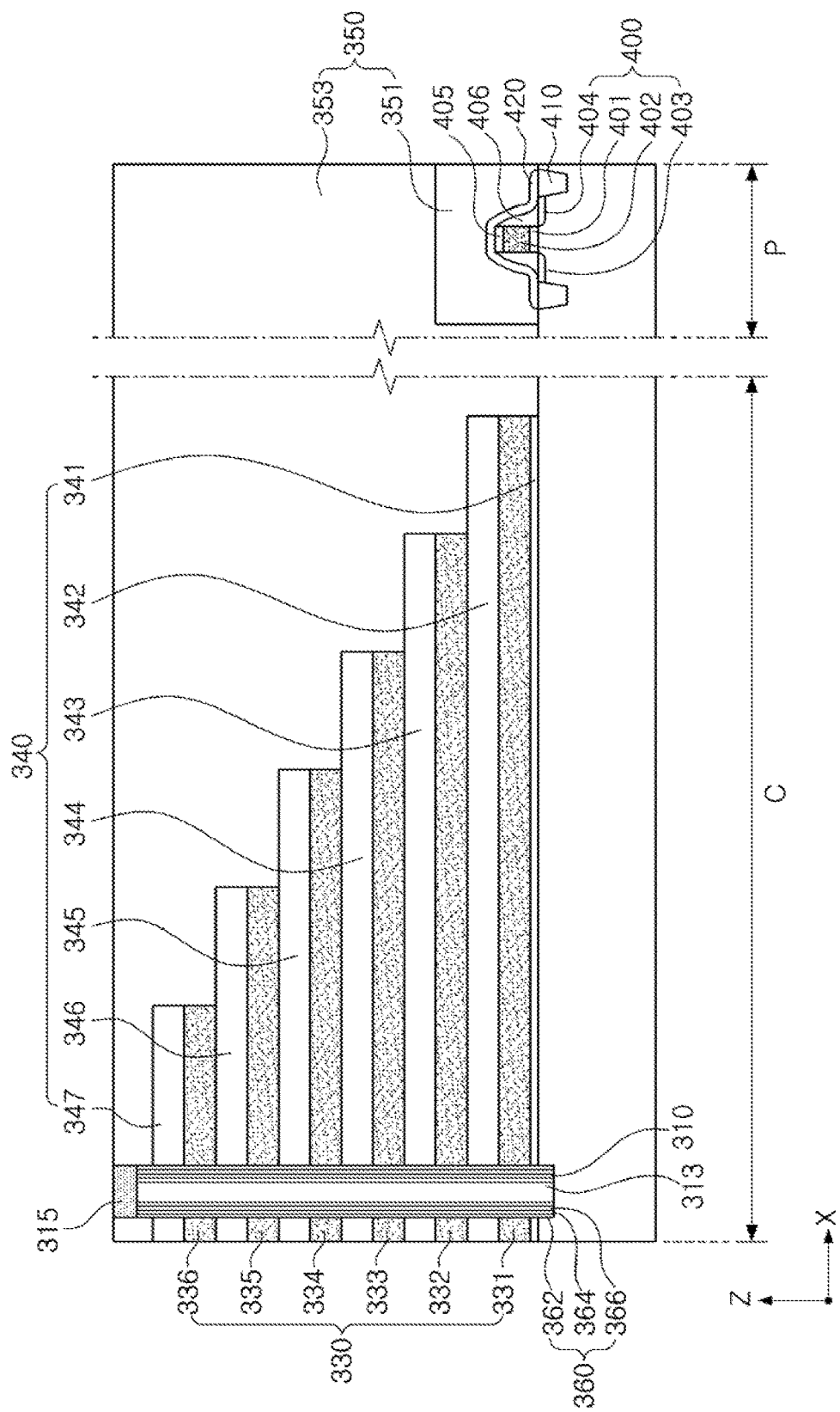

When the second interlayer insulating layer 353 is formed, channel 310 may be formed as illustrated in FIG. 9F. In order to form the channel 310, an openings passing through the plurality of insulating layers 340 and the gate electrode layers 330 in the z-axis direction may be formed, and the number of openings may correspond to the number of the channels 310. The plurality of openings may be disposed in a zigzag form on an x-y plane perpendicular to the z-axis to be spaced apart from each other. The channel 310 may be in contact with the upper surface of the substrate 305 or recess the substrate 105 at a predetermined depth in the z-axis direction.

A blocking layer 362, a charge storage layer 364, and a tunneling layer 366 may be formed in an inside surface and a bottom surface of each of the openings for forming channel 310 using an ALD or CVD process. The blocking layer 362, the charge storage layer 364, and the tunneling layer 366 may be sequentially stacked from an area adjacent to the plurality of gate electrode layers 330 and insulating layers 340, and the channel 310 may be formed an inner surface of the tunneling layer 366. The channel 310 may have a predetermined thickness, for example, 1/50 to 1/5 of each of the plurality of openings. The channel 310 may be formed by an ALD or CVD method, similar to the blocking layer 362, the charge storage layer 364, and the tunneling layer 366.

Meanwhile, the channel 310 may be in contact with the substrate 305 and electrically connected to the substrate 305 on the bottom surface of each opening.

The inside of the channel 310 may be filled with a embedded insulating layer 313. Selectively, before the embedded insulating layer 313 is formed, a hydrogen annealing process in which the structure including the channel 310 formed thereon is heat-treated in a hydrogen- or deuterium-containing gas atmosphere, may be additionally performed. Through the hydrogen annealing process, many of crystal defects existing in the channel 310 may be cured.

Next, a planarization process may be performed to remove unnecessary semiconductor materials and insulating materials covering the second interlayer insulating layer 353. Next, an upper portion of the embedded insulating layer 313 may be partially removed using an etching process, etc., and then a material for forming a conductive layer 315 may be deposited on the removed portion. Next, a planarization process may be further performed to form the conductive layer 315.

Figure 9G:
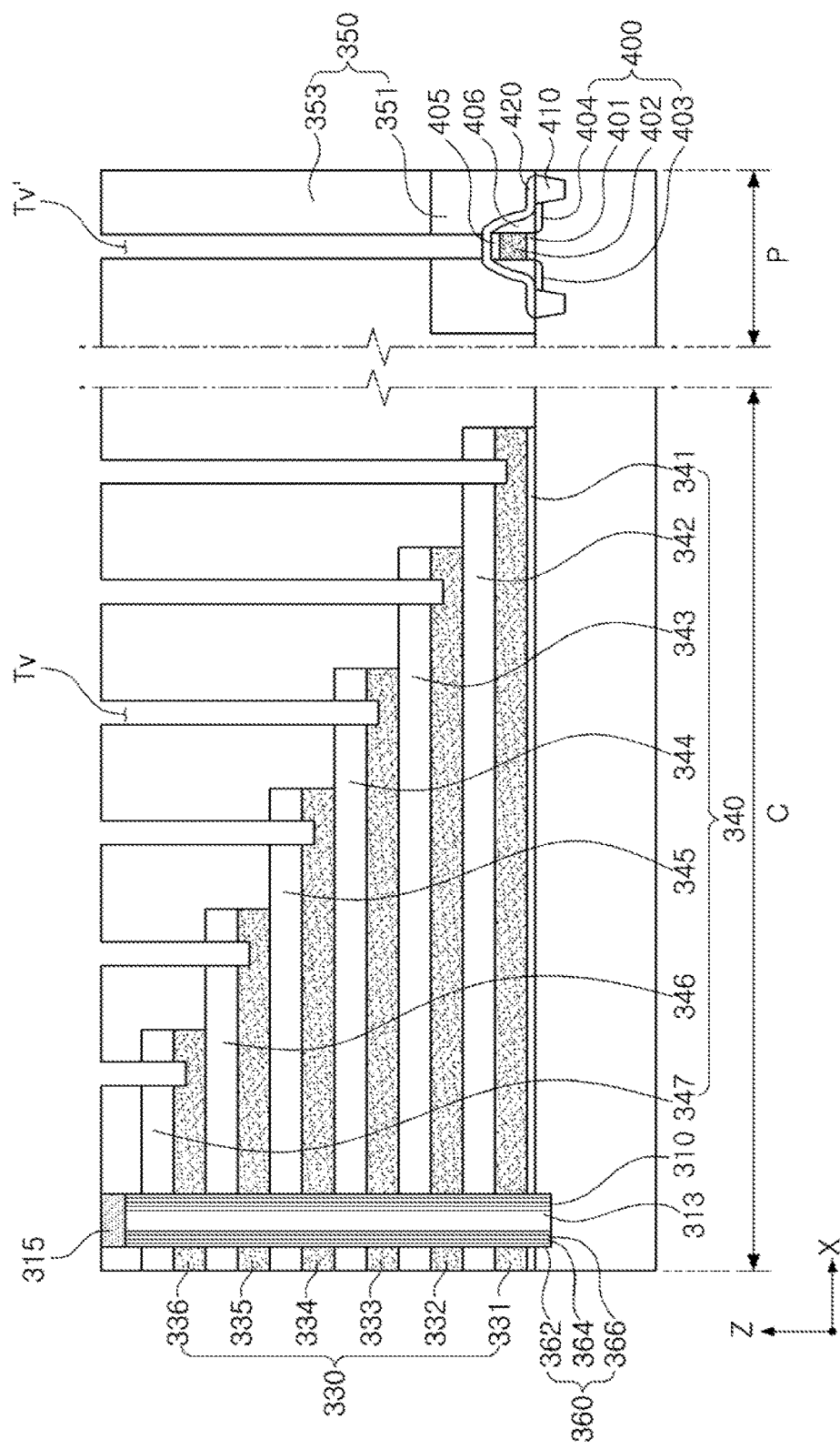

When the channel 310 is formed, as shown in FIG. 9g, a plurality of vertical openings Tv and Tv' for forming contact plugs 370 may be formed by performing an etching process in the z-axis direction parallel to the channel 310. The etching process of forming the plurality of vertical openings Tv and Tv' may include forming a mask layer in which areas corresponding to the vertical openings Tv and Tv' are open, and selectively etching the first and second interlayer insulating layer 351 and 353 and the plurality of insulating layers 340 with respect to the plurality of gate electrode layers 330. By selectively etching a material included in the first and second interlayer insulating layer 351 and 353 and the plurality of insulating layers 340 with respect to a material included in the plurality of gate electrode layers 330, the vertical opening Tv extending to each of the gate electrode layers 330 in the cell region C as illustrated in FIG. 7H. Meanwhile, due to a high aspect ratio, the vertical openings Tv and Tv' may have a tapered structure (an inclined side) such that widths thereof decrease toward the substrate 305.

Figure 9H:
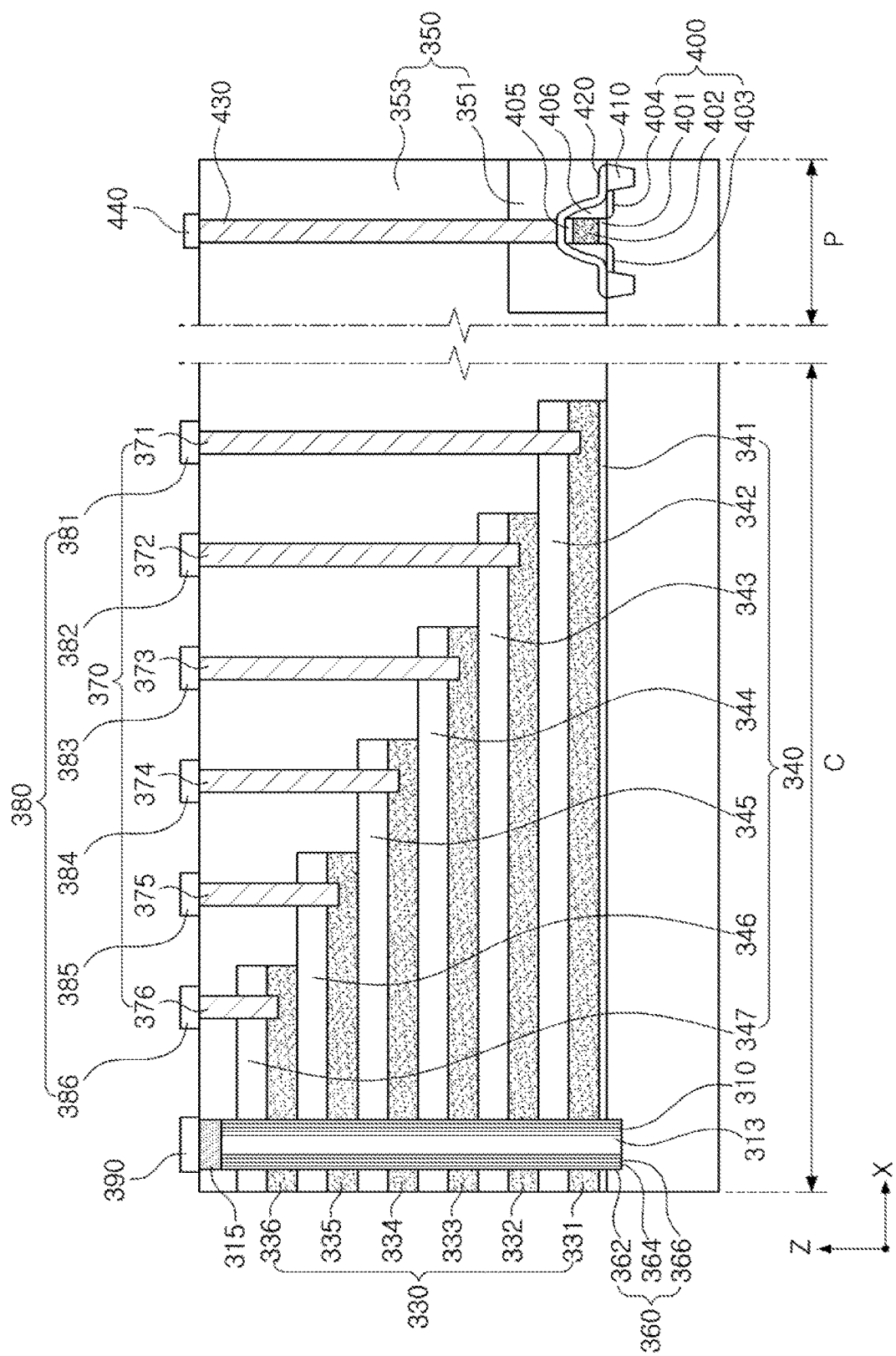

After the mask layer for forming the plurality of vertical openings Tv and Tv', contact plugs 371 to 376: 370 including a conductive material may be formed in the plurality of vertical openings Tv and Tv', as illustrated in FIG. 9H. The contact plug 370 and 430 may include a conductive material, for example, tungsten (W). The plurality of contact plugs 370 included in the cell region C may pass through the insulating layers 340 located on an upper portion of the step structure to be electrically connected to the gate electrode layers 330 located under the insulating layers 340. Meanwhile, the peripheral contact plug 430 connected to the horizontal gate electrode 402 in the peripheral circuit region P may be directly connected to the horizontal gate electrode 402 or staggered with respect to the horizontal gate electrode 402 in the y-axis direction of FIG. 9H.

Next, a plurality of interconnection lines 381 to 386: 380 may be formed on the plurality of contact plugs 370. A bit line 390 may be formed on the conductive layer 315 located on the channel 310. The plurality of interconnection lines 380 may be formed in a direction parallel to the bit line 390 or a direction intersecting a direction in which the plurality of gate electrode layers 330 extend. The plurality of interconnection lines 380 may electrically connect at least some of the gate electrode layers 330 formed at the same height in the z-axis direction as each other. Meanwhile, a conductive pad 440 may be formed on the peripheral contact plug 230.

FIGS. 10A to 10L show a method of fabricating the memory device 500 illustrated in FIG. 6. FIGS. 10A to 10L are cross-sectional views taken from the y-axis direction of the perspective view of FIG. 6 according to a process sequence.

Figure 10A:
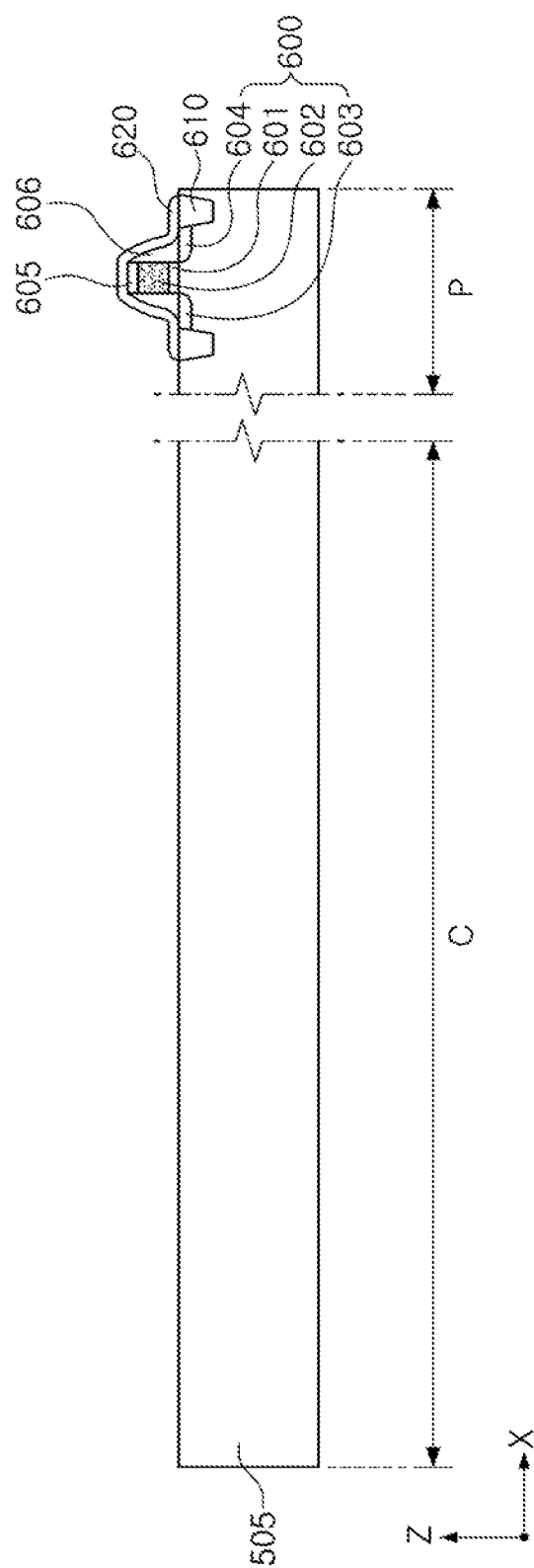

Referring to FIG. 10A, a cell region C and a peripheral circuit region P may be defined in the process of fabricating the memory device 500 according to the exemplary embodiment of the present disclosure. The peripheral circuit region P may include one or more circuit elements and the one or more circuit elements may include a horizontal transistor 600 formed on the substrate 505, as illustrated in FIG. 10A. The horizontal transistor 600 may have a similar structure to that of the horizontal transistors 200 and 400 described with reference to FIGS. 8A and 9A.

Figure 10B:
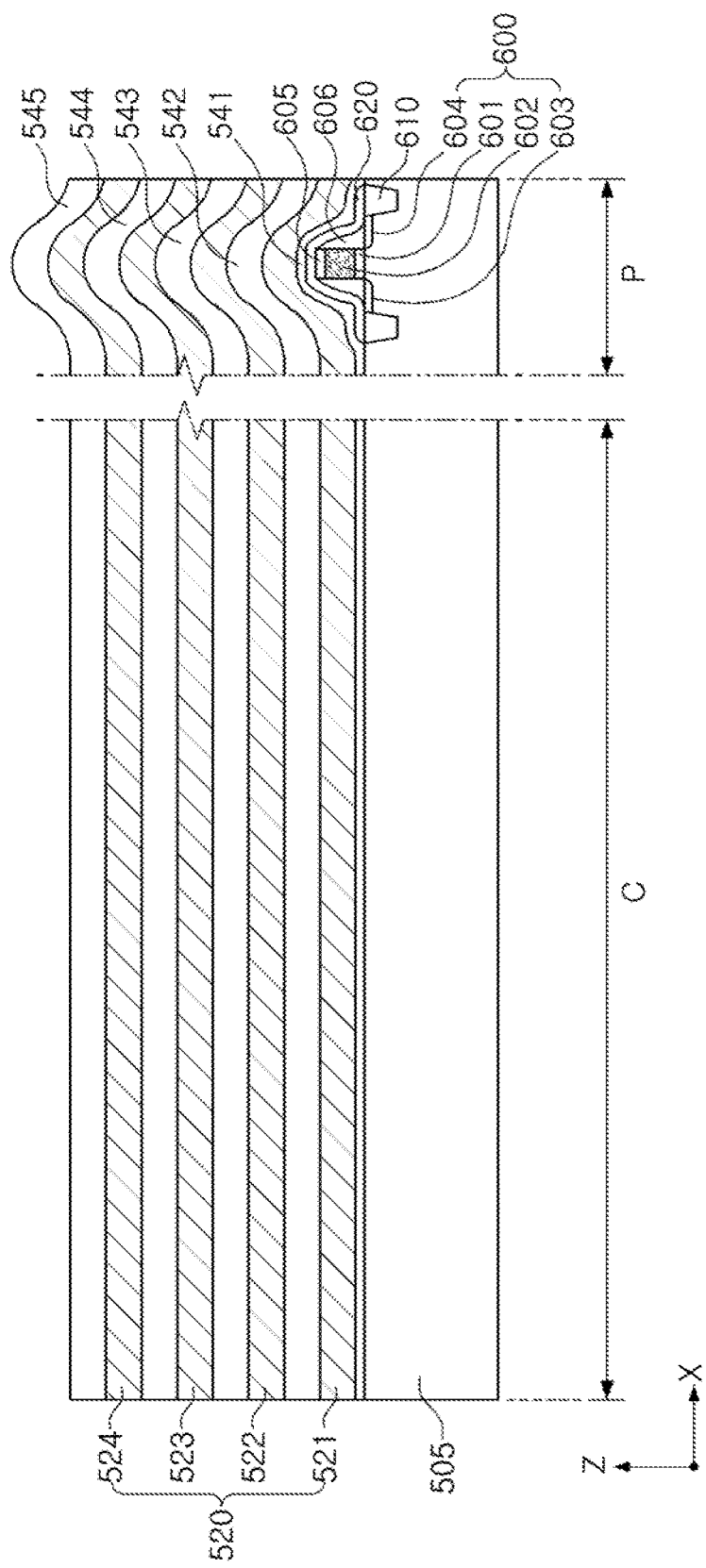

Referring to FIG. 10B, a plurality of sacrificial layers 521 to 524 and a plurality of insulating layers 541 to 545 may be alternately stacked in the cell region C and the peripheral circuit region P. The plurality of sacrificial layers 521 to 524 and the plurality of insulating layers 541 to 545 alternately stacked in the peripheral circuit region P may have a curved surface due to the horizontal gate electrode 602 and the gate spacer 605 of the horizontal transistor 600.

Figure 10C:
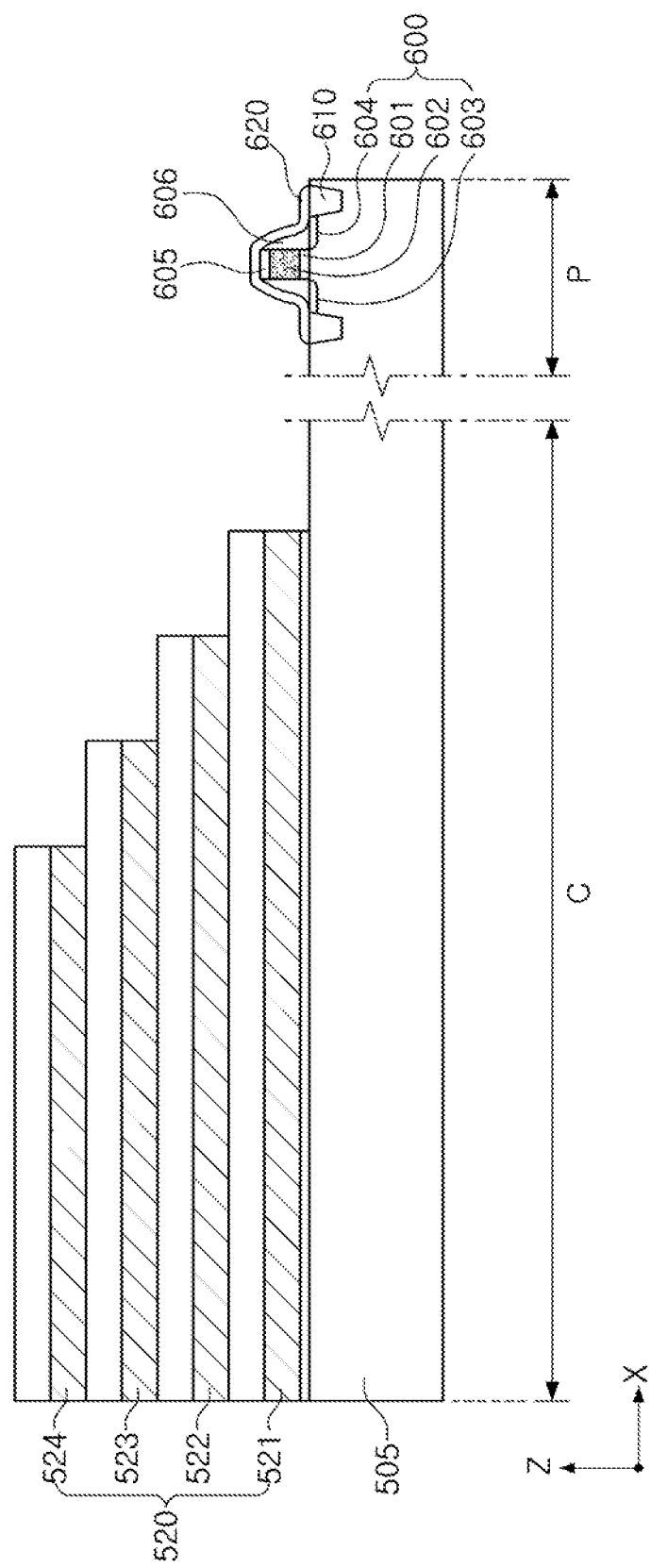

Next, referring to FIG. 10C, a pad area having a step structure may be formed by etching the plurality of sacrificial layers 521 to 524 and the plurality of insulating layers 541 to 545. In order to form the pad area, a mask layer may be formed on the plurality of sacrificial layers 521 to 524 and the plurality of insulating layers 541 to 545, and a surface exposed by the mask layer may be etched. A sacrificial layer 521 and insulating layers 541 and 542 disposed to be closest to an upper surface of the substrate 505 may extend to have the greatest length in the x-axis direction.

Figure 10D:
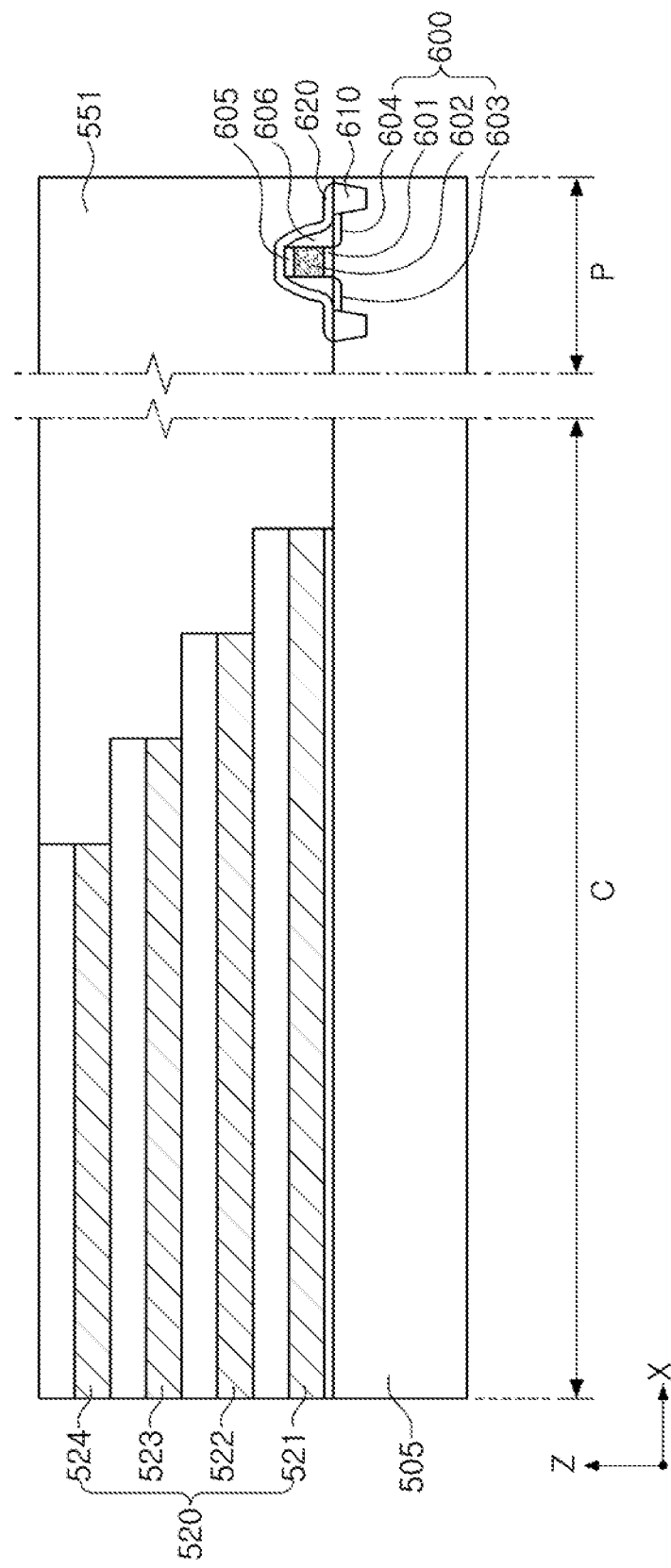

After the pad area having the step structure is formed, a first interlayer insulating layer 551 may be formed in the cell region C and the peripheral circuit region P, as illustrated in FIG. 10D. The first interlayer insulating layer 551 may cover the upper surface of the substrate 505 and an etch stop layer 620 in the peripheral circuit region P, and may be formed on the plurality of sacrificial layers 521 to 524 and the insulating layers 541 to 545 of each pad area in the cell region C. As such, it may extend continuously from a first circuit element in the peripheral circuit region P into the circuit region P to cover a plurality of the steps that form the pad areas. The first interlayer insulating layer 551 may include at least one of an HDP oxide layer and a TEOS oxide layer, and preferably include the HDP oxide layer. After the first interlayer insulating layer 551 is formed, an upper surface of the first interlayer insulating layer 551 may be planarized by performing a CMP process until the upper surface of the first interlayer insulating layer 551 becomes coplanar with an upper surface of the uppermost insulating layer 545.

Figure 10E:
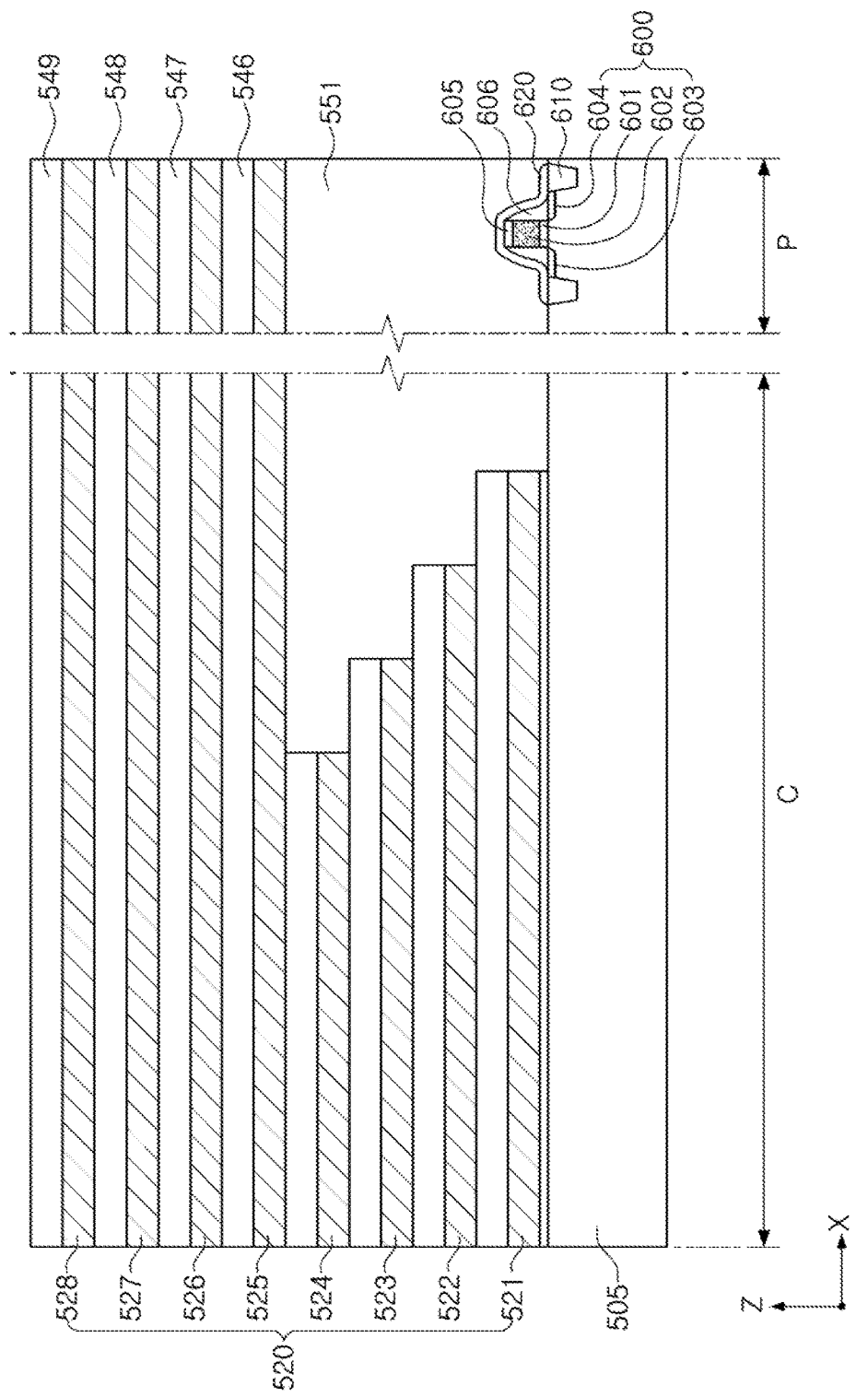

Next, referring to FIG. 10E, a plurality of sacrificial layers 525 to 528 and insulating layers 546 to 549 may be additionally alternately stacked on upper surfaces of the uppermost insulating layer 545 and the first interlayer insulating layer 551. The memory device 500 illustrated in FIG. 6 may include a relatively greater number of memory cells MC1 to MC6 than the memory devices 100 and 300 illustrated in FIGS. 4 and 5. When the same method as the method of fabricating the memory device 100 illustrated in FIG. 4 is applied in fabricating the memory device 500 illustrated in FIG. 6, voids may be generated due to the plurality of sacrificial layers 521 to 528 and the plurality of insulating layers 541 to 549 alternately stacked on the curved surface of the horizontal transistor 600.

Accordingly, in this exemplary embodiment, the plurality of sacrificial layers 521 to 528 and the plurality of insulating layers 541 to 549 may be alternately stacked in two or more separate, split processes in order to help avoid the void generation. Although the plurality of sacrificial layers 521 to 528 and the plurality of insulating layers 541 to 549 are formed through two or more separate processes in the exemplary embodiment illustrated in FIGS. 10A to 10L, the plurality of sacrificial layers 521 to 528 and the plurality of insulating layers 541 to 549 may be formed in three or more sets of processes.

Figure 10F:
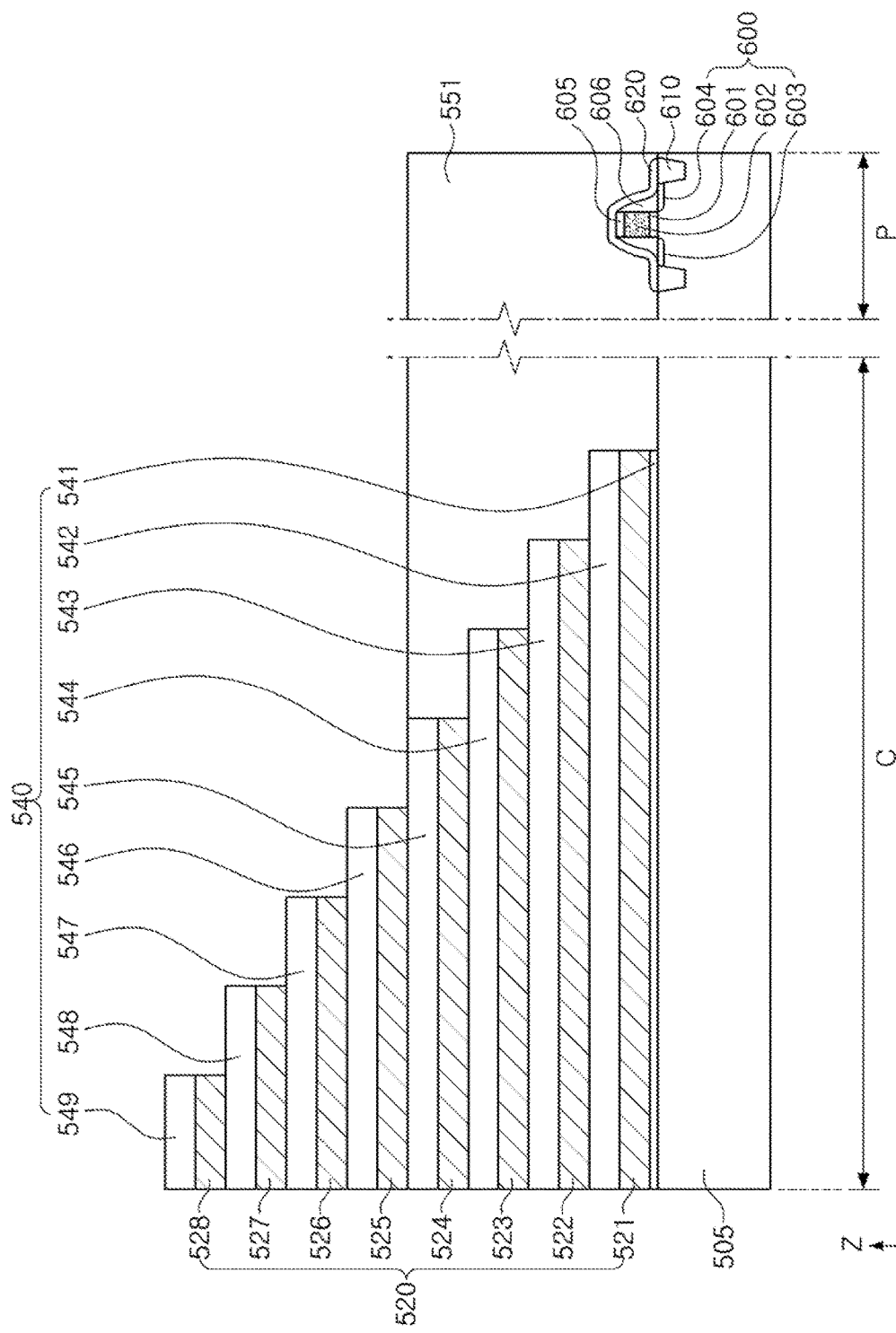

Referring to FIG. 10F, a pad area having a step structure is formed by etching the plurality of sacrificial layers 524 to 528 and the plurality of insulating layers 545 to 549 disposed on the first interlayer insulating layer 551. A method of etching the plurality of sacrificial layers 524 to 528 and a plurality of insulating layers 545 to 549 disposed on the first interlayer insulating layer 551 may be the same as the method described with reference to FIG. 10C.

Figure 10G:
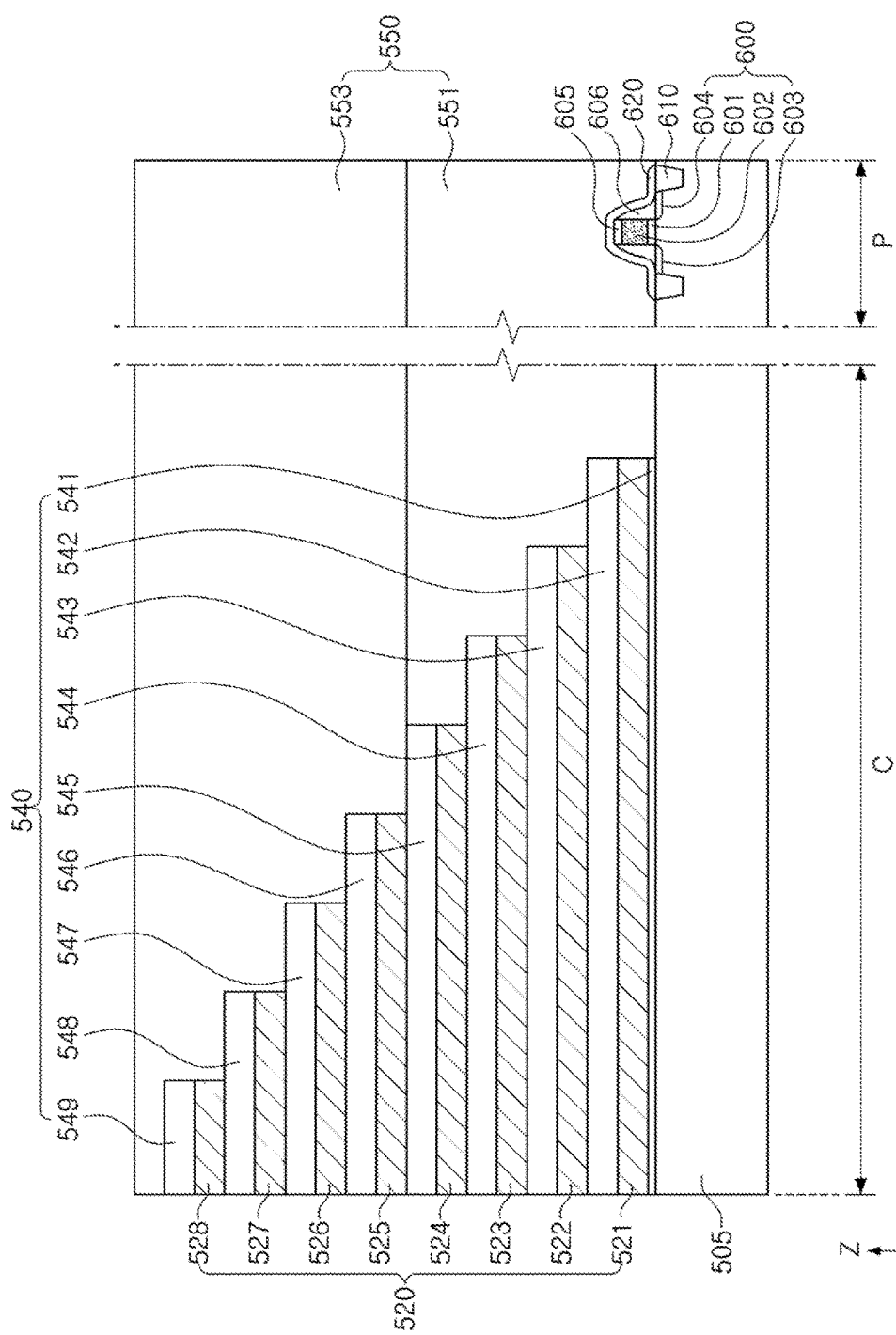

Next, referring to FIG. 10G, a second interlayer insulating layer 553 is formed on the first interlayer insulating layer 551. In one embodiment, the second interlayer insulating layer 553 may have a relatively greater volume than the first interlayer insulating layer 551, and may include a TEOS oxide layer having a high deposition rate. The second interlayer insulating layer 553 may cover the pad area formed by etching the sacrificial layers 525 to 528 and the insulating layers 545 to 549 disposed to be higher than the first interlayer insulating layer 551, and cover an upper surface the uppermost sacrificial layer 549.

Figure 10H:
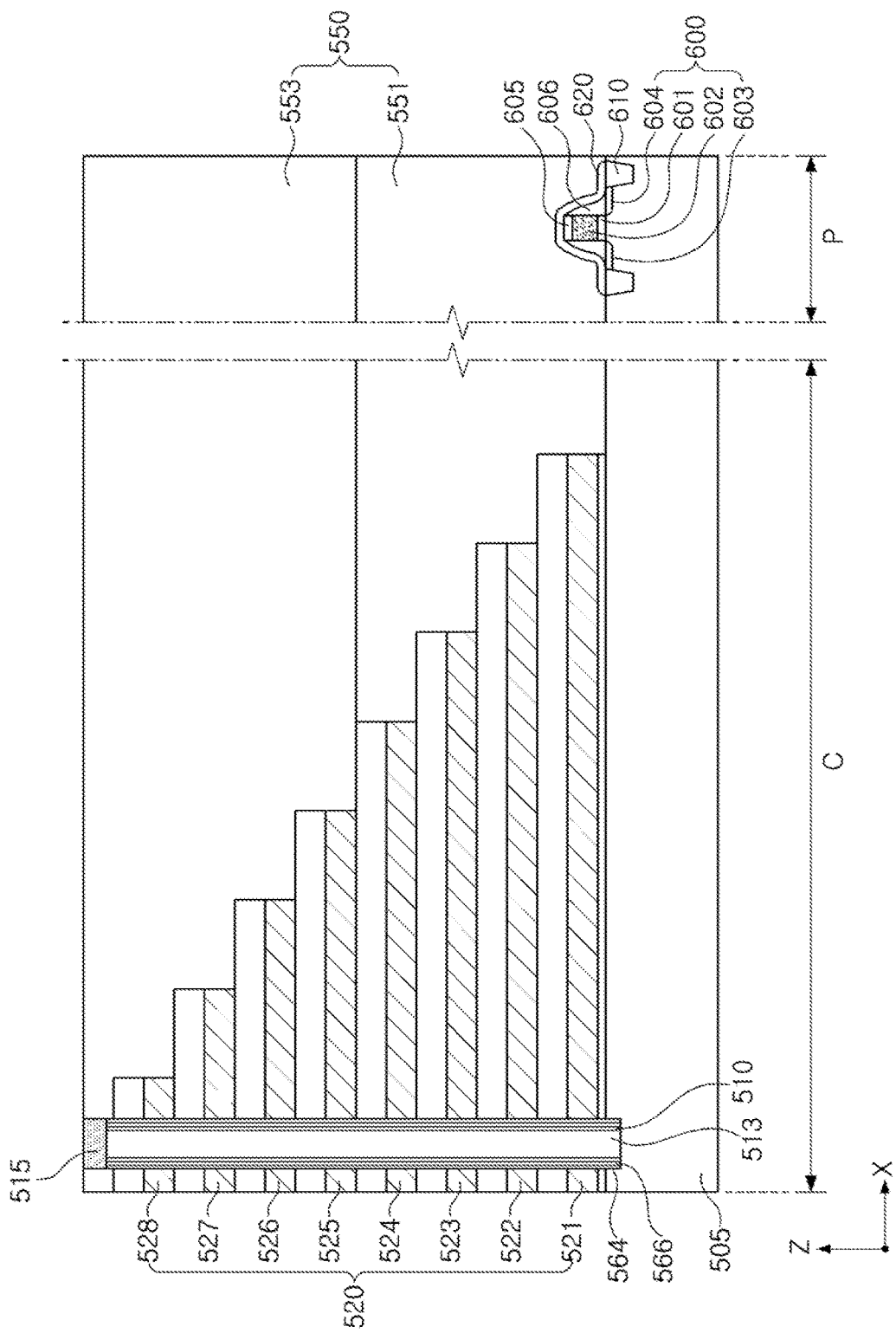
Figure 10J:
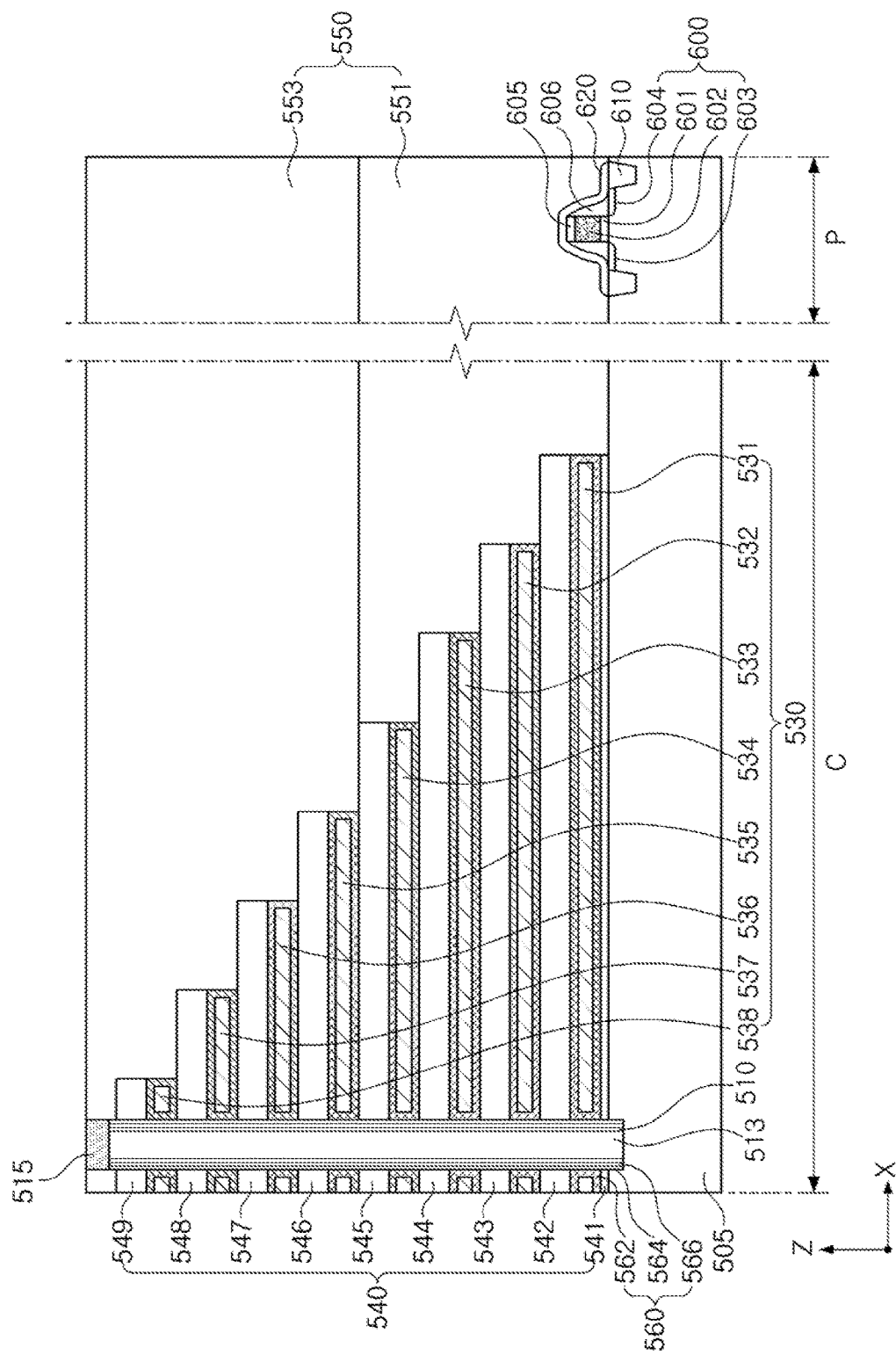

After the second interlayer insulating layer 553 is formed, a channel 510 may be formed as illustrated in FIG. 10H. In order to form a channel 510, the second interlayer insulating layer 553 and the plurality of insulating layers 541 to 549 and sacrificial layers 521 to 528 may be etched to form an opening. The opening may be formed to recess the upper surface of the substrate 505 at a predetermined depth. In the opening, a charge storage layer 564 and a tunneling layer 566 may be formed sequentially from a sidewall of the opening. The charge storage layer 564 and the tunneling layer 566 may be formed using an ALD or CVD process as described above.

The channel 510 may be formed on an inner surface of the tunneling layer 566, and the inside of the channel 510 may be filled with an embedded insulating layer 513. Selectively, before the embedded insulating layer 513 is formed, a hydrogen annealing process in which the structure including the channel 510 formed thereon is heat-treated in a hydrogen- or deuterium-containing gas atmosphere, may be additionally performed. Through the hydrogen annealing process, many of crystal defects existing in the channel 510 may be cured.

Next, a planarization process may be performed to remove unnecessary semiconductor materials and insulating materials covering the second interlayer insulating layer 553. Next, an upper portion of the embedded insulating layer 513 may be partially removed using an etching process, etc., and then a material for forming a conductive layer 515 may be deposited on the removed portion. Next, a planarization process may be further performed to form the conductive layer 515.

After the channel 510 is formed, horizontal openings Th may be formed by removing a plurality of sacrificial layer 521 to 528. Referring to FIG. 10I, the plurality of sacrificial layers 521 to 528 is removed to form the horizontal openings Th between the plurality of insulating layers 541 to 549. Next, referring to FIG. 10J, a blocking layer 562 and gate electrode layers 531 to 538: 530 may be formed in the horizontal openings Th.

The blocking layer 562 may be formed using an ALD or CVD process like the charge storage layer 564 and the tunneling layer 566, and may have a shape surrounding the gate electrode layers 530. The gate electrode layers 530 may include a material having an excellent electric conductivity such as tungsten (W).

Figure 10K:
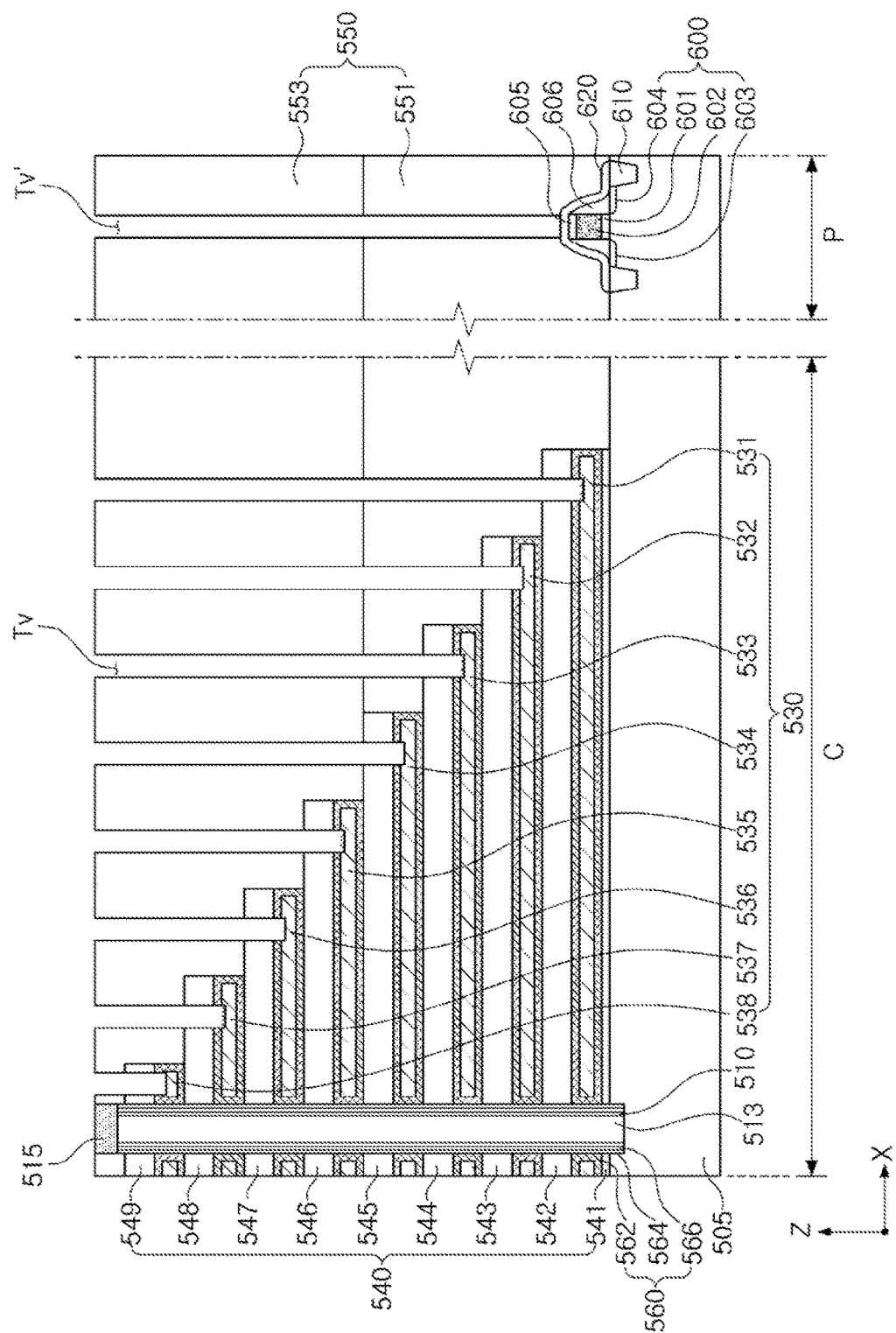

Next, referring to FIG. 10K, a plurality of vertical openings Tv and Tv' for forming contact plugs 570 and 630 may be formed by performing an etching process in the z-axis direction parallel to the channel 510. The etching process of forming the plurality of vertical openings Tv and Tv' may include forming a mask layer in which areas corresponding to the vertical openings Tv and Tv' are open, and selectively etching the first and second interlayer insulating layers 551 and 553 and the plurality of insulating layers 540 with respect to the plurality of gate electrode layers 530. By selectively etching a material included in the first and second interlayer insulating layers 551 and 553 and the plurality of insulating layers 540 with respect to a material included in the plurality of gate electrode layers 530, the vertical openings Tv and Tv' extending to each of the gate electrode layers 530 may be formed. In some exemplary embodiments, due to a high aspect ratio, the vertical openings Tv and Tv' may have a tapered structure (an inclined side) such that widths thereof decrease toward the substrate 505.

A first vertical opening Tv formed in the cell region C may have a depth of exposing each of the gate electrode layers 530 formed in the cell region C. In addition, a second vertical opening Tv' formed in the peripheral circuit region P may be provided to form a peripheral contact plug 630 electrically connected to the gate electrode 602 of the horizontal transistor 600 formed in the peripheral circuit region P.

Figure 10L:
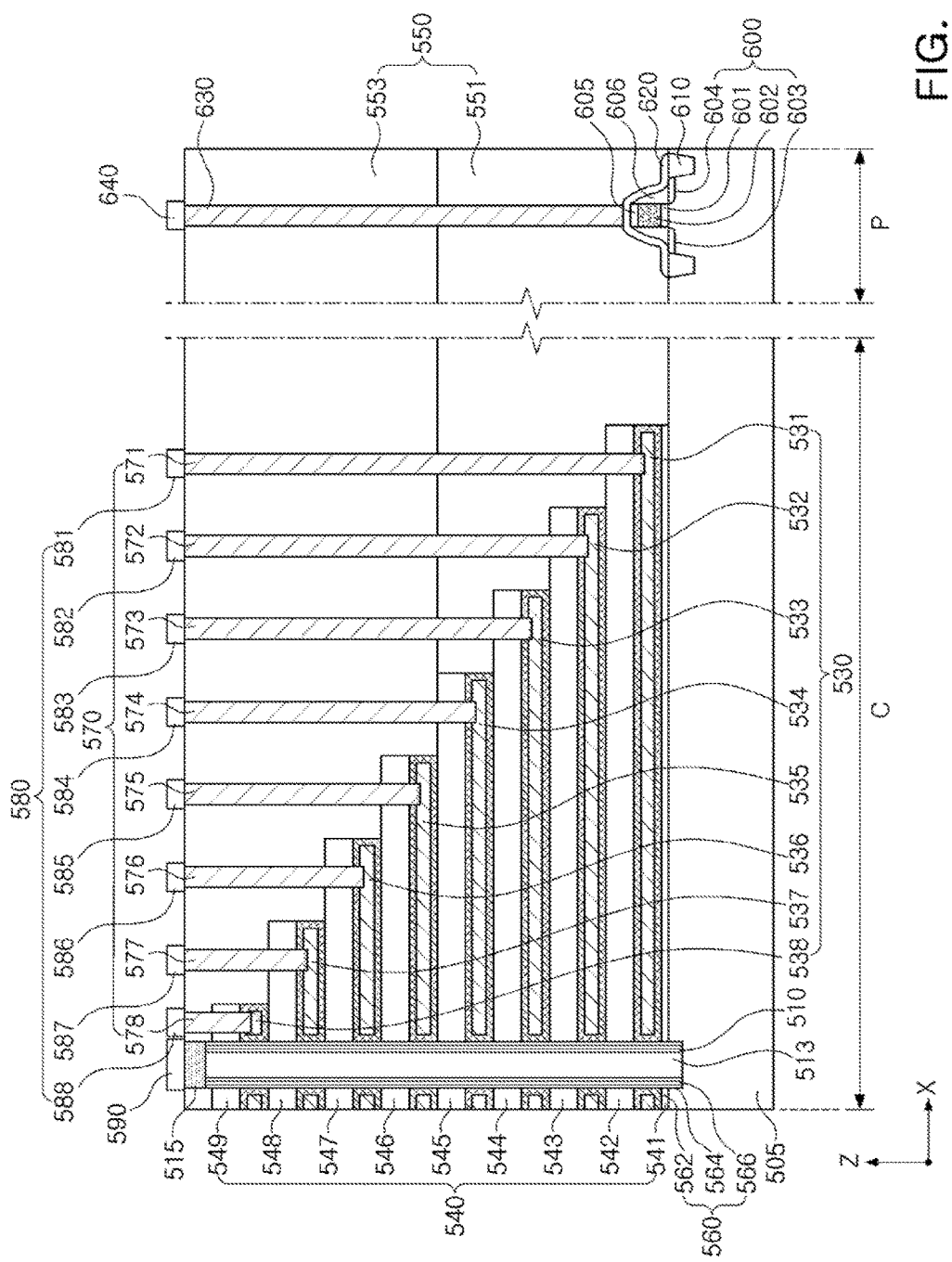

Referring to FIG. 10L, each of the first vertical opening Tv and the second vertical opening Tv' may be filled with a conductive material to form a plurality of contact plugs 570 and 630. A plurality of interconnection lines 581 to 588: 580 may be formed on the plurality of contact plugs 570 in the cell region C to electrically connect the plurality of gate electrode layers 530 disposed to have the same height in the z-axis direction. Meanwhile, the channel 510 may be electrically connected to a bit line 590 through the conductive layer 515, and a conductive pad 640 may be formed on the peripheral contact plug 630.

Figure 11A:
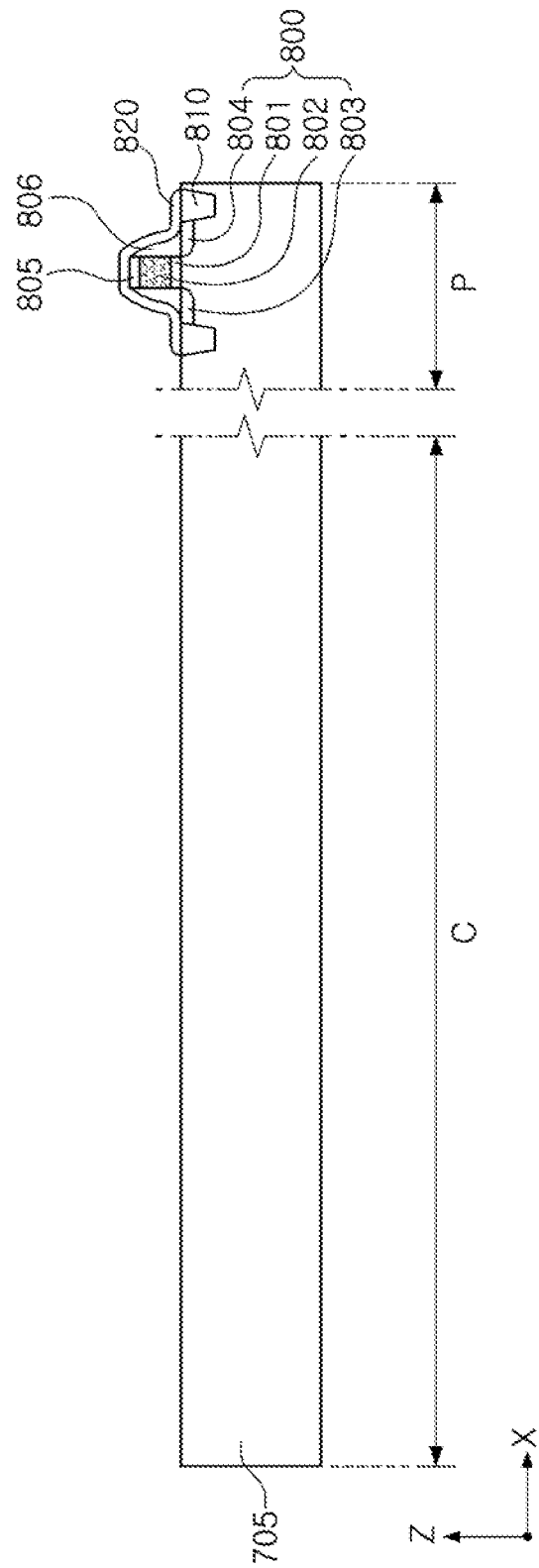
FIGS. 11A to 11O are views illustrating an exemplary method of fabricating the memory device illustrated in FIG. 7.
Figure 11B:
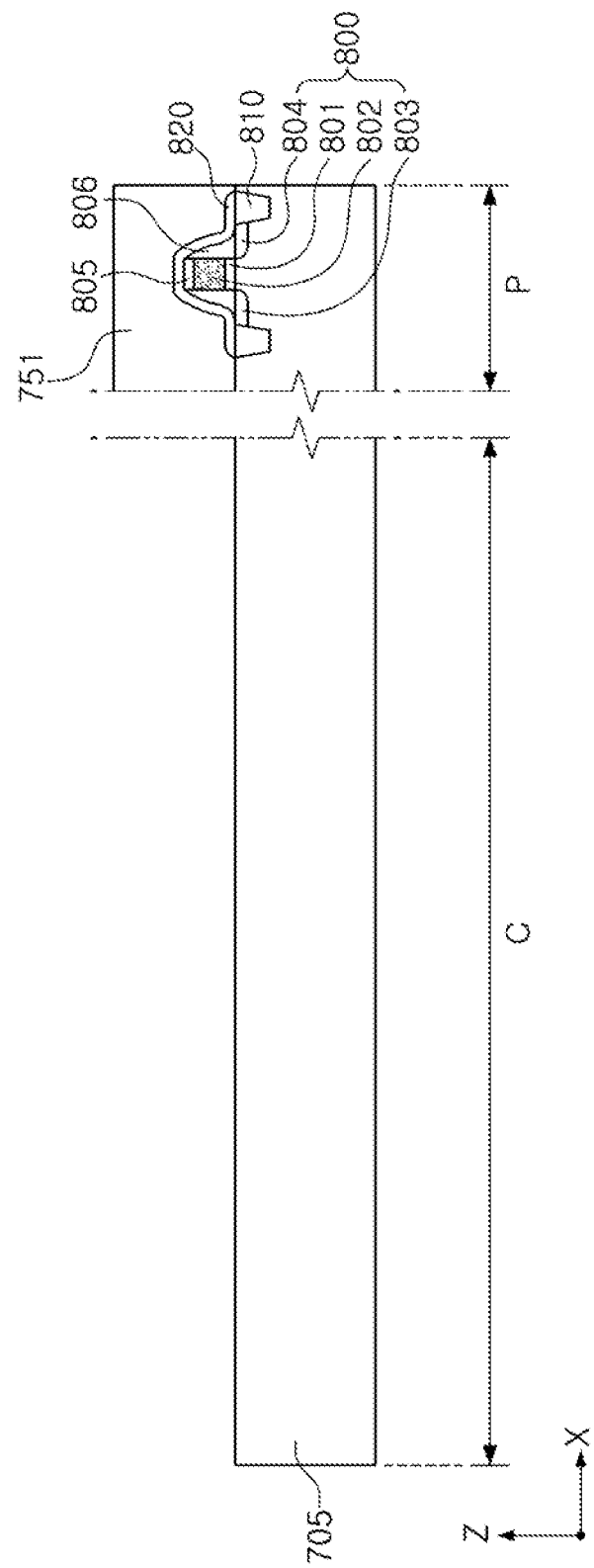
Figure 11C:
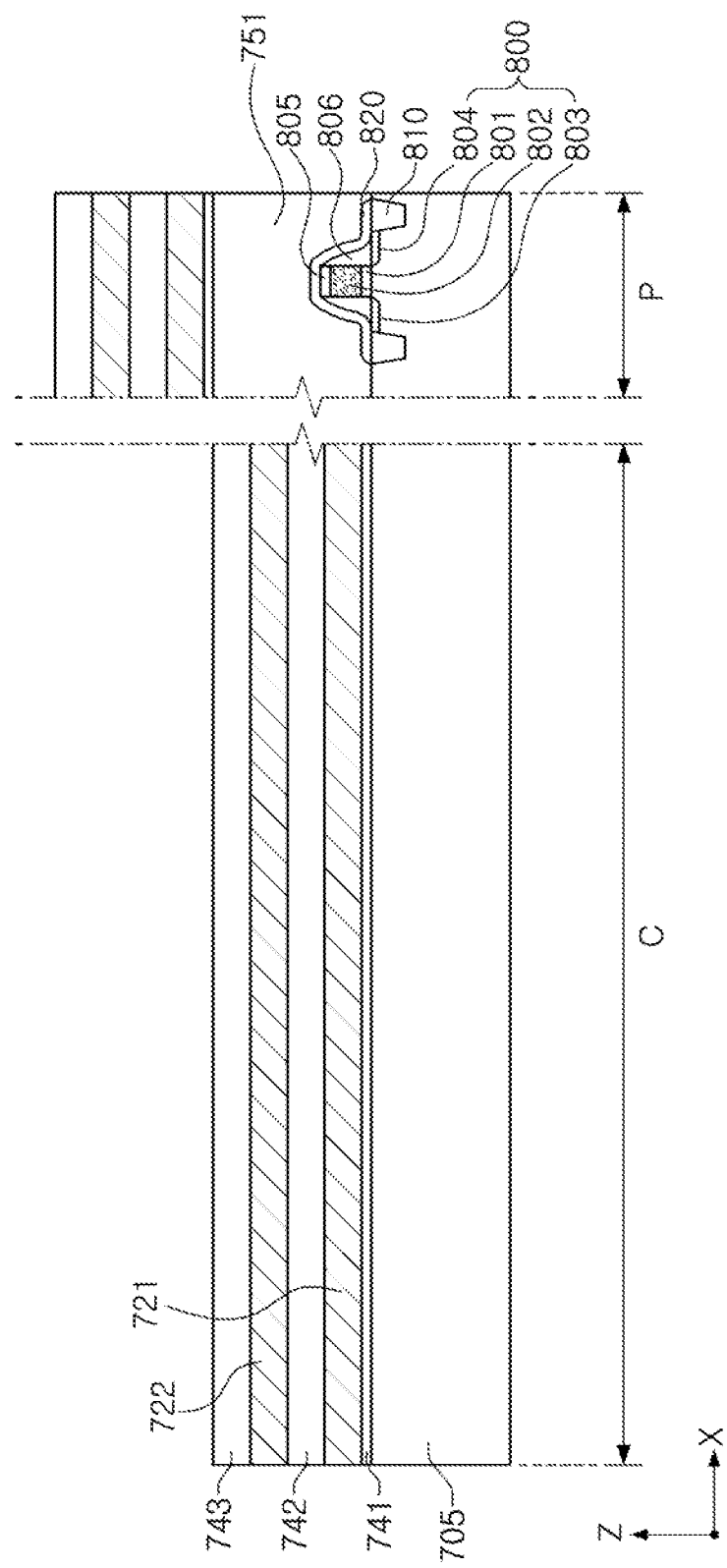
Figure 11D:
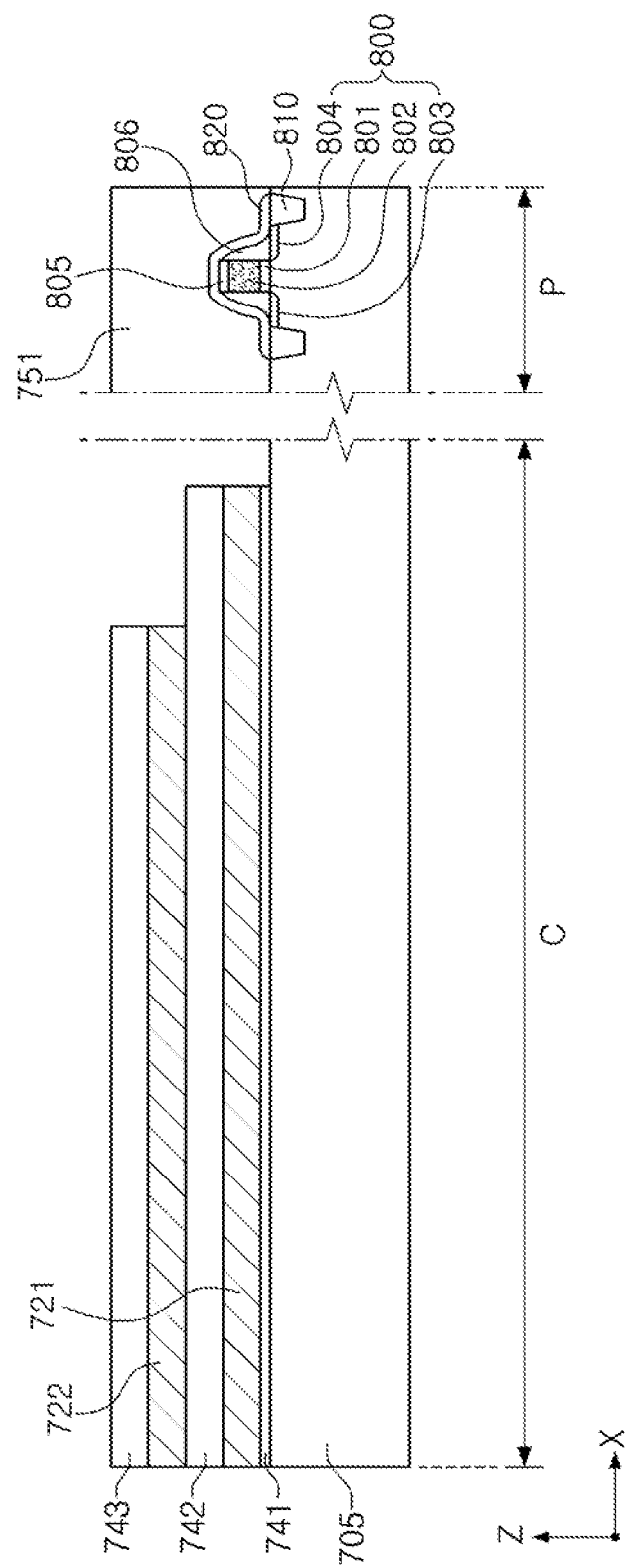
Figure 11E:
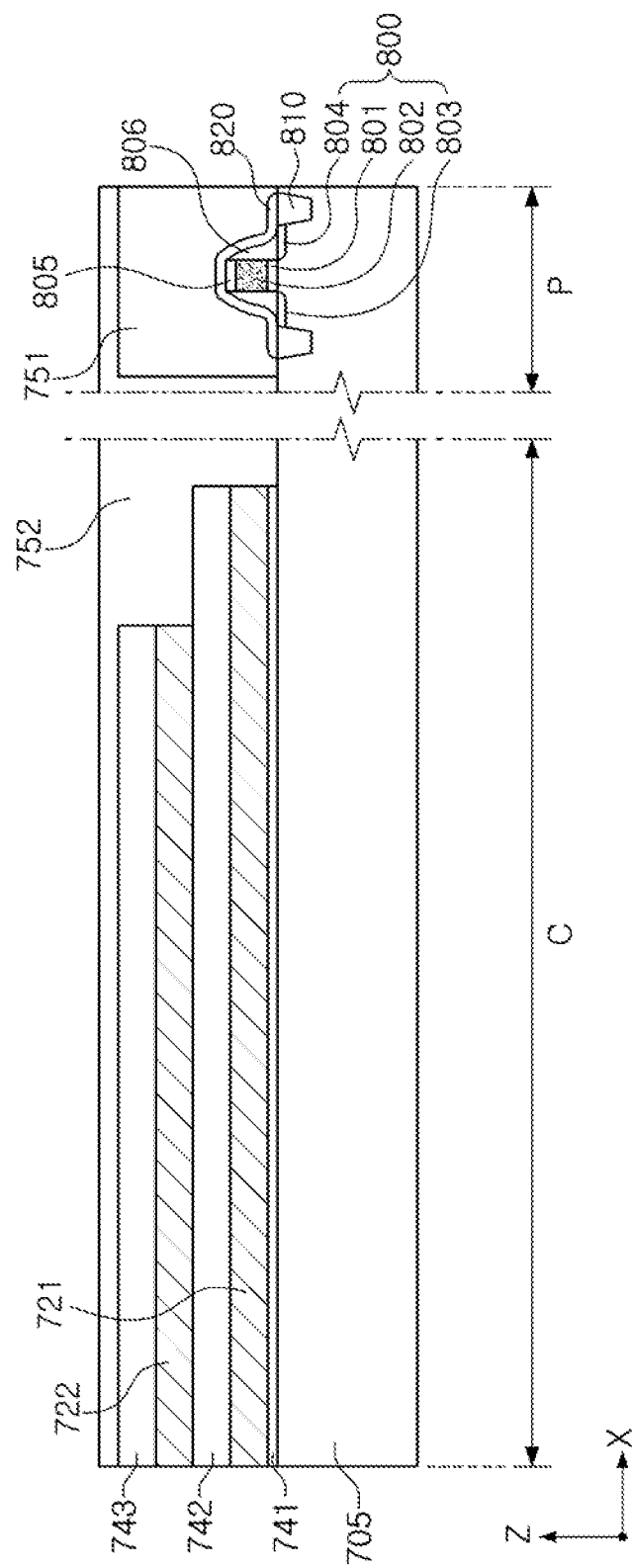
Figure 11F:
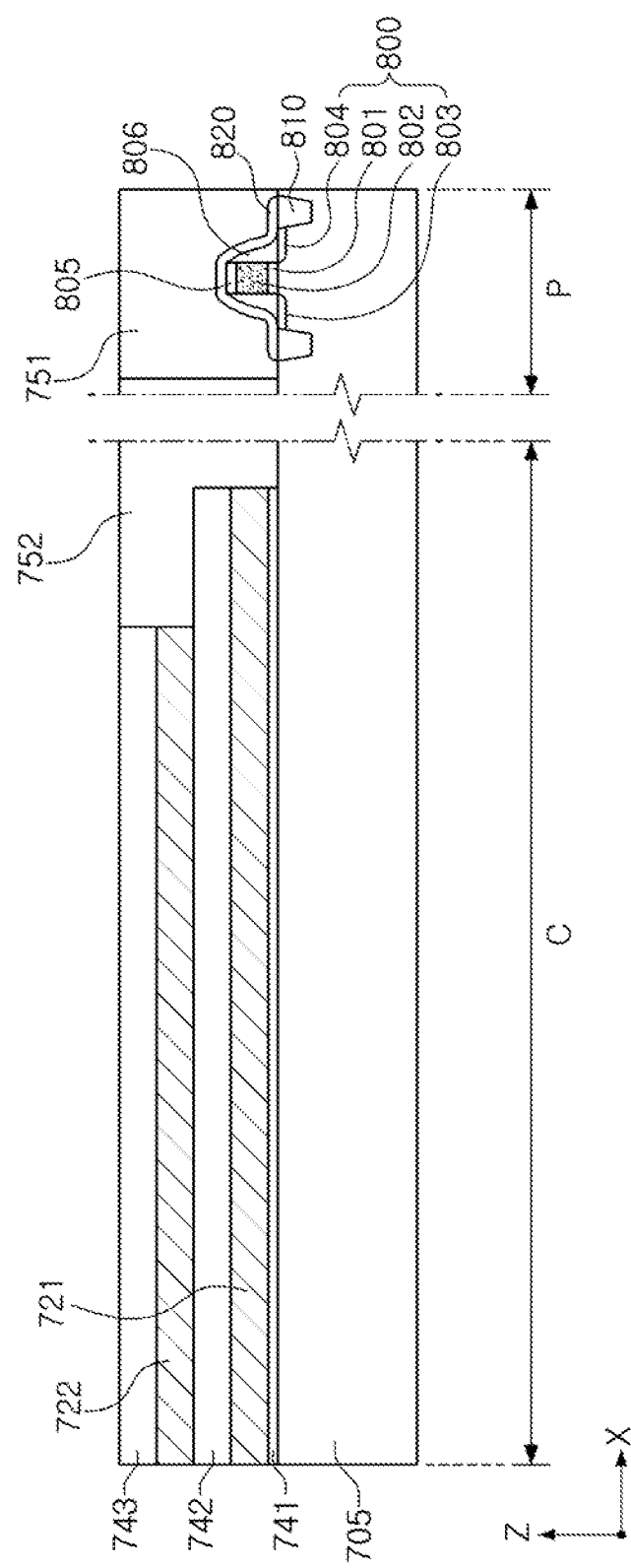
Figure 11G:
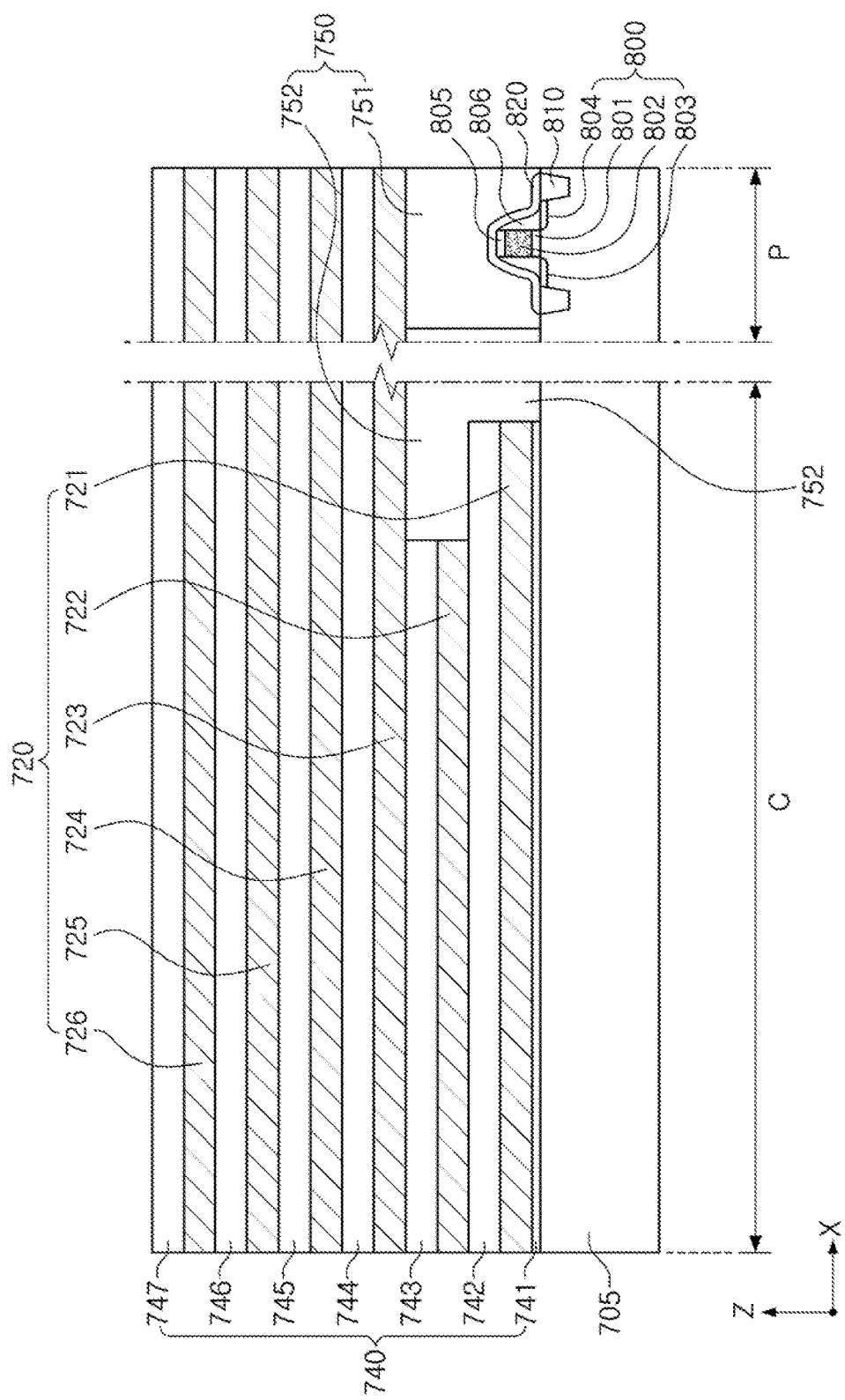
Figure 11H:
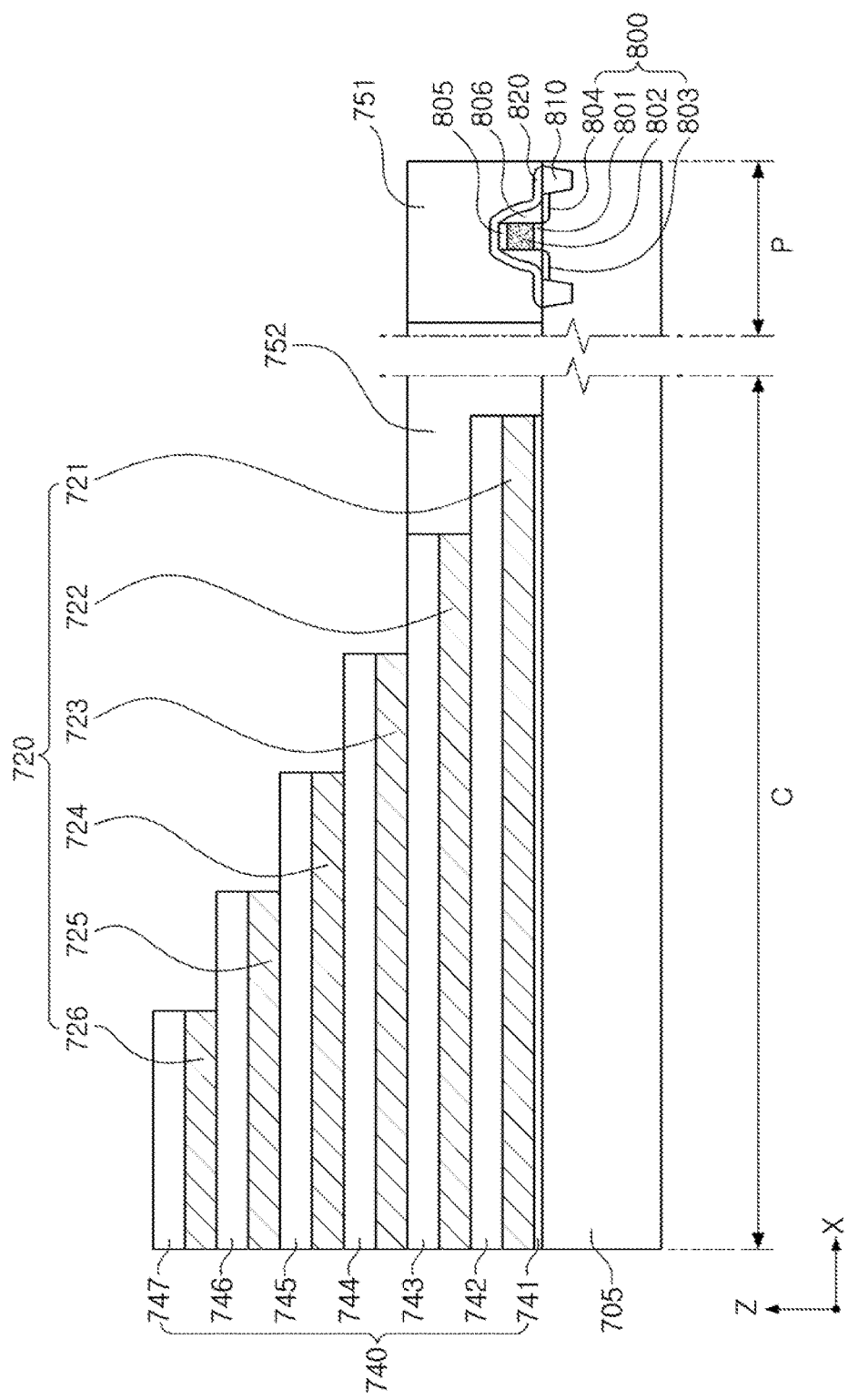
Figure 111:
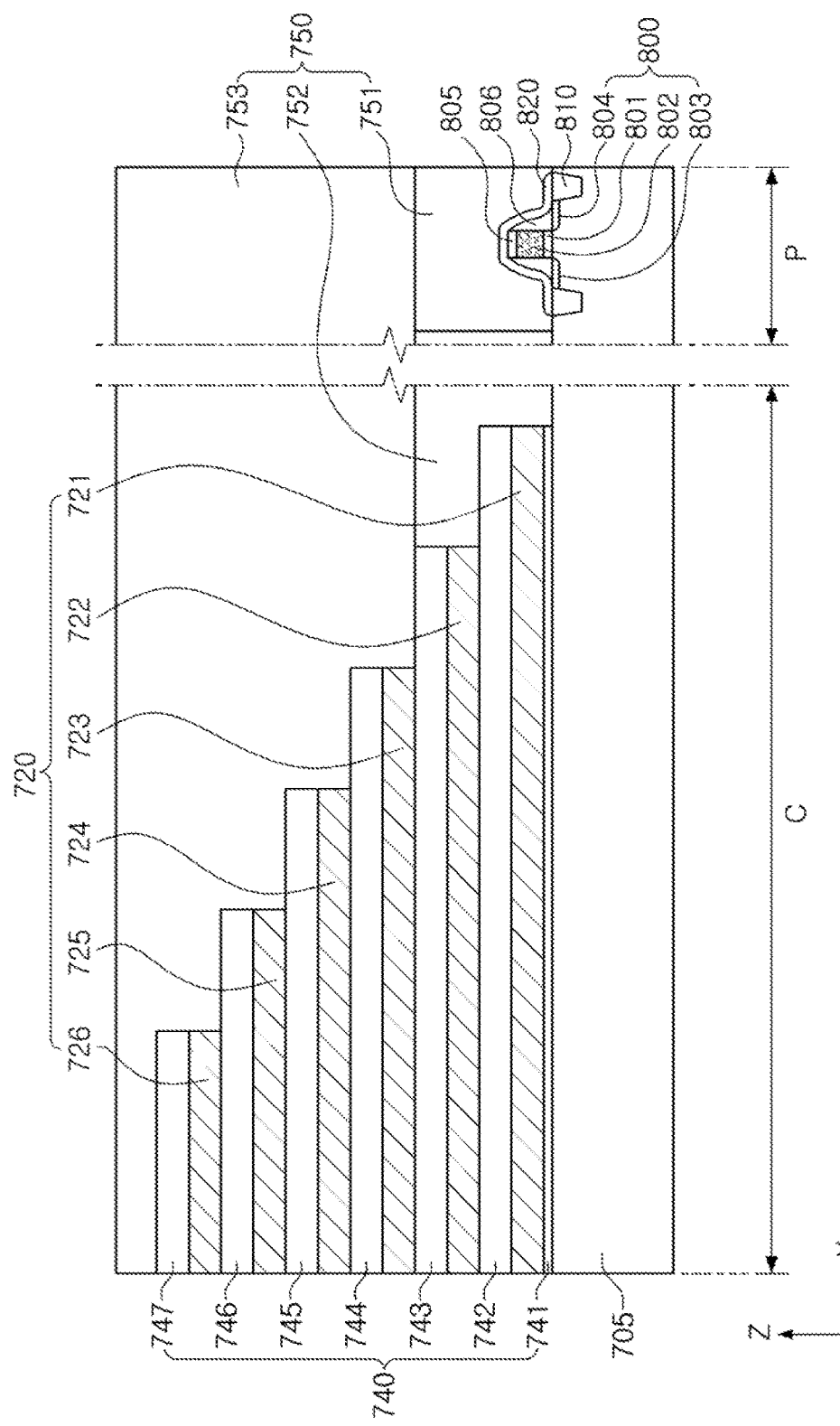
Figure 11J:
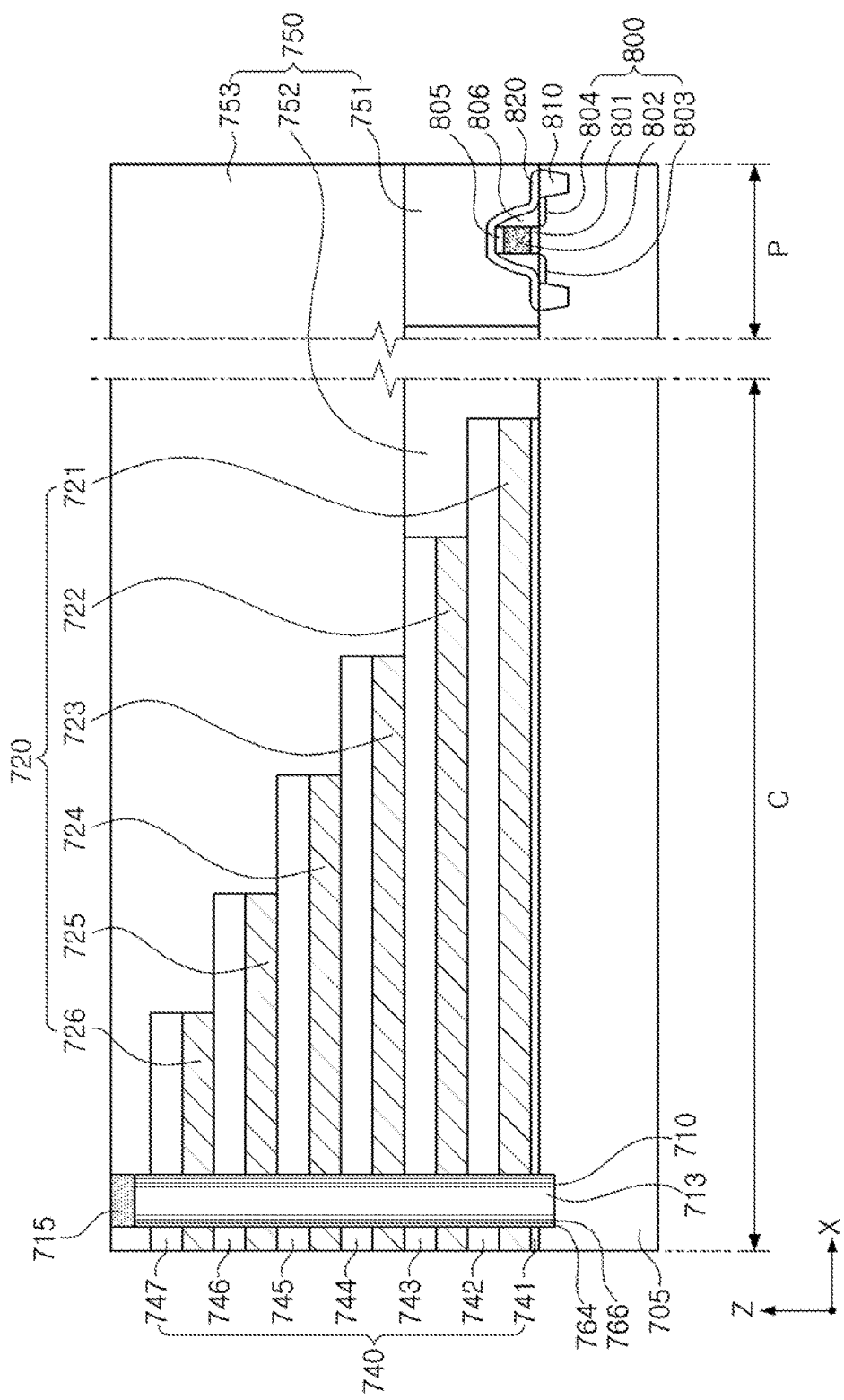
Figure 11K:
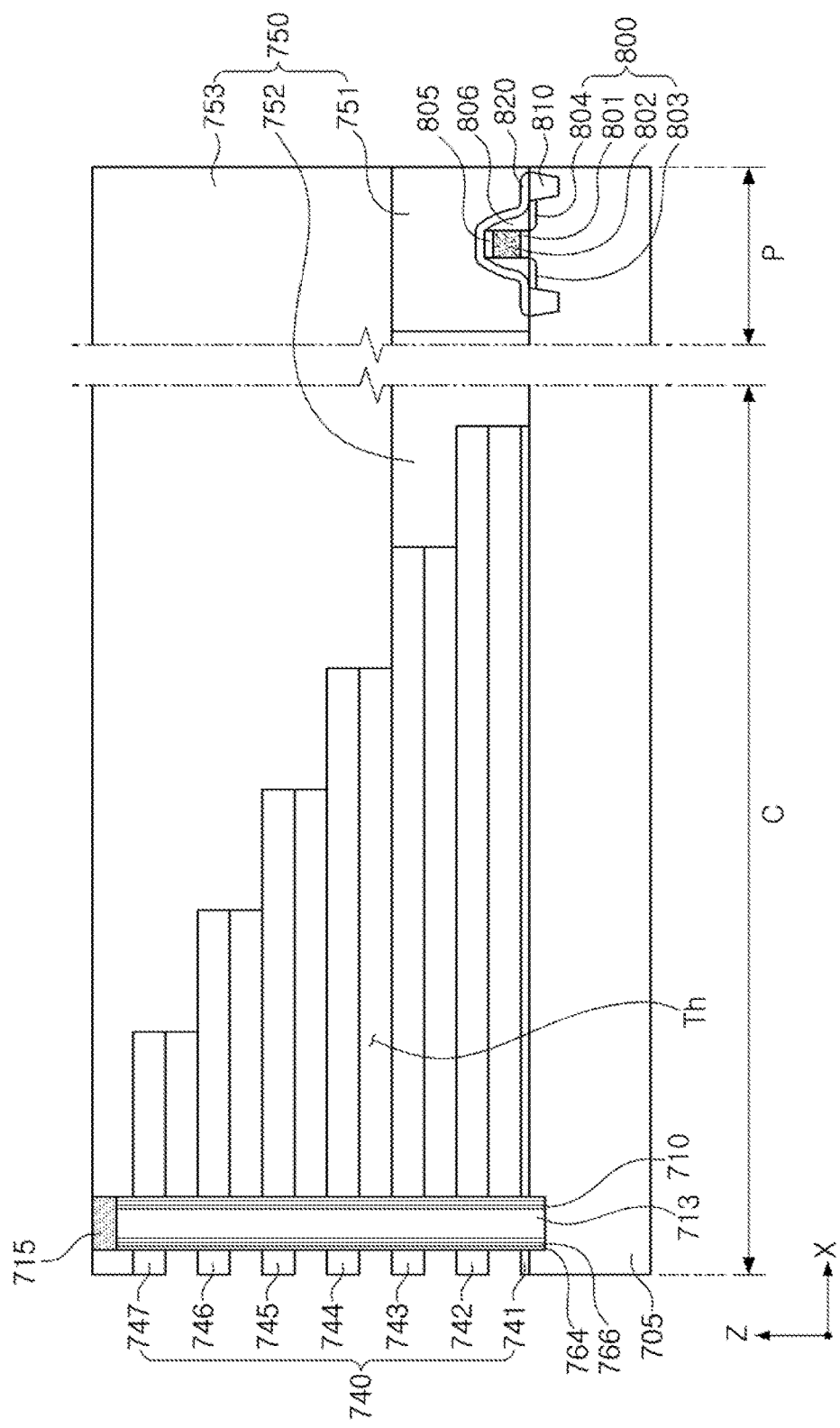
Figure 11L:
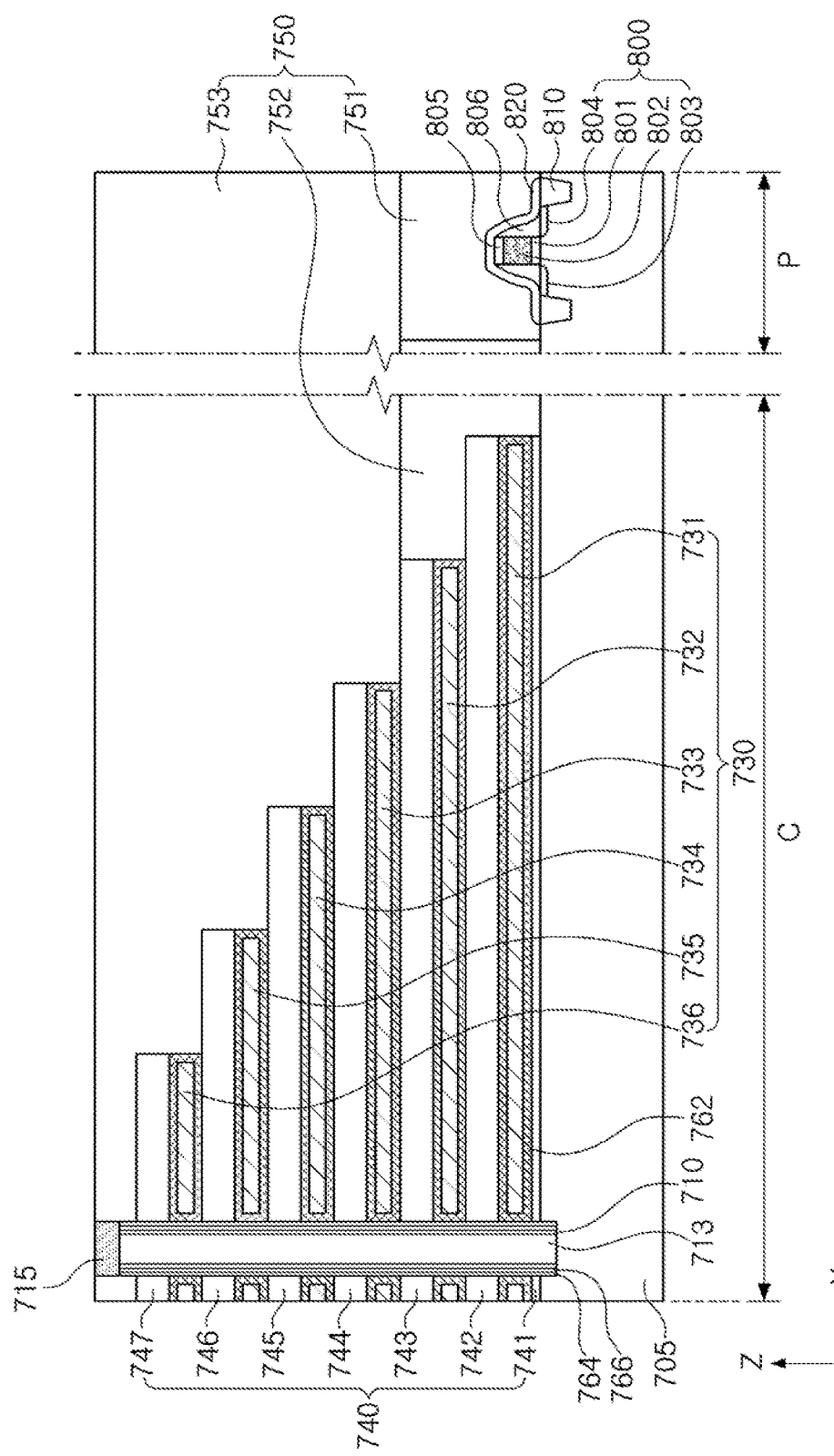
Figure 11M:
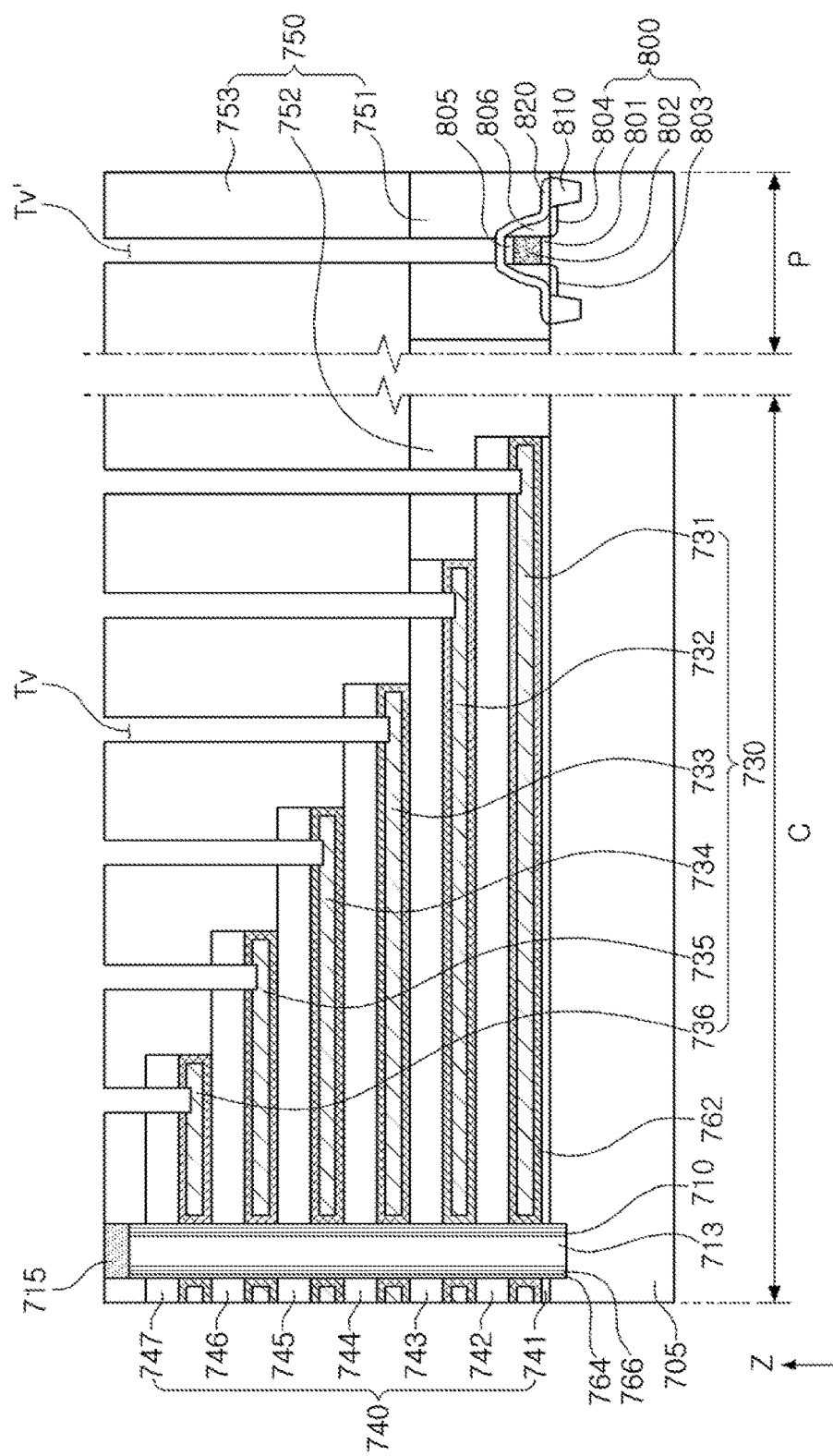
Figure 11N:
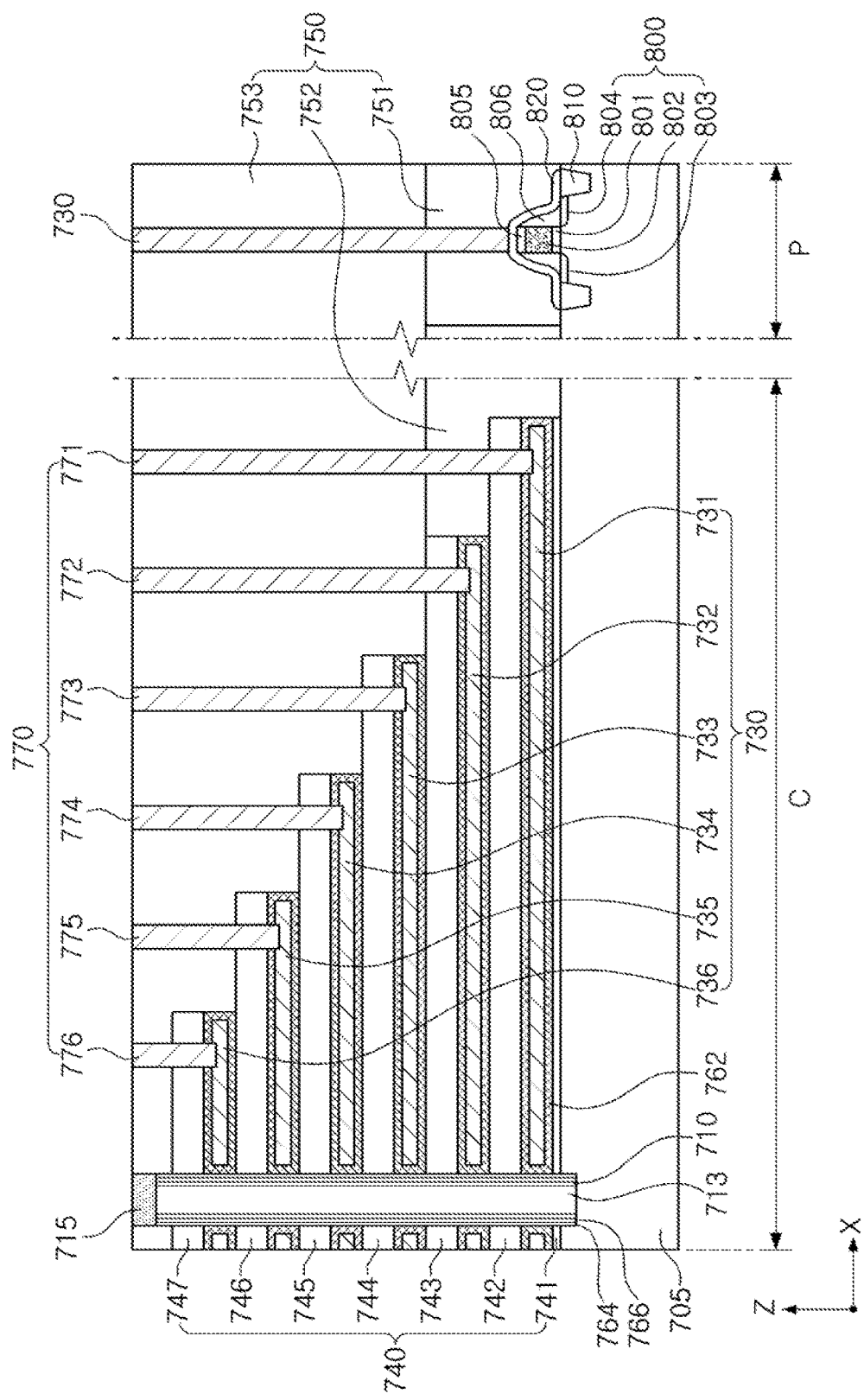
Figure 11O:
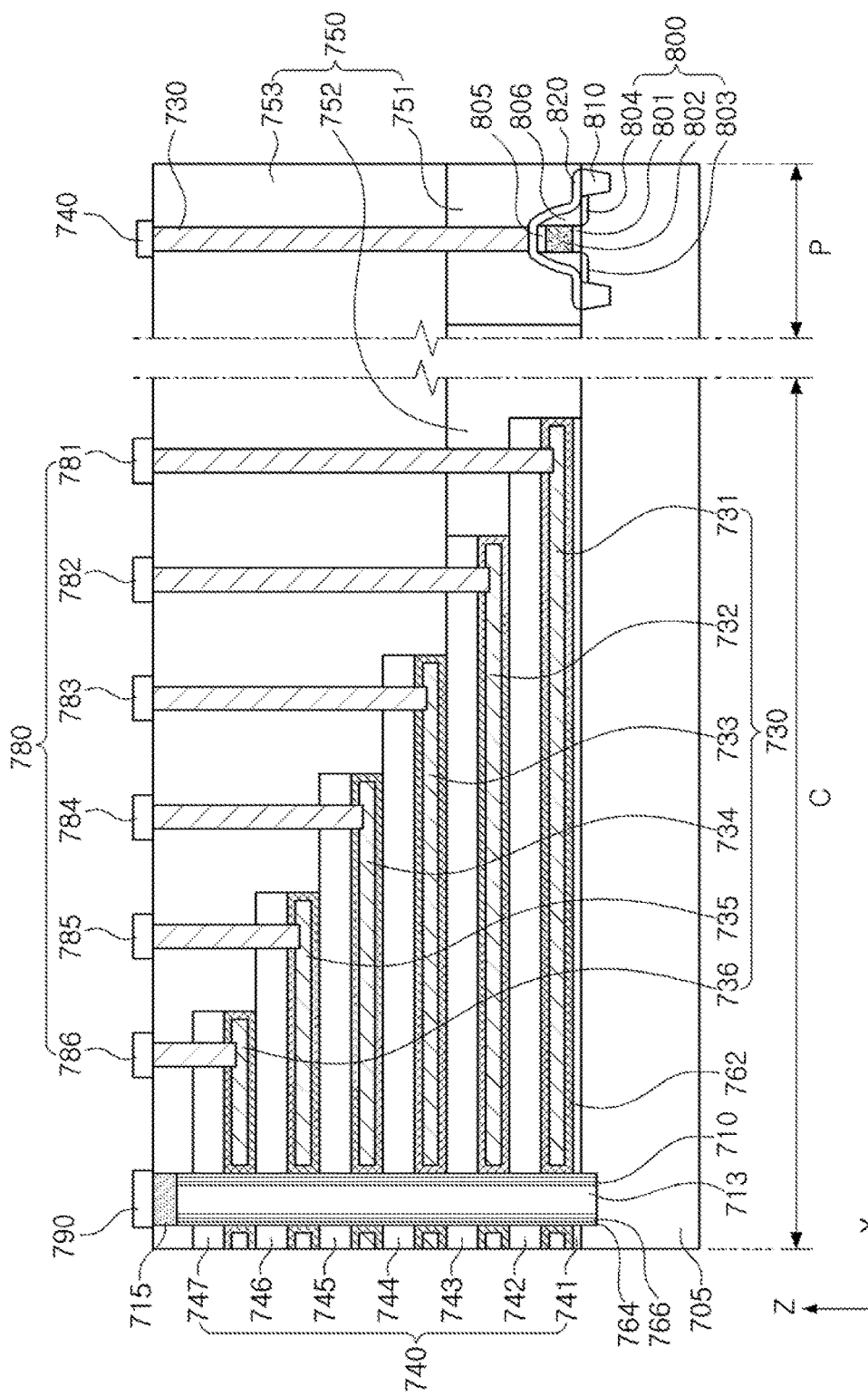

FIGS. 11A to 11O show a method of fabricating the memory device 700 illustrated in FIG. 7. FIGS. 11A to 11O may be cross-sectional views taken from the y-axis direction of the perspective view of FIG. 7 according to a process sequence.

First, referring to FIG. 11A, a cell region C and a peripheral circuit region P may be defined, and the peripheral circuit region P may include one or more circuit elements. The one or more circuit elements may include horizontal transistor 800 formed on the substrate 705, and the horizontal transistor 800 may have a similar structure to the horizontal transistors 200, 400, and 600 illustrated in FIGS. 7A, 8A, and 9A.

The horizontal transistor 800 may include a horizontal source region 803, a horizontal drain region 804, and a horizontal gate electrode 802, and a gate oxide layer 801 may be formed between the horizontal gate electrode 802 and the substrate 705. A device isolation layer 810 may be formed an outside of the horizontal source region 803 and the horizontal drain region 804, and an etch stop layer 820 may be formed on the device isolation layer 810 and the horizontal transistor 800.

A capping layer 805 and a gate spacer 806 may be respectively formed on an upper surface and a side surface of the horizontal gate electrode 802 in FIG. 11A. The capping layer 805 and the gate spacer 806 may be formed, for example, by depositing a silicon oxide layer using an MTO process, and etching the silicon oxide layer using an etchback process, similar to the exemplary embodiments of FIGS. 8A, 9A, and 10A. However, in the process of fabricating the memory device 700 described with reference to FIGS. 11A to 11O, the capping layer 805 and the gate spacer 806 may be selectively omitted.

Referring to FIG. 11B, a first interlayer insulating layer 751 may be formed on the horizontal transistor 800 included in the peripheral circuit region P. The first interlayer insulating layer 751 may have an enough thickness for an upper surface of the horizontal transistor 800 not to be exposed, and may only be formed in the peripheral circuit region P. The first interlayer insulating layer 751 may only be formed in the peripheral circuit region P, for example, by depositing the first interlayer insulating layer 751 on the entire upper surface of the substrate 705 and applying an etching process only to the cell region C.

In one embodiment, the first interlayer insulating layer 751 may include an HDP oxide layer having excellent gap filling properties so as to efficiently fill a curved surface formed by the horizontal transistor 800 and the substrate 705. The first interlayer insulating layer 751 may protect the horizontal transistor 800 during the process of forming the gate electrode layers 730 and the insulating layers 740.

When the first interlayer insulating layer 751 is formed, portions of sacrificial layers 721 and 722 and insulating layers 741, 742, and 743 may be formed on an upper surface of the substrate 705 and an upper surface of the first interlayer insulating layer 751, as illustrated in FIG. 11C. As illustrated in FIG. 11C, the sacrificial layers 721 and 722 and the insulating layers 741, 742, and 743 may have a step structure between the cell region C and the peripheral circuit region P, more specifically, at a boundary of the first interlayer insulating layer 751.

Next, referring to FIG. 11D, the sacrificial layers 721 and 722 and the insulating layers 741, 742, and 743 formed in the process described in FIG. 11C may be etched to form a pad area having a step structure. Referring to FIG. 11D, a sacrificial layer 721 located closer to the substrate 705 in a stacking direction (the z-axis direction) may extend relatively longer in the x-axis direction. Accordingly, the step structure between the sacrificial layers 721 and 722 and the insulating layers 741, 742, and 743 may be formed. In order to form the step structure illustrated in FIG. 11D, the sacrificial layers 721 and 722 and the insulating layers 741, 742, and 743 may be sequentially etched by etching the sacrificial layers 721 and 722 and the insulating layers 741, 742, and 743 exposed by the mask layer while trimming the mask layer, several times.

when the step structure is formed, a second interlayer insulating layer 752 may be formed as illustrated in FIG. 11E. The second interlayer insulating layer 752 may fill spaces between the step structure and the first interlayer insulating layer 751, formed by the sacrificial layers 721 and 722 and the insulating layers 741, 742, and 743. Accordingly, the second interlayer insulating layer 752 may include an HDP oxide layer having excellent gap filling properties like the first interlayer insulating layer 751. After the second interlayer insulating layer 752 is formed, a CMP process may be performed so that upper surfaces of the second interlayer insulating layer 752 and the first interlayer insulating layer 751 become coplanar as illustrated in FIG. 11F.

In some embodiments, upper surfaces of the first and second interlayer insulating layers 751 and 752 and the upper surface of the uppermost insulating layer 743 described in FIG. 11F may become coplanar. As can be seen, the second interlayer insulating layer 752 extends from outside of an outermost sacrificial layer 721 into the cell region C to cover a top surface of at least one insulating layer 742.

When the second interlayer insulating layer 752 is formed, sacrificial layers 723 to 726 and insulating layers 744 to 747 may be further formed as illustrated in FIG. 11G. When the sacrificial layers 723 to 726 and the insulating layers 744 to 747 are formed, a pad area having a step structure may be formed by etching the sacrificial layers 723 to 726 and the insulating layers 744 to 747, as illustrated in FIG. 11H. Accordingly, as illustrated in FIG. 11H, a plurality of pad areas in which the plurality of sacrificial layers 721-726: 720 and insulating layers 741 to 747: 740 extend by different lengths in the x-axis direction may be formed.

Referring to FIG. 11I, a third interlayer insulating layer 753 may be formed on the first and second interlayer insulating layers 751 and 752. The third interlayer insulating layer 753 may have a relatively greater volume than the first and second interlayer insulating layers 751 and 752. Accordingly, The third interlayer insulating layer 753 may include a TEOS oxide layer having a high deposition rate. The third interlayer insulating layer 753 may cover the pad area formed by etching the sacrificial layers 723 to 726 and the insulating layers 744 to 747 disposed to be higher than the first and second interlayer insulating layers 751 and 752, and an upper surface of the uppermost sacrificial layer 749.

When the third interlayer insulating layer 753 is formed, the channel 710 may be formed as illustrated in FIG. 11J. In order to form the channel 710, the third interlayer insulating layer 753, the plurality of insulating layers 740, and sacrificial layers 720 may be etched to form an opening. The opening may be formed to recess the upper surface of the substrate 705, and a charge storage layer 764 and a tunneling layer 766 may be formed sequentially from a sidewall of the opening. The charge storage layer 764 and the tunneling layer 766 may be formed using an ALD or CVD method, as described above.

The channel 710 may be formed on an inner surface of the tunneling layer 766, and the inside of the channel area 710 may be filled with an embedded insulating layer 713. Selectively, before the embedded insulating layer 713 is formed, a hydrogen annealing process in which the structure including the channel 710 formed thereon is heat-treated in a hydrogen- or deuterium-containing gas atmosphere, may be additionally performed. Through the hydrogen annealing process, many of crystal defects existing in the channel 710 may be cured.

Next, a planarization process may be performed to remove unnecessary semiconductor materials and insulating materials covering the third interlayer insulating layer 753. Next, an upper portion of the embedded insulating layer 713 may be partially removed using an etching process, and then a material for forming a conductive layer 715 may be deposited on the removed portion. Next, a planarization process may be further performed to form the conductive layer 715.

After the channel 710 is formed, the plurality of sacrificial layers 720 may be removed to form horizontal openings Th. Referring to FIG. 11K, the plurality of sacrificial layers 720 may be removed to form horizontal openings Th between the plurality of insulating layers 740. A blocking layer 762 and gate electrode layers 731 to 738: 730 may be formed in the horizontal openings Th, as illustrated in FIG. 11L. The blocking layer 762 may be formed using an ALD or CVD process like the charge storage layer 764 and the tunneling layer 766 and have a shape surrounding the gate electrode layers 730. The gate electrode layers 730 may include a material having excellent electric conductivity such as tungsten (W).

Next, Referring to FIG. 11M, a plurality of vertical openings Tv and Tv' for forming contact plugs 770 and 830 may be formed by performing an etching process in the z-axis direction parallel to the channel 710. The etching process of forming the plurality of vertical openings Tv and Tv' may include forming a mask layer in which areas corresponding to the vertical openings Tv and Tv' are open, and selectively etching the interlayer insulating layers 750 and the plurality of insulating layers 740 with respect to the plurality of gate electrode layers 730. By selectively etching a material included in the interlayer insulating layers 750 and the plurality of insulating layers 740 with respect to a material included in the plurality of gate electrode layers 730, the vertical openings Tv and Tv' extending to each of the gate electrode layers 730. In some exemplary embodiments, due to a high aspect ratio, the vertical openings Tv and Tv' may have a tapered structure (an inclined side) such that widths thereof decrease toward the substrate 705.

A first vertical opening Tv formed in the cell region C may have a depth of exposing each of the gate electrode layers 730 formed in the cell region C. In addition, a second vertical opening Tv' formed in the peripheral circuit region P may be provided to form a peripheral contact plug 830 electrically connected to the gate electrode 802 of the horizontal transistor 800 formed in the peripheral circuit region P.

Referring to FIGS. 11N and 11O, a plurality of contact plugs 770 and 830 may be formed by filling each of the first vertical opening Tv and the second vertical opening Tv' with a conductive material. A plurality of interconnection lines 781 to 786: 780 may be formed on the plurality of contact plugs 770 in the cell region C to electrically connect the plurality of gate electrode layers 730 disposed at the same height in the z-axis direction. Meanwhile, the channel 710 may be electrically connected to a bit line 790 through the conductive layer 715, and a conductive pad 840 may be formed on the peripheral contact plug 830.

Figure 12:
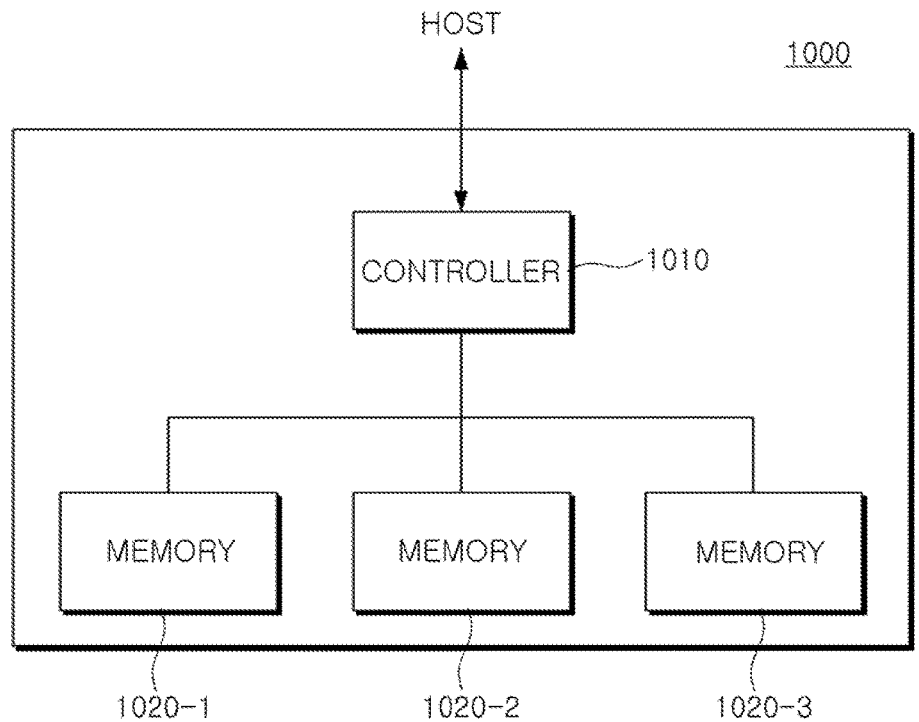
FIGS. 12 and 13 are block diagrams illustrating electronic devices including a memory device according to an exemplary embodiment of the present disclosure.
Figure 13:
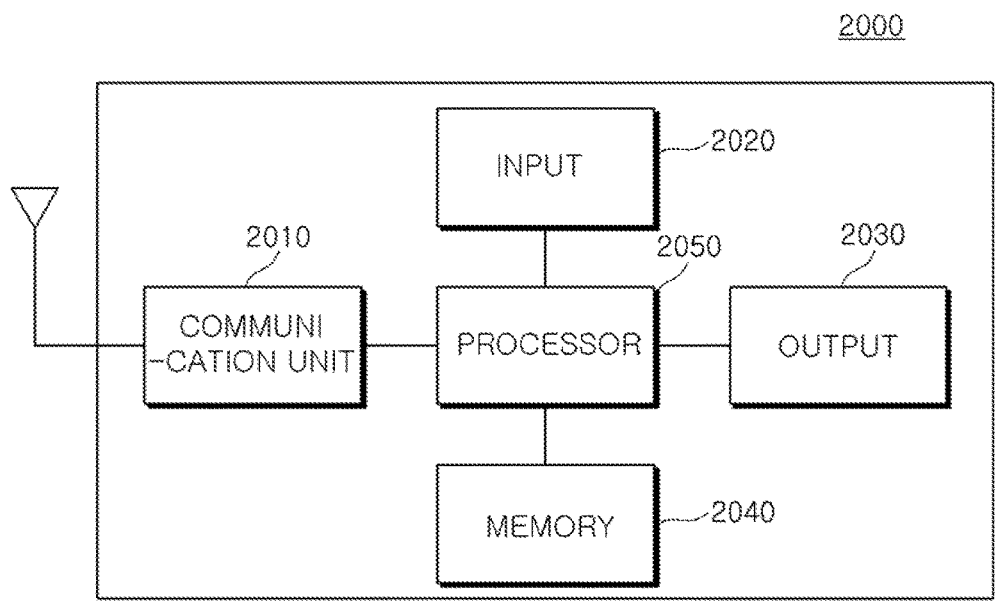

FIGS. 12 and 13 are block diagrams illustrating electronic devices including a memory device according to an exemplary embodiment of the present disclosure.

FIG. 12 is block diagram illustrating a storage apparatus including a memory device according to an exemplary embodiment of the present disclosure.

Referring to FIG. 12, the storage apparatus 1000 according to an exemplary embodiment of the present disclosure may be formed to include a controller 1010 communicating with a host HOST, and memories 1020-1, 1020-2, and 1020-3 storing data. Each of the memories 1020-1, 1020-2, and 1020-3 may include a memory device according to the various exemplary embodiments in the present disclosure.

The host HOST communicating with the controller 1010 may be a variety of electronic apparatuses in which the storage apparatus 1000 is installed. For example, the host HOST may be a smart phone, a digital camera, a desktop computer, a laptop computer, a media player or the like. The controller 1010 may receive a request for data read or data write transmitted from the host HOST to generate a command CMD for storing data in the memories 1020-1, 1020-2, and 1020-3 or withdrawing data from the memories 1020-1, 1020-2, and 1020-3.

As illustrated in FIG. 12, one or more memories 1020-1, 1020-2, and 1020-3 may be connected to the controller 1010 in parallel in the storage apparatus 1000. By connecting the plurality of memories 1020-1, 1020-2, and 1020-3 to the controller 1010 in parallel, a storage apparatus 1000 having a high capacity, such as a solid state drive (SSD), may be formed.

FIG. 13 is a block diagram showing an electronic device including a memory device according to an exemplary embodiment of the present disclosure.

Referring to FIG. 13, the electronic device 2000 according to one exemplary embodiment of the present disclosure may be formed to include a communication part 2010, an input 2020, an output 2030, a memory 2040, and a processor 2050.

The communication part 2010 may include a wire/wireless communication module, such as a wireless internet module, a short-range internet module, a GPS module, a mobile communication module, or the like. The wire/wireless communication module included in the communication part 2010 may be connected to an external communication network using a variety of communication standards to transmit and receive data.

The input 2020 may be a module provided for a user to control an operation of the electronic apparatus 2000, and may include a mechanical switch, a touch screen, and a voice recognition module. In addition, the input 2020 may include a mouse operated by a track ball or a laser pointer, a finger mouse device, and further include various sensor modules to which the user can input data.

The output 2030 may output information processed in the electronic apparatus 2000 in an audio or video format, and the memory 2040 may store programs for processing or controlling in the processor 2050, or data. The memory 2040 may include one or more memory devices according to various exemplary embodiments in the present disclosure, described with reference to FIGS. 1 to 7, and the processor 2050 may transfer a command according to a required operation to the memory 2040 and may store or withdraw data.

The memory 2040 may be embedded in the electronic device 2000, or communicate with the processor 2050 using a separate interface. When the memory 2040 communicates with the processor 2050 using a separate interface, processor 2050 may store/withdraw data in/from the memory 2040 using various interface standard, such as SD, SDHC, SDXC, MICRO SD, and USB.

The processor 2050 may control an operation of each part included in the electronic device 2000. The processor 2050 may perform controlling or processing related to voice calls, video calls, data communication, and the like, or controlling or processing related to playing or managing multimedia. In addition, the processor 2050 may process an input transmitted from a user through the input 2020, and output a result thereof through the output 2030. Further, the processor 2050 may store data required for controlling operations of the electronic device 2000 in the memory 2040, or withdraw the data from the memory 2040.

In the memory device according to the exemplary embodiments in the present disclosure, a process of forming an interlayer insulating layer in a cell region and a peripheral region can be simplified. Thus, overall the degree of difficulty and cost in the process of fabricating a memory device may be reduced. In particular, even in a highly integrated memory device having a greater number of stacks of gate electrode layers, the process of forming an interlayer insulating layer can be simplified.

While exemplary embodiments have been shown and described above, it will be apparent to those skilled in the art that modifications and variations could be made without departing from the spirit and scope of the present disclosure as defined by the appended claims.

What is claimed is:

1. A memory device comprising:
a plurality of gate electrode layers stacked on an upper surface of a substrate;
a plurality of channels extending through the plurality of gate electrode layers, in a direction perpendicular to the upper surface of the substrate;
a plurality of circuit elements disposed in a peripheral area of the plurality of gate electrode layers and covered by an etch stop layer; and
an interlayer insulating layer including a first interlayer insulating layer on the etch stop layer and first gate electrode layers of the plurality of gate electrode layers and directly contacting with the etch stop layer, and a second interlayer insulating layer on the first interlayer insulating layer and second gate electrode layers of the plurality of gate electrode layers,
wherein the first interlayer insulating layer is provided as a single layer.

2. The memory device of claim 1, wherein a thickness of the first interlayer insulating layer is less than a thickness of the second interlayer insulating layer, in the peripheral area.

3. The memory device of claim 1, wherein at least a portion of a lower surface of the first interlayer insulating layer contacts at least a portion of the upper surface of the substrate.

4. The memory device of claim 1, further comprising:
a plurality of contacts including first contacts passing through the first interlayer insulating layer and the second interlayer insulating layer, and second contacts passing through only the second interlayer insulating layer,
wherein the number of the first contacts is less than the number of the second contacts.

5. The memory device of claim 1,
wherein the plurality of gate electrode layers provide word lines, at least one ground select line, and at least one string select line, and
wherein the second gate electrode layers provide a portion of the word lines and the at least one string select line.

6. The memory device of claim 1, wherein the plurality of gate electrode layers provide word lines, at least one ground select line, and at least one string select line, and
wherein the word lines are provided by a portion of the first gate electrode layers and a portion of the second gate electrode layers.

7. The memory device of claim 1,
wherein the plurality of gate electrode layers provide word lines, at least one ground select line, and at least one string select line, and
wherein an upper surface of the first interlayer insulating layer is disposed between a plurality of gate electrode layers providing the word lines.

8. The memory device of claim 1, further comprising:
a plurality of insulating layers stacked alternately with the plurality of gate electrode layers,
wherein a surface of at least one of the plurality of insulating layers contacts the first interlayer insulating layer, directly.

9. The memory device of claim 1, further comprising:
a plurality of insulating layers stacked alternately with the plurality of gate electrode layers, wherein the plurality of gate electrode layers provide word lines, at least one ground select line, and at least one string select line, and wherein an upper surface of the first interlayer insulating layer is co-planar with an upper surface of one of the plurality of insulating layers, between a plurality of gate electrode layers providing the word lines.

10. A memory device comprising:

a plurality of gate electrode layers stacked on an upper surface of a substrate and providing word lines, at least one ground select line, and at least one string select line;

a plurality of channels extending through the plurality of gate electrode layers, in a direction perpendicular to the upper surface of the substrate;

a plurality of circuit elements disposed in a peripheral area of the plurality of gate electrode layers; and an interlayer insulating layer including a first interlayer insulating layer on the plurality of circuit elements and first gate electrode layers of the plurality of gate electrode layers, and a second interlayer insulating layer on the first interlayer insulating layer and second gate electrode layers of the plurality of gate electrode layers disposed above the first gate electrode layers, wherein an upper surface of the first interlayer insulating layer is disposed between a plurality of gate electrode layers providing the word lines.

11. The memory device of claim 10, further comprising:

a plurality of contacts including first contacts passing through the first interlayer insulating layer and the second interlayer insulating layer, and second contacts passing through the second interlayer insulating layer without passing through the first interlayer insulating layer, wherein the number of the first contacts is less than the number of the second contacts.

12. The memory device of claim 10, further comprising:

a plurality of contacts connected with the plurality of gate electrode layers in a connecting region; and a plurality of insulating layers stacked alternately with the plurality of gate electrode layers, wherein a surface of at least one of the plurality of insulating layers contacts the first interlayer insulating layer in the connecting region, directly.

13. The memory device of claim 10, further comprising:

a plurality of insulating layers stacked alternately with the plurality of gate electrode layers, wherein one of the plurality of insulating layers has an upper surface being co-planar with the upper surface of the first interlayer insulating layer, between the plurality of gate electrode layers providing the word lines.

14. The memory device of claim 10, further comprising:

an etch stop layer disposed between the plurality of circuit elements and the first interlayer insulating layer, wherein an upper surface of the etch stop layer contacts at least a portion of a lower surface of the first interlayer insulating layer directly.

15. A memory device comprising:

a plurality of gate electrode layers stacked on an upper surface of a substrate;

a plurality of channels extending through the plurality of gate electrode layers, in a direction perpendicular to the upper surface of the substrate;

a plurality of circuit elements disposed in a peripheral area of the plurality of gate electrode layers;

an interlayer insulating layer including a first interlayer insulating layer on the plurality of circuit elements and first gate electrode layers of the plurality of gate electrode layers, and a second interlayer insulating layer on the first interlayer insulating layer and second gate electrode layers of the plurality of gate electrode layers; and a plurality of contacts including first contacts passing through the first interlayer insulating layer and the second interlayer insulating layer, and second contacts passing through the second interlayer insulating layer without passing through the first interlayer insulating layer, wherein the number of the second contacts is larger than the number of the first contacts.

16. The memory device of claim 15, wherein a thickness of the first interlayer insulating layer is less than a thickness of the second interlayer insulating layer, in the peripheral area.

17. The memory device of claim 15, further comprising:

a plurality of insulating layers stacked alternately with the plurality of gate electrode layers, wherein an upper surface of the first interlayer insulating layer is co-planar with an upper surface of at least one of the plurality of insulating layers.

18. The memory device of claim 15, further comprising:

a plurality of insulating layers stacked alternately with the plurality of gate electrode layers, wherein the first interlayer insulating layer is provided as a single layer, and a surface of at least one of the plurality of insulating layers contacts the first interlayer insulating layer, directly.

19. The memory device of claim 15, further comprising:

a plurality of insulating layers stacked alternately with the plurality of gate electrode layers, wherein the plurality of contacts are connected with the plurality of gate electrode layers in a connecting region, and an upper surface of each of the plurality of insulating layers contacts one of the first interlayer insulating layer and the second interlayer insulating layer in the connecting region.

20. The memory device of claim 15, wherein a length of the shortest one of the first contacts is greater than a length of the longest one of the second contacts.

* * * * *